United States Patent
Wood et al.

(10) Patent No.: US 10,770,665 B2
(45) Date of Patent: Sep. 8, 2020

(54) FLUORINATED DYE COMPOUNDS FOR ORGANIC SOLAR CELLS

(71) Applicant: Next Energy Technologies, Inc., Santa Barbara, CA (US)

(72) Inventors: Thomas Kuchurean Wood, Santa Barbara, CA (US); Braden Gmelin Smith, Santa Barbara, CA (US); Bruno John Anthony Caputo, Santa Barbara, CA (US); Andres Garcia, Los Angeles, CA (US); Rachel A. Harris, Carpinteria, CA (US); Priyam Patel, Irvine, CA (US); Matthew Thomas Lloyd, Santa Barbara, CA (US); Corey Vernon Hoven, Santa Barbara, CA (US); Arnold Bernarte Tamayo, Santa Barbara, CA (US); Max Josef Braun, Wedemark (DE); Stefanie Nauert, Hannover (DE); Sebastian Gutmann, Hannover (DE)

(73) Assignee: NEXT ENERGY TECHNOLOGY, INC., Santa Barbara, CA (US)

( * ) Notice: Subject to any disclaimer, the term of this patent is extended or adjusted under 35 U.S.C. 154(b) by 0 days.

(21) Appl. No.: 15/561,895

(22) PCT Filed: Mar. 28, 2016

(86) PCT No.: PCT/US2016/024535
§ 371 (c)(1),
(2) Date: Sep. 26, 2017

(87) PCT Pub. No.: WO2016/154624
PCT Pub. Date: Sep. 29, 2016

(65) Prior Publication Data
US 2018/0114930 A1    Apr. 26, 2018

Related U.S. Application Data

(60) Provisional application No. 62/138,560, filed on Mar. 26, 2015.

(51) Int. Cl.
*H01L 51/00* (2006.01)
*C09B 57/00* (2006.01)
(Continued)

(52) U.S. Cl.
CPC ........ *H01L 51/0094* (2013.01); *C07F 7/0816* (2013.01); *C09B 57/00* (2013.01);
(Continued)

(58) Field of Classification Search
CPC ............. H01L 51/0094; H01L 51/0068; H01L 51/0071; H01L 51/008; H01L 51/424; C07F 7/0816; C09B 57/00; C09K 11/06
See application file for complete search history.

(56) References Cited

U.S. PATENT DOCUMENTS

| | | | |
|---|---|---|---|
| 6,096,901 | A | 8/2000 | Marfat et al. |
| 8,227,691 | B2 | 7/2012 | Bazan et al. |

(Continued)

FOREIGN PATENT DOCUMENTS

| | | |
|---|---|---|
| CN | 101504971 A | 8/2009 |
| EP | 2407464 | 1/2012 |

(Continued)

OTHER PUBLICATIONS

PubChem CID: 16739187, National Center for Biotechnology Information, https://pubchem.ncbi.nlm.nih.gov/compound/16739187, p. 3, compound (date created: Oct. 1, 2007, accessed May 20, 2016).

(Continued)

*Primary Examiner* — Jayne L Mershon
(74) *Attorney, Agent, or Firm* — Venable LLP; Keith G. Haddaway

(57) ABSTRACT

Electronic or optoelectronic device comprising a first electrode, a second electro, and an active layer arranged between and in electrical connection with the first and the second electrode. The active layer comprises at least one dye (Continued)

compound, which comprises small-molecule organic solar cells.

20 Claims, 9 Drawing Sheets

(51) Int. Cl.
  *H01L 51/42*  (2006.01)
  *C07F 7/08*  (2006.01)
  *C09K 11/06*  (2006.01)

(52) U.S. Cl.
  CPC ............ *C09K 11/06* (2013.01); *H01L 51/008* (2013.01); *H01L 51/0068* (2013.01); *H01L 51/0071* (2013.01); *H01L 51/424* (2013.01); *C09K 2211/1055* (2013.01); *C09K 2211/1066* (2013.01); *C09K 2211/1092* (2013.01); *H01L 51/0047* (2013.01); *H01L 51/4253* (2013.01); *Y02E 10/549* (2013.01)

(56) References Cited

U.S. PATENT DOCUMENTS

| | | |
|---|---|---|
| 8,273,599 B2 | 9/2012 | Bazan et al. |
| 8,318,532 B2 | 11/2012 | Bazan et al. |
| 8,723,169 B2 | 5/2014 | Bazan et al. |
| 9,865,821 B2 | 1/2018 | Tamayo et al. |
| 9,893,294 B2 | 2/2018 | Welch et al. |
| 2003/0047720 A1 | 3/2003 | Heeney et al. |
| 2005/0002627 A1 | 2/2005 | Boettcher et al. |
| 2006/0052612 A1 | 3/2006 | Stossel et al. |
| 2006/0134425 A1 | 6/2006 | Suzuki et al. |
| 2006/0292736 A1 | 12/2006 | Lee et al. |
| 2007/0169816 A1 | 7/2007 | Lee et al. |
| 2007/0221926 A1 | 9/2007 | Lee et al. |
| 2008/0053520 A1 | 3/2008 | Towns et al. |
| 2008/0315187 A1 | 12/2008 | Bazan et al. |
| 2009/0032808 A1 | 2/2009 | Bazan et al. |
| 2009/0108255 A1 | 4/2009 | Bazan et al. |
| 2009/0126779 A1 | 5/2009 | Heeger et al. |
| 2009/0188558 A1 | 7/2009 | Jen et al. |
| 2010/0252112 A1 | 10/2010 | Watson |
| 2010/0326525 A1 | 12/2010 | Nguyen et al. |
| 2011/0001131 A1 | 1/2011 | Lee et al. |
| 2011/0023964 A1 | 2/2011 | Kitazawa et al. |
| 2011/0028656 A1 | 2/2011 | Bazan et al. |
| 2013/0032791 A1 | 2/2013 | Bazan et al. |
| 2013/0240845 A1 | 9/2013 | Bazan et al. |
| 2013/0247990 A1 | 9/2013 | Facchetti et al. |
| 2014/0167002 A1 | 6/2014 | Welch et al. |
| 2015/0034161 A1* | 2/2015 | Tamayo ............... C07F 7/0807 136/263 |

FOREIGN PATENT DOCUMENTS

| | | |
|---|---|---|
| EP | 2407464 A1 | 1/2012 |
| EP | 2597127 A1 | 5/2013 |
| FR | 2910277 A1 | 6/2008 |
| JP | H06-017307 A | 1/1994 |
| JP | 2011-99028 A | 5/2011 |
| WO | 2010/052448 A2 | 5/2010 |
| WO | 2011/049531 A1 | 4/2011 |
| WO | 2011/052709 A1 | 5/2011 |
| WO | 2011/060526 A1 | 5/2011 |
| WO | 2012/008556 A1 | 1/2012 |
| WO | WO 2012/074853 * | 6/2012 |
| WO | 2012/178116 A1 | 12/2012 |
| WO | WO 2013/123047 * | 8/2013 |
| WO | WO-2013/123047 A1 | 8/2013 |
| WO | WO 2013/123508 * | 8/2013 |
| WO | 2013/142850 A1 | 9/2013 |
| WO | WO-2014/013205 A1 | 1/2014 |

OTHER PUBLICATIONS

International Search Report and Written Opinion in International Application No. PCT/US2016/024535, dated Jun. 30, 2016.
"Electronic." Merriam-Webster.com. Merriam-Webster, m.d. Web. Dec. 5, 2016.
Blouin, N. et al. (Sep. 19, 2007, e-pub. Dec. 21, 2007). "Toward a Rational Design of Poly (2,7-Carbazole) Derivatives for Solar Cells," Journal of the American Chemical Society, 130:732-742.
Chen, J.J.A. et al. (2010, e-pub. Aug. 30, 2010). "Auinacridone-Based Molecular Donors for Solution Processed Bulk-Heterojunction Organic Solar Cells," ACS Applied Materials & Interfaces, 2(9)2679-2686.
Coffin, R.C., et al. (Nov. 2009, e-pub. Oct. 18, 2009). "Streamlined Microwave-Assisted Preparation of Narrow-Bandgap Conjugated Polymers for High-Performance Bulk Heterojunction Solar Cells," Nat. Chem. 1:657-661.
Greiner et al., "Universal energy-level alignment of molecules on metal oxides," Nature Materials, DOT: 10.1038/NMAT3159 (Nov. 6, 2011), pp. 76-81.
Guenes et al., "Photovoltaic characterization of hybrid solar cells using surface modified TiO2 nanoparticles and poly (3-hexyl)thiophene," 2008 Nanotechnology 19 424009.
Gupta et al., "Barium: An Efficient Cathode Layer for Bulk-heterojunction Solar Cells," Scientific Reports, 3: 1965, pp. 1-6 (2013).
Hau, S.K. et al. (Nov. 6, 2010). "A Review on the Development of the Inverted Polymer Solar Cell Architecture," Polymer Reviews, 50(4):474-510.
Henson, Z. B. et al., (Oct. 4, 2011, e-pub. Jan. 27, 2012). "Pyridalthiadiazole-Based Narrow Band Gap Chromophores," J. Am. Chem. Soc. 134(8):3766-3779.
International Preliminary Report on Patentability in International Application No. PCT/US2013/033618, dated Mar. 5, 2014.
International Search Report in International Application No. PCT/US2013/025936, dated Feb. 14, 2012.
Kyaw, A.K.K. et al. (Jun. 27, 2013). "Improved Light Harvesting and Improved Efficiency by Insertion of an Optical Spacer (ZnO) in Solution-Processed Small-Molecule Solar Cells," Nano Lett., 13:3796-3801.
Leroy, J. et al. (Sep. 28, 2006, e-pub. Jan. 17, 2007). "Symmetrical and Nonsymmetrical Liquid Crystalline Oligothiophenes: Convenient Synthesis and Transition-Temperature Engineering," Eur. J. Org <http://Eur.J.Org>. Chem., 1256-1261.
Lin et al: "Small molecule semiconductors for high-efficiency organic photovoltaics," Chem. Soc. Rev., vol. 41, No. 11, p. 4245-4272 (Jan. 1, 2012).
Love, J.A. et al. (2013). "Film Morphology of High Efficiency Solution-Processed Small-Molecule Solar Cells," Adv. Funct. Matter, 23:5019-5026.
Mishra et al: "Small Molecule Organic Semiconductors on the Move: Promises for Future Solar Energy Technology," Angewandte Chemie International Edition, vol. 51, No. 9, Feb. 27, 2012 (Feb. 27, 2012), pp. 2020-2067, XP055131346.
O'Regan et al., "A low-cost, high-efficiency solar cell based on dye-sensitized colloidal TiO2 films," 1991 Nature 353:737.
Office Action in European Patent Application No. EP 13748582.7, dated Sep. 29, 2016.
Office Action: Extended European Search Report in European Patent Application No. 13748582.7, dated Aug. 11, 2015.
Office Action: Extended European Search Report in European Patent Application No. 11841211.3, dated Oct. 11, 2013.
Office Action: Notification of the First Office Action in Chinese Patent Application No. 201380019851.4, dated Nov. 3, 2015.
Office Action: Notification of the Second Office Action in Chinese Patent Application No. 201380019851.4, dated Aug. 4, 2016.
Paek et al: "Efficient Organic Semiconductors Containing Fluorine-Substituted Benzothiadiazole for Solution-Processed Small Molecule Organic Solar Cells", Journal of Physical Chemistry C, vol. 116, No. 44, Oct. 22, 2012 (Oct. 22, 2012), pp. 23205-23213, XP055207197.

(56) References Cited

OTHER PUBLICATIONS

Peng, Q. et al., (2011). "Novel Benzo [1,2-b:4,5-5] dithiophene-Benzothiadiazole Derivatives with Variable Side Chains for High-Performance Solar Cells," Adv. Mater. 23:4554-4558.

Perez, L.A. et al. (May 25, 2013, e-pub. Sep. 4, 2013). "Solvent Additive Effects on Small Molecule Crystallization in Bulk Heterojunction Solar Cells Probed During Spin Casting," Adv. Mater., 25:6380-6384.

Price et al., "Fluorine Substituted Conjugated Polymer of Medium Band Gap Yields 7% Efficiency in Polymer—Fullerene Solar Cells", Journal of the American Chemical Society, American Chemical Society, US, vol. 133, No. 12, Mar. 30, 2011 (Mar. 30, 2011), pp. 4625-4631.

Sharif, M. et al., (Feb. 2, 2010, e-pub. Mar. 20, 2010). "One-Pot Synthesis of Fluorinated Terphenyls by Site-Selective Suzuki-Miyaura Reactions of 1,4-Dibromo-2-Fluorobenzene," Teterahedron Letters, 51:2810-2812.

Sun, Y. et al., (Jan. 2012, e-pub. Nov. 6, 2011). "Solution-Processed Small-Molecule Solar Cells with 6.7% Efficiency," Nat. Mater. 11:44-48.

Takacs et al., "Solar Cell Efficiency, Self-Assembly,, and Dipole-Dipole INteractions of Isomorphic Narro-Band-Gap Molecules," J. Am. Chem. Soc., 134, pp. 16597-16606 (2012).

Thomas et al., Heterocycles, 20(6):1043-1048 (1983).

Van Der Poll, T.S. et al. (Mar. 19, 2012, e-pub. Jun. 6, 2012). "Non-Basic High-Performance Molecules for Solution-Processed Organic Solar Cells," Adv. Mater., 24:3646-3649.

Wang et al., "Naphthodithiophene-2,1,3-benzothiadiazole copolymers for bulk heterojunction solar cells," Chem. Commun., 2011, vol. 47, pp. 9471-9473.

Welch et al., "Organic small molecule semiconducting chromophores for use in organic electronic devices," (4 pages).

Welch, G. C. et al., (Mar. 4, 2011). "Lewis Acid Adducts of Narrow Band Gap Conjugated Polymers," J. Am. Chem. Soc., 133:4632-4644.

Welch, G.C. et al., (2011). "A Modular Molecular Framework for Utility in Small-Molecule Solution-Processed Organic Photovoltaic Devices," J. of Matter. Chem., 21:12700-12709.

Written Opinion dated Jul. 16, 2013, for PCT Application No. PCT/US2013/033615, Internationally filed on Mar. 22, 2013, 6 pages.

Zhang et al., "Increased Open Circuit Voltage in Fluorinated Benzothiadiazole-Based Alternating Conuugated Polymers," ESI for Chemical Communications, The Roly Society of Chemistry (2011).

Zhang et al., "Solution-processable star-shaped photovoltaic organic molecule with triphenylamine core and benzothiadiazole-thiophene arms," Macromolecules, 24, No. 20 (2009), 7619-7622 (Abstract).

Zhou et al. "Development of Fluorinated Benzothiadiazole as a Structural Unit for a Polymer Solar Cell of 7% Efficiency," Angewandte Chemie International Edition, vol. 50, No. 13, pp. 2995-2998 (Mar. 2, 2011).

Zhou et al., "Enhanced Photovoltaic Performance of Low-Bandgap Polymers with Deep LUMO Levels," Angewandte Chemie, International Edition, vol. 49, No. 43, pp. 7992-7995 (2010).

Cho et al., "Facile Synthesis of Fluorine-Substituted Benzothiadiazole-Based Organic Semiconductors and Their Use in Solution-Porcessed Small-Molecule Organic Solar Cells", Chem. Eur. J. 2012, 18, pp. 11433-11439 (Year: 2012).

Driscoll et al., "Enhanced Photoresponse in Solid-State Excitonic Solar Cells via Resonant Energy Transfer and Cascaded Charge Transfer from a Secondary Absorber," Nano Letters, Nov. 9, 2011, vol. 10, pp. 4981-4988.

Miller et al., "Excited-State Photophysics in a Low Band Gap Polymer with High Photovoltaic Efficiency," J. Phys. Chem. C. Dec. 27, 2010, vol. 115, pp. 2371-2380.

Saragi et al., "Photovoltaic and photoconductivity effect in thin-film phototransistors based on a heterocyclic spiro-type molecule," J. Appl. Phys. Aug. 24, 2007, vol. 102, pp. 046104-1-046104-3.

Steinberger et al., "Vacuum-processed small molecule solar cells based on terminal acceptor-substituted low-band gap oligothiophenes," Chem. Commun. Jan. 10, 2011, vol. 47, pp. 1982-1984.

Ying et al., "Regioregular Pyridal[2, 1, 3]thiadiazole p-Conjugated Copolymers," J. Am. Chem. Soc., 133, pp. 18538-18541 (2011).

International Search Report and the Written Opinion of the International Searching Authority, or the Declaration of International Application No. PCT/US2013/025936.

Price et al. "Low Band Gap Polymers Based on Benzo[1,2-b:4,5-b']dithiophene: Rational Design of Polymers Leads to High Photovoltaic Performance", Macromolecules, vol. 43, No. 10, 2010, 4609-4612.

Steinberger et al. "A-D-A-D-A-Type Oligothiophenes for Vacuum-Deposited Organic Solar Cells" Organic Letters, 2011, vol. 13, No. 1, 90-93.

Yang et al. "Quantitatively Analyzing the Influence of Side Chains on Photovoltaic Properties of Polymer-Fullerene Solar Cells", J. Phys. Chem. C 2010, 114, 16793-16800.

\* cited by examiner

FLUORINATED DYE COMPOUNDS FOR ORGANIC SOLAR CELLS

RELATED APPLICATIONS

This application is a national stage application under 35 U.S.C. § 371 of International Application No. PCT/US2016/024535, filed Mar. 28, 2016, which claims the benefit of U.S. Provisional Application No. 62/138,560 filed Mar. 26, 2015, the entire contents of which are hereby incorporated by reference in their entirety.

BACKGROUND

Photovoltaic cells convert radiation, for example visible light, into direct current (DC) electricity. Organic solar cells (OSC) are organic photoelectric conversion devices which comprise conductive organic polymers or organic small molecules, for light absorption, charge generation and charge transport. Organic dye compounds find use in many applications, including solar panels and photodetectors. They may also be part of larger systems comprising other organic electronic devices, such as organic light emitting diodes (OLEDs) and organic thin film transistors (OTFTs).

A common small-molecule OSC structure is formed by a transparent conducting oxide (TCO) electrode, typically Indium Tin Oxide (ITO), an organic hole collecting layer (for example the doped polymer PEDOT:PSS), a photoactive layer, and the metallic contact, in some cases a thin interlayer of calcium or lithium fluoride. The photoactive layer is formed from a blend of donor and acceptor organic semiconductors. Typically, the acceptor semiconductor is a soluble fullerene derivative and the donor semiconductor is a small-molecule organic dye compound.

Suitable dye compounds for small-molecule OSCs have been reported in the literature, e.g. in Fitzner, R et al., Journal of the American Chemical Society, 2012, 134, 11064-11067, which is incorporated herein fully by reference. However, there is still a need for dye compounds for OSCs with improved properties.

SUMMARY

In one aspect, a small molecule compound of Formula (I):

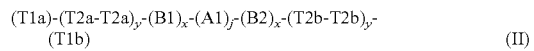

where P can be an optionally substituted aryl group or an optionally substituted heteroaryl group; or P can be a group having the formula: -A1-P'-A2-, where P' can be an optionally substituted aryl group or an optionally substituted heteroaryl group. Each B1 and each B2, independently, can be an optionally substituted thiophene. Each A1 and each A2, independently, can be an optionally substituted aryl group or an optionally substituted heteroaryl group.

T2a and T2b, independently, can have the formula:

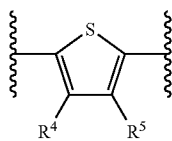

T1a and T1b, independently, can have the formula:

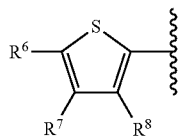

where each $R^4$, $R^5$, $R^6$, $R^7$, and $R^8$, independently, can be H, halo, alkyl, haloalkyl, alkoxy, alkenyl, alkynyl, thioalkyl, —$NHR^9$, —$N(R^9)_2$, aryl, heteroaryl, or acyl; each $R^9$, independently, can be H, alkyl, or haloalkyl.

Each n, independently, can be 0, 1, 2 or 3; each m, independently, can be 1, 2, or 3.

In Formula (I), at least one of $R^4$ to $R^8$ is halo or haloalkyl; and when $R^4$ or $R^5$ is fluoro, the other is not alkyl or haloalkyl, and when $R^7$ or $R^8$ is fluoro, the other is not alkyl or haloalkyl.

In another aspect, a small molecule compound of Formula (II):

(T1a)-(T2a-T2a)$_y$-(B1)$_x$-(A1)$_j$-(B2)$_x$-(T2b-T2b)$_y$-(T1b)     (II)

where each A1, independently, can be selected from the group consisting of

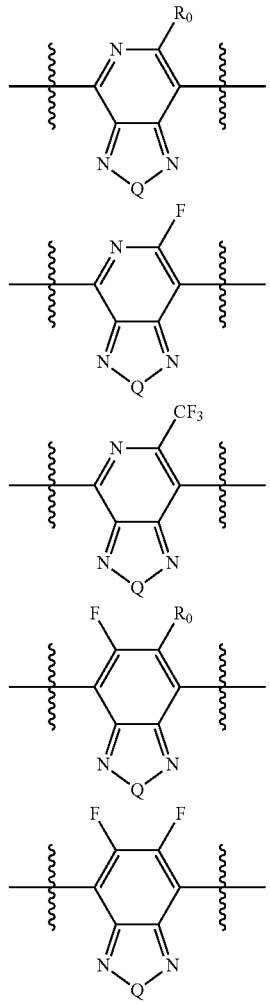

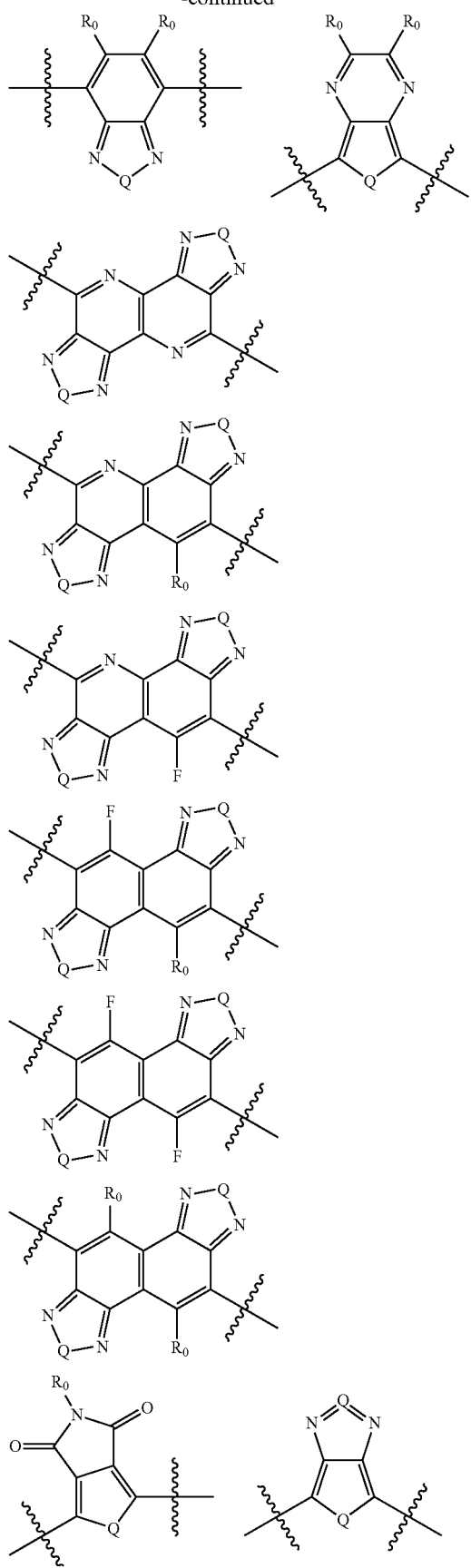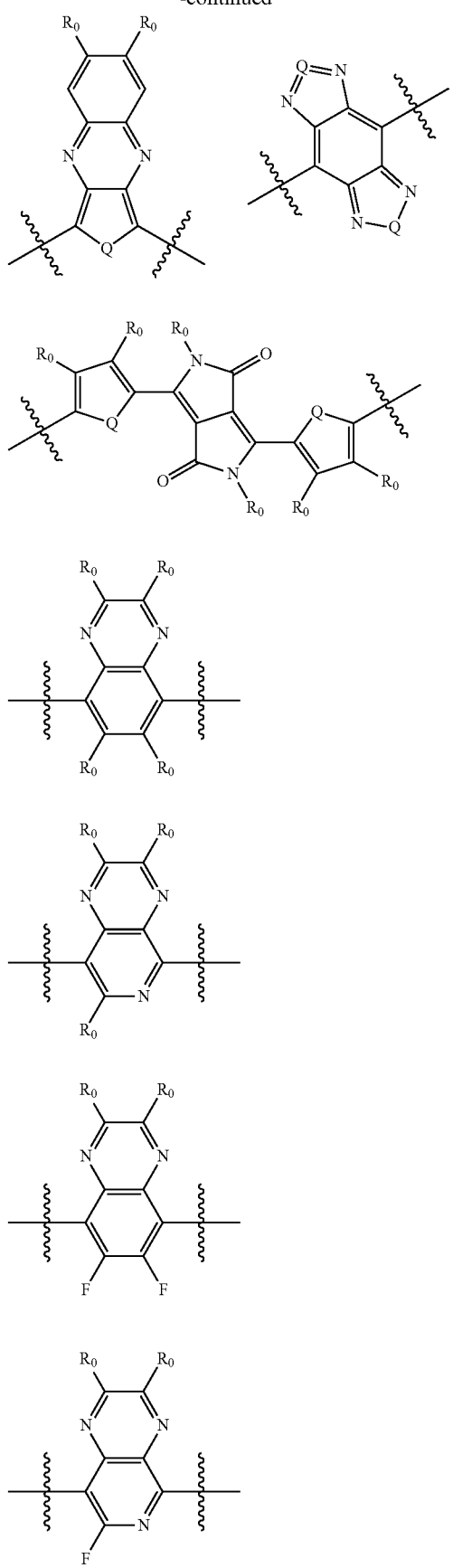

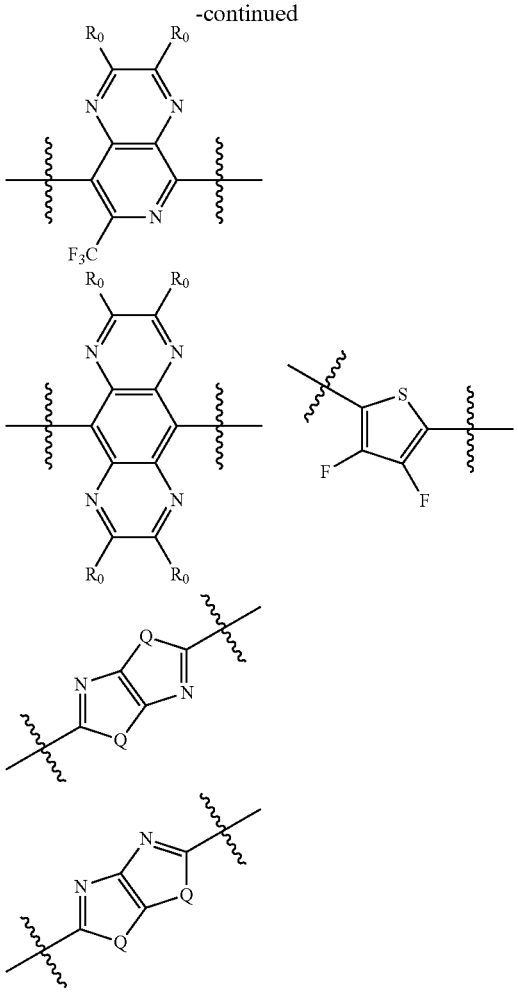

where each Q, independently, can be O or S; each $R_0$, independently, can be H or alkyl.

Each B1 and each B2, independently, can be an optionally substituted thiophene. Each T2a and each T2b, independently, can have the formula:

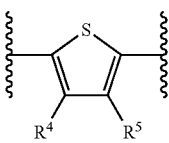

Each T1a and each T1b, independently, can have the formula:

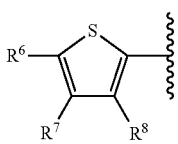

where each $R^4$, $R^5$, $R^6$, $R^7$ and $R^8$, independently, can be H, halo, alkyl, haloalkyl, alkoxy, alkenyl, alkynyl, thioalkyl, —$NHR^9$, —$N(R^9)_2$, aryl, heteroaryl, or acyl.

Each $R^9$, independently, can be H, alkyl, or haloalkyl. j can be 1, 2, or 3; each x, independently, can be 0, 1, or 2; each y, independently, can be 1 or 2. In Formula (II), at least one of $R^4$ to $R^8$ is halo or haloalkyl.

Dye molecules according to Formula II are of the center heteroaryl variety, where the center is optionally flanked by a number of substituted or unsubstituted thiophenes, followed by a number of substituted or unsubstituted fluorinated thiophene ending groups.

In another aspect, a small molecule compound of Formula (III):

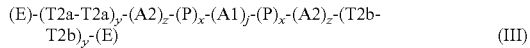

where each P, independently, can be an optionally substituted aryl group or an optionally substituted heteroaryl group. Each A1 and each A2, independently, can be an optionally substituted aryl group or an optionally substituted heteroaryl group.

Each T2a and each T2b, independently, can have the formula:

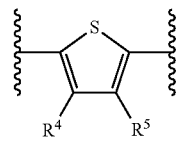

where each $R^4$ and $R^5$, independently, is H, halo, alkyl, haloalkyl, alkoxy, alkenyl, alkynyl, thioalkyl, —$NHR^9$, —$N(R^9)_2$, aryl, heteroaryl, or acyl. Each $R^9$, independently, can be H, alkyl, or haloalkyl.

Each E, independently, can be selected from the group consisting of:

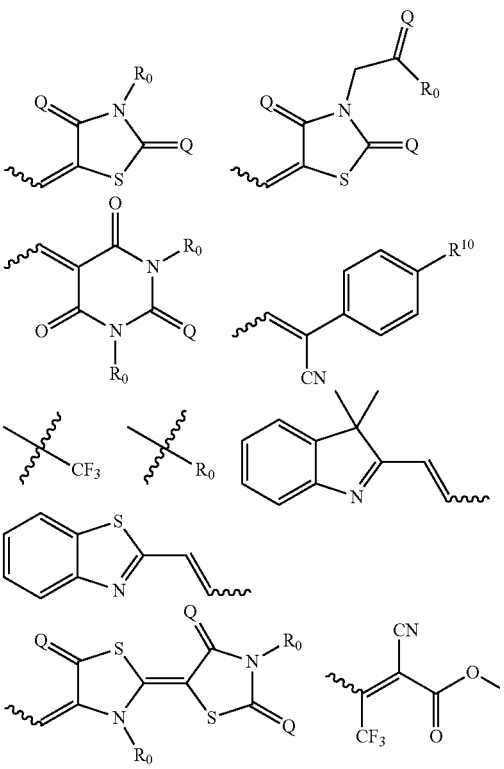

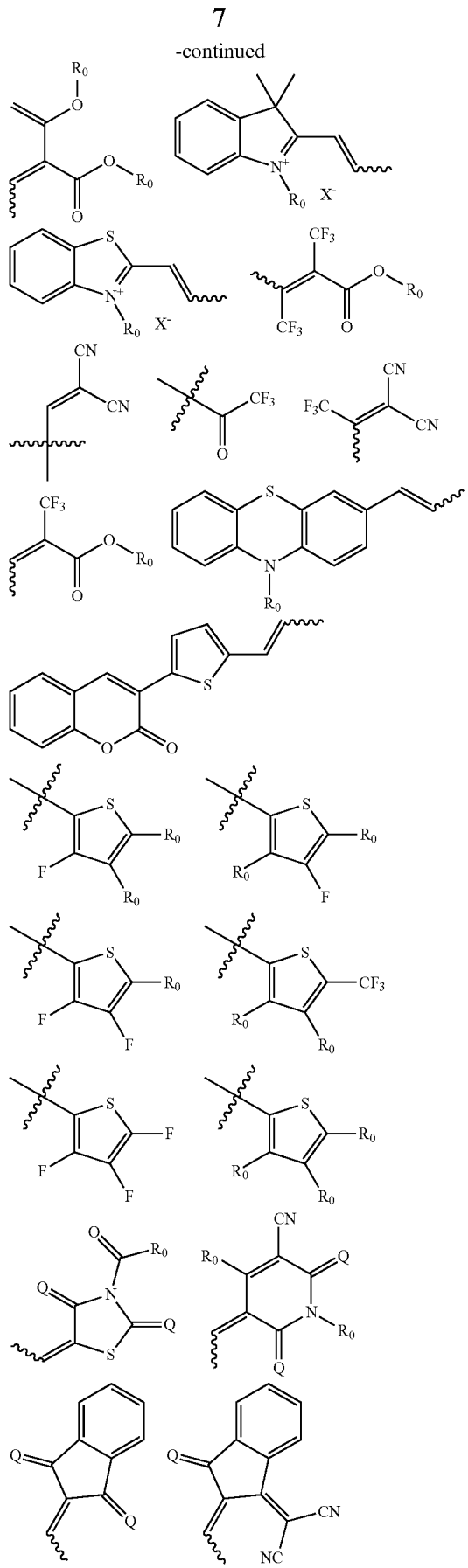
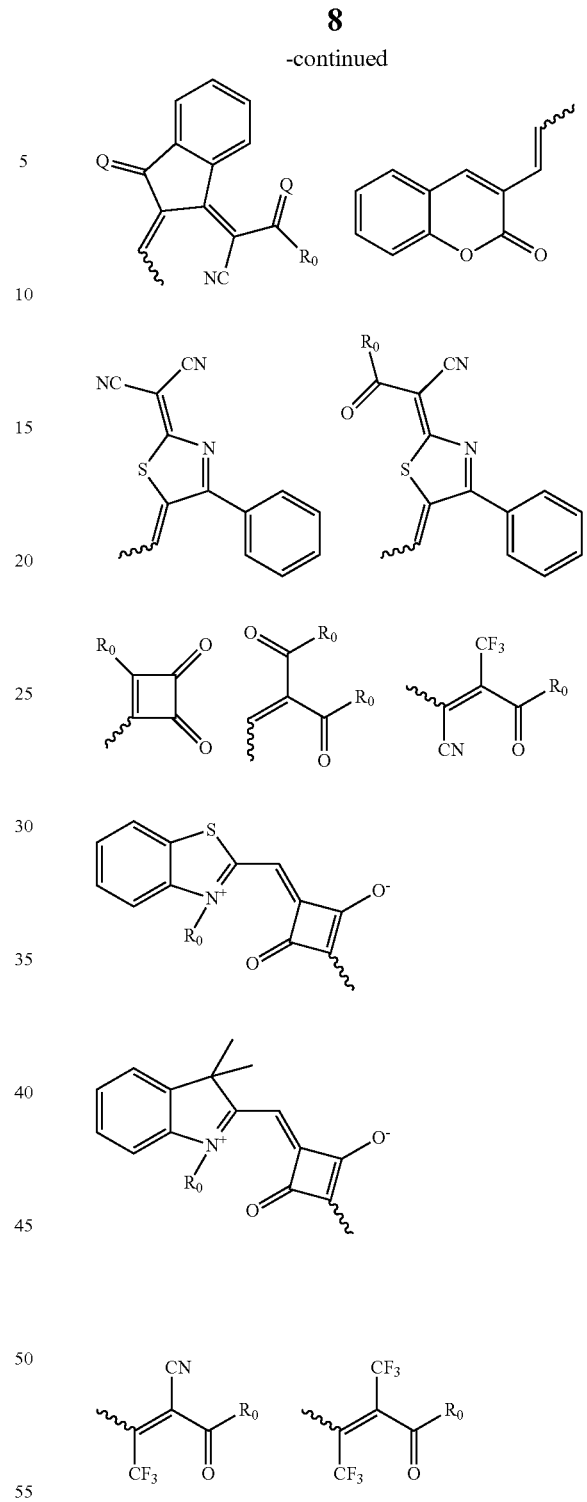

where each Q, independently, can be O or S; each $R_0$, independently, can be H or alkyl. Each $R_{10}$, independently, can be halo, —$NO_2$, —$N_3$, —CN, —$OR_0$, or $R_0$. j can be 1, or 2; Each x, independently, can be 0, 1, or 2. Each y, independently, can be 1 or 2. Each z, independently, can be 0, 1, or 2. In Formula (III), each A2, independently, is not A1; and at least one of $R^4$ or $R^5$ is halo or haloalkyl.

In Formula (III), each A1, A2, T2a, T2b, P, E, j, x, y, and z are selected such that the small molecule compound is symmetric about A1.

In another aspect, a small molecule compound of Formula (IV):
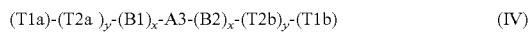
$$(T1a)\text{-}(T2a)_y\text{-}(B1)_x\text{-}A3\text{-}(B2)_x\text{-}(T2b)_y\text{-}(T1b) \qquad (IV)$$
wherein each A3, independently, can be selected from the group consisting of
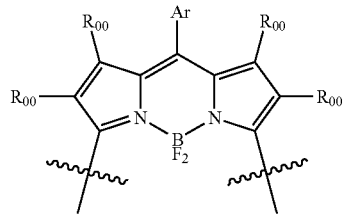
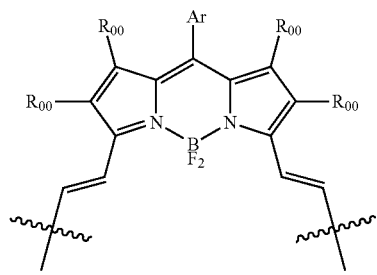
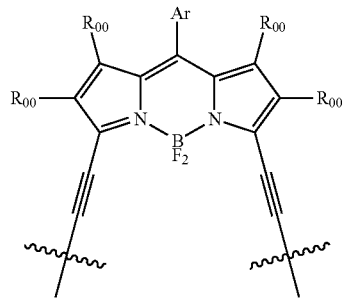
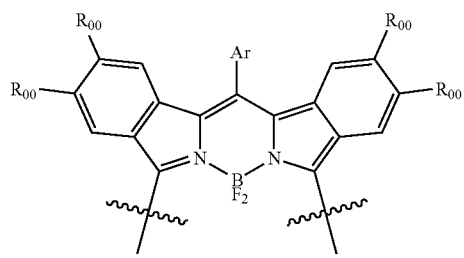
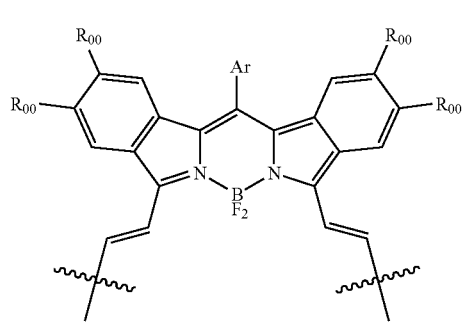
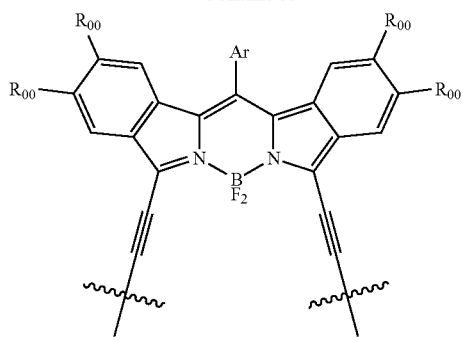
each $R_{00}$, independently, can be H or alkyl;
each Ar, independently, is selected from the group consisting of:
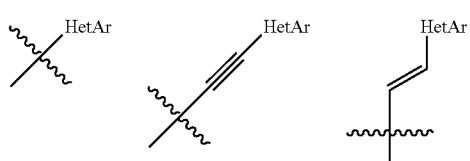
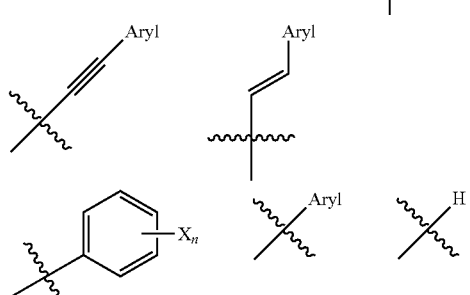
n = 0-5
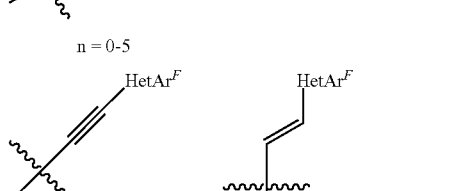
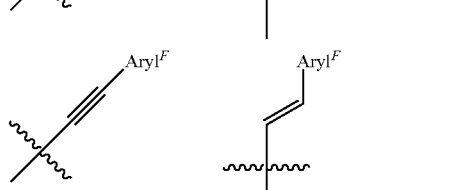
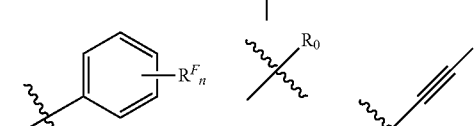
n = 0-5
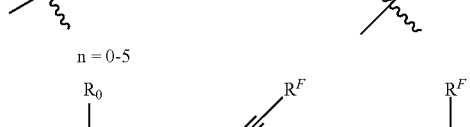

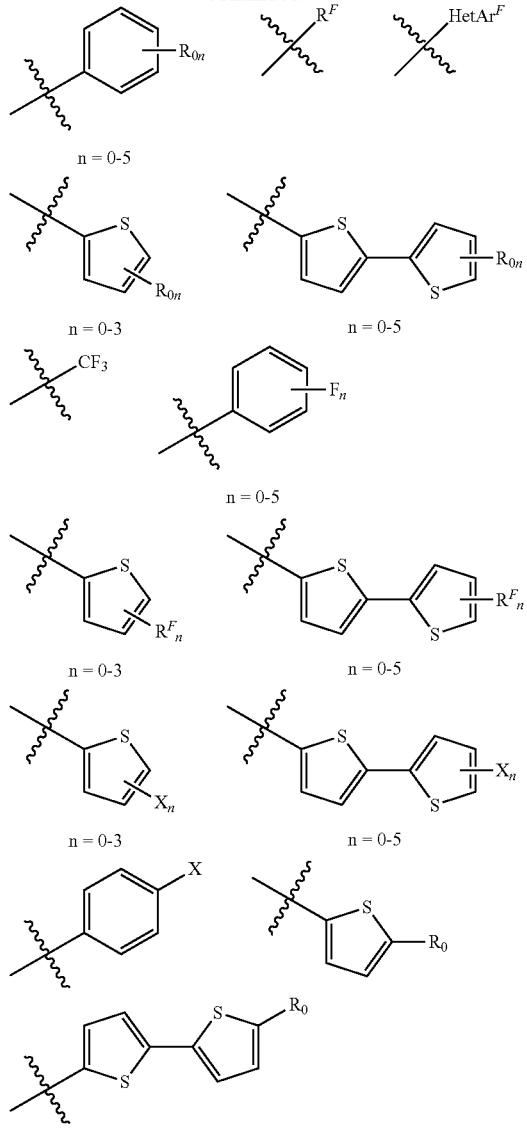

where Aryl=an aryl group;
where HetAryl=a heteroaryl group;
where Aryl$^F$=a fluorinated aryl group;
where HetAryl$^F$=a fluorinated heteroaryl group;
where R$^F$=a fluorinated alkyl group;
where X=F, Cl, Br, I, OR$_0$, SR$_0$, NHR$_0$, NR$_0$R$_0$, or R$_0$;
where R$_0$=H or alkyl.

each B1 and each B2, independently, can be an optionally substituted thiophene;

each T2a and each T2b, independently, can have the formula:

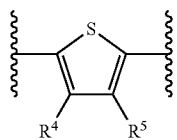

each T1a and each T1b, independently, can have the formula:

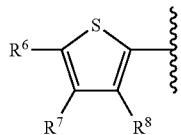

wherein each R$^4$, R$^5$, R$^6$, R$^7$, and R$^8$, independently, can be H, halo, alkyl, haloalkyl, alkoxy, alkenyl, alkynyl, thioalkyl, —NHR$^9$, —N(R$^9$)$_2$, aryl, heteroaryl, or acyl;
each R$^9$, independently, can be H, alkyl, or haloalkyl;
each x, independently, can be 0, 1, or 2;
each y, independently, can be 1 or 2;
provided that at least one of R$^4$ to R$^8$ can be halo or haloalkyl.

Dye molecules according to Formula III can be viewed as having a merged molecular structure of Formulas I and II.

DETAILED DESCRIPTION

The present invention relates to dye compounds comprising at least one fluorinated thiophene unit, intermediates for their manufacture as well as small-molecule organic solar cells comprising said dye compounds.

It is an object of the present invention to provide dye compounds leading to improved conversion efficiency when used in an OSC. More particularly, the purpose of an embodiment of the present invention is to provide dye compounds having a broad absorption spectrum, particularly in the visible and near-IR regions. The dye compounds of an embodiment of the present invention advantageously exhibit a high molar extinction coefficient. The inventive dye compounds can advantageously have an improved long-term stability, for example, by showing improved resistance to water contained in trace amounts in the devices. The inventive dye compounds can advantageously show an improved bandgap between the LUMO level of the acceptor semiconductor and the HOMO of the dye compound. It is another objective to provide dye compounds that can lead to improved open-circuit voltages ($V_{OC}$), short-circuit densities ($J_{SC}$) and/or fill factors (FF). It is yet another objective to provide dye compounds with improved pi-stacking, crystallinity, solubility and/or miscibility.

Figure 1:
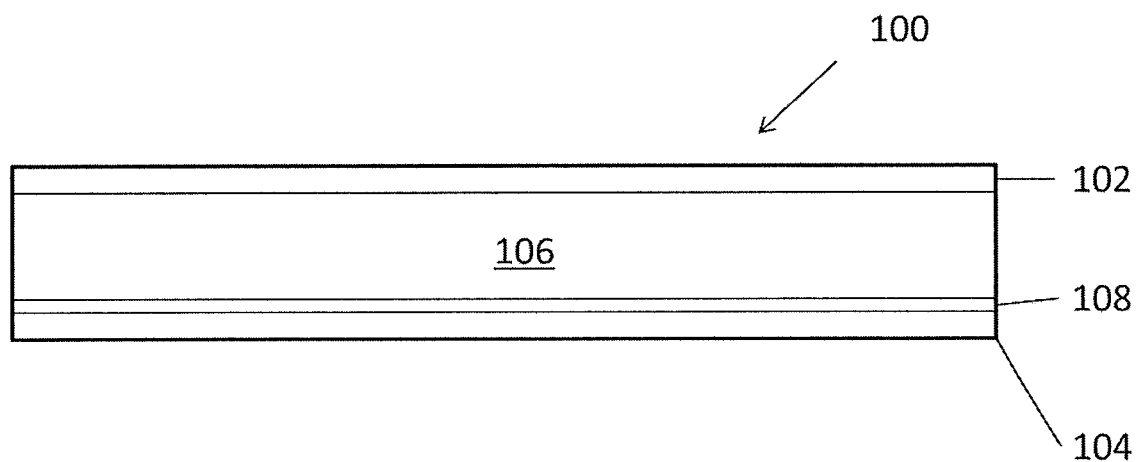
FIG. 1 is a schematic illustration of an electro-optic device according to an embodiment of the current invention.
Figure 1A:
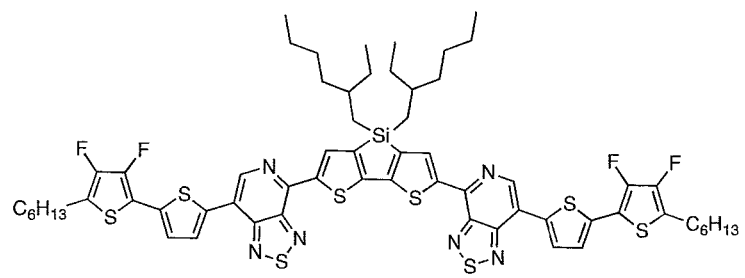
FIG. 1A shows the chemical structure of SDT[PT(1)]$_2$ (top), film optical absorption (bottom left) of BHJ film and J-V plot (bottom right) of an ITO/MoO$_3$/SDT[PT(1)]$_2$:PC$_{71}$BM/ZnO-np/Al device processed from a chlorobenzene BHJ solution containing 0.4% 1,8-diiodooctane and a 60:40 SDT[PT(1)]$_2$:PC$_{71}$BM blend ratio.
Figure 1A:
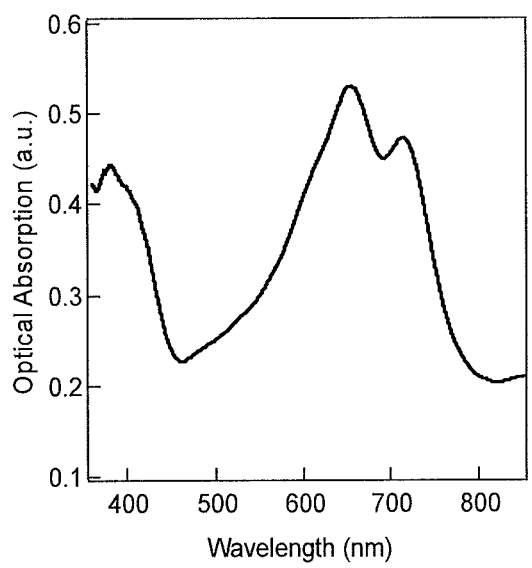
Figure 1A:
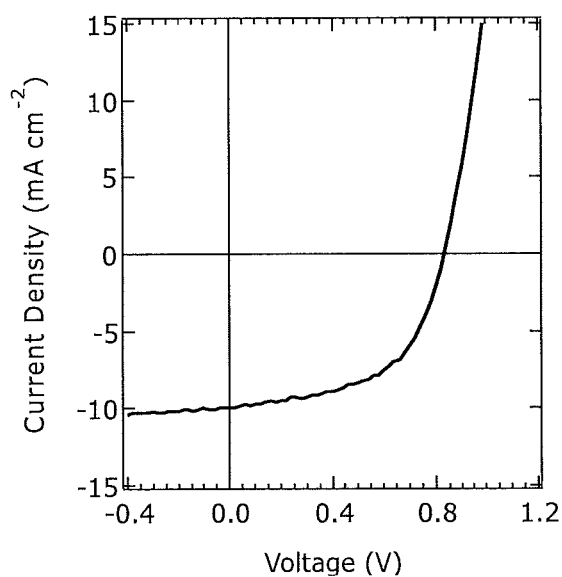
Figure 2:
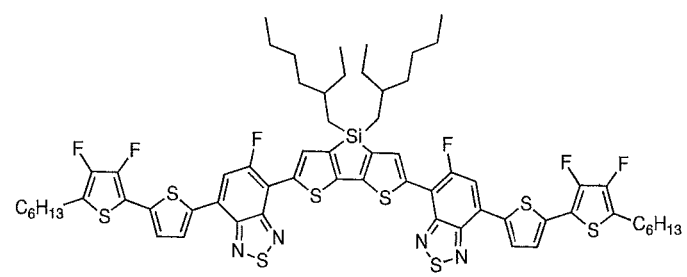
FIG. 2 shows the chemical structure of SDT[$^F$BT(1)]$_2$ (top), film optical absorption (bottom left) of BHJ film and J-V plot (bottom right) of an ITO/PEDOT:PSS/SDT[$^F$BT(1)]$_2$:PC$_{71}$BMZnO-np/Al device processed from a o-xylene BHJ solution containing 0.4% 1,8-diiodooctane and a 60:40 SDT[$^F$BT(1)]$_2$:PC$_{71}$BM blend ratio.
Figure 2:
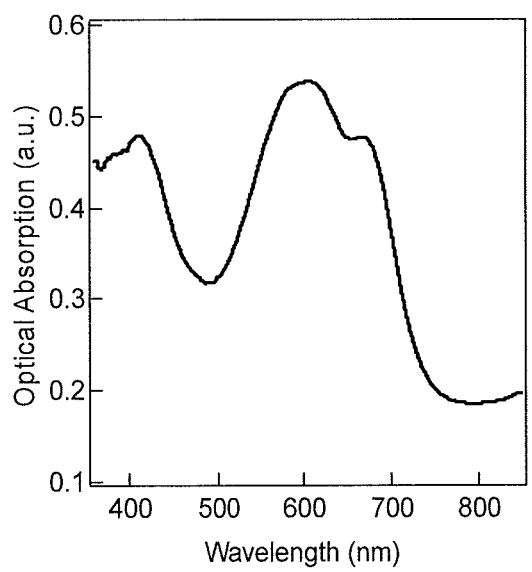
Figure 2:
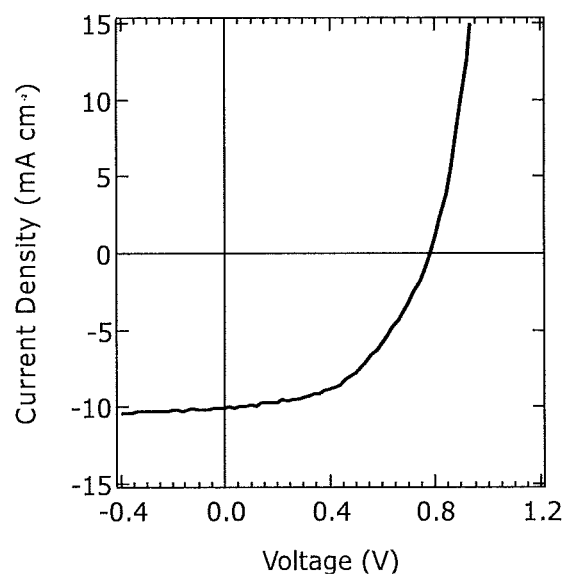
Figure 3:
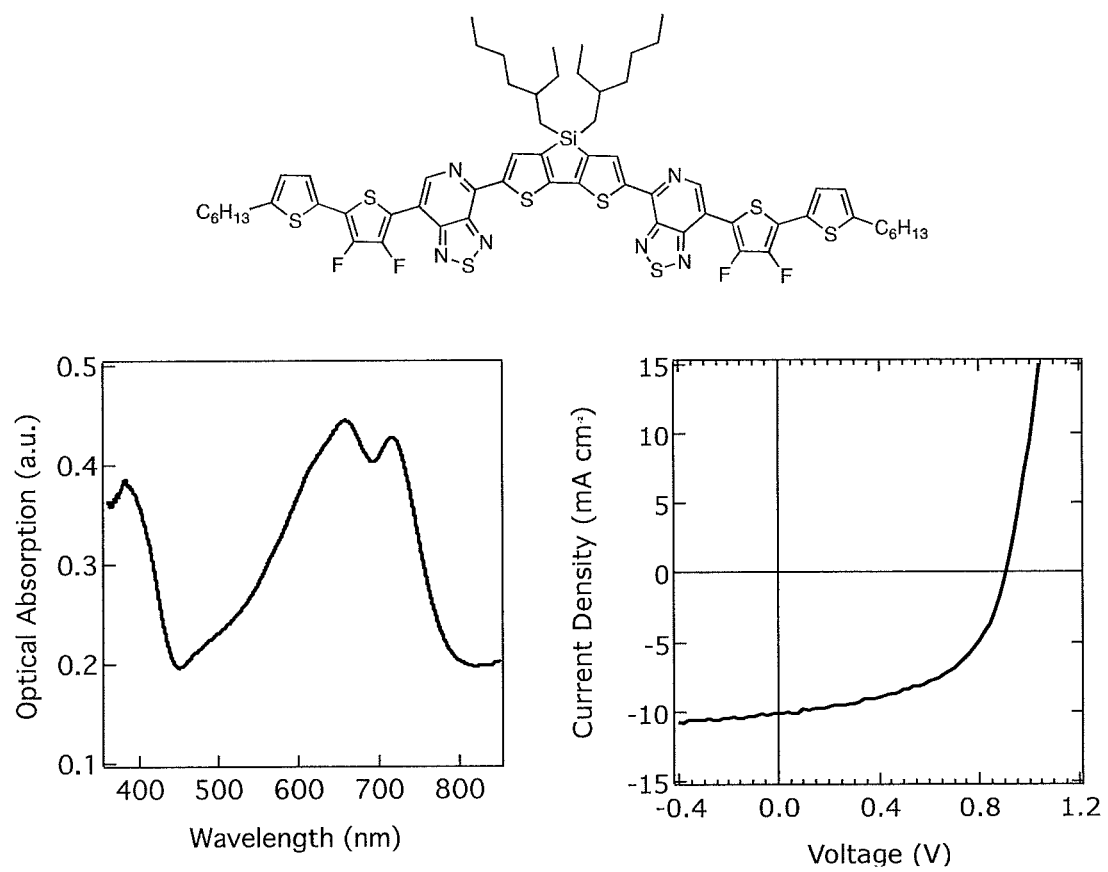
FIG. 3 shows the chemical structure of SDT[PT(2)]$_2$ (top), film optical absorption (bottom left) of BHJ film and J-V plot (bottom right) of an ITO/MoO$_3$/SDT[PT(2)]$_2$:PC$_{71}$BM/Al device processed from a chlorobenzene BHJ solution containing 0.4% 1,8-diiodooctane and a 60:40 SDT[PT(2)]$_2$:PC$_{71}$BM blend ratio.
Figure 4:
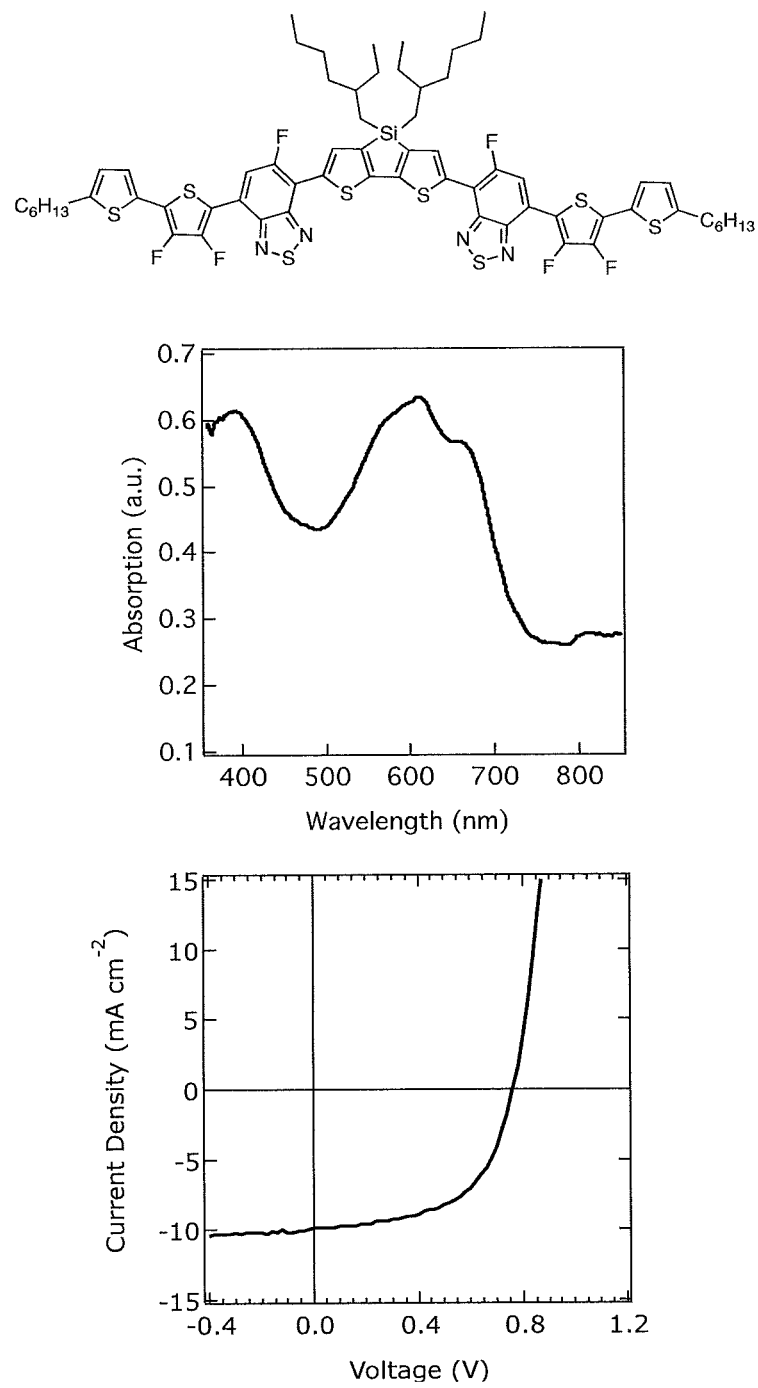
FIG. 4 shows the chemical structure of SDT[$^F$BT(2)]$_2$ (top), film optical absorption (bottom left) of BHJ film and J-V plot (bottom right) of an ITO/PEDOT:PSS/SDT[$^F$BT(2)]$_2$:PC$_{71}$BM/Al device processed from a o-xylene BHJ solution containing 2.0% 1-phenylnathalene and a 55:45 SDT[$^F$BT(2)]$_2$:PC$_{71}$BM blend ratio.
Figure 5:
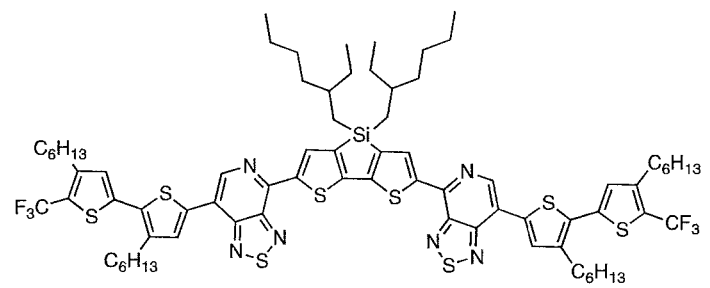
FIG. 5 shows the chemical structure of SDT[PT(3)]$_2$ (top), film optical absorption (bottom left) of BHJ film and J-V plot (bottom right) of an ITO/MoO$_3$/SDT[PT(3)]$_2$:PC$_{71}$BM/Al device processed from a chlorobenzene BHJ solution containing 0.4% 1,8-diiodooctane and a 60:40 SDT[PT(3)]$_2$:PC$_{71}$BM blend ratio.
Figure 5:
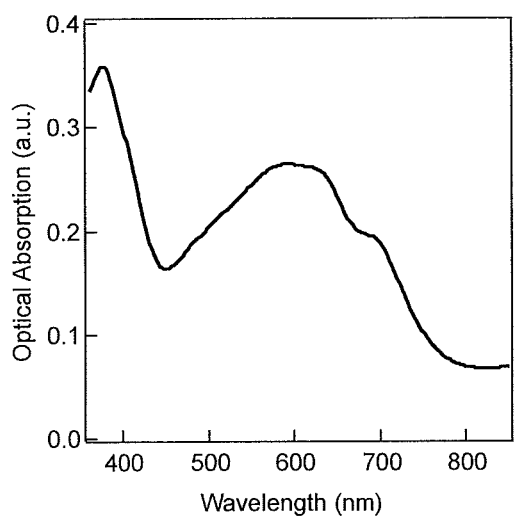
Figure 5:
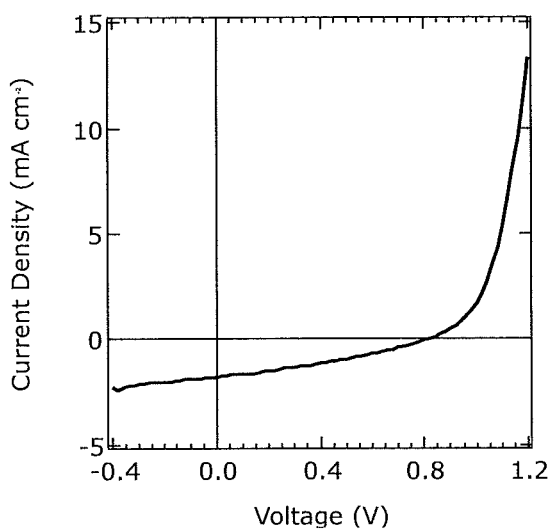
Figure 6:
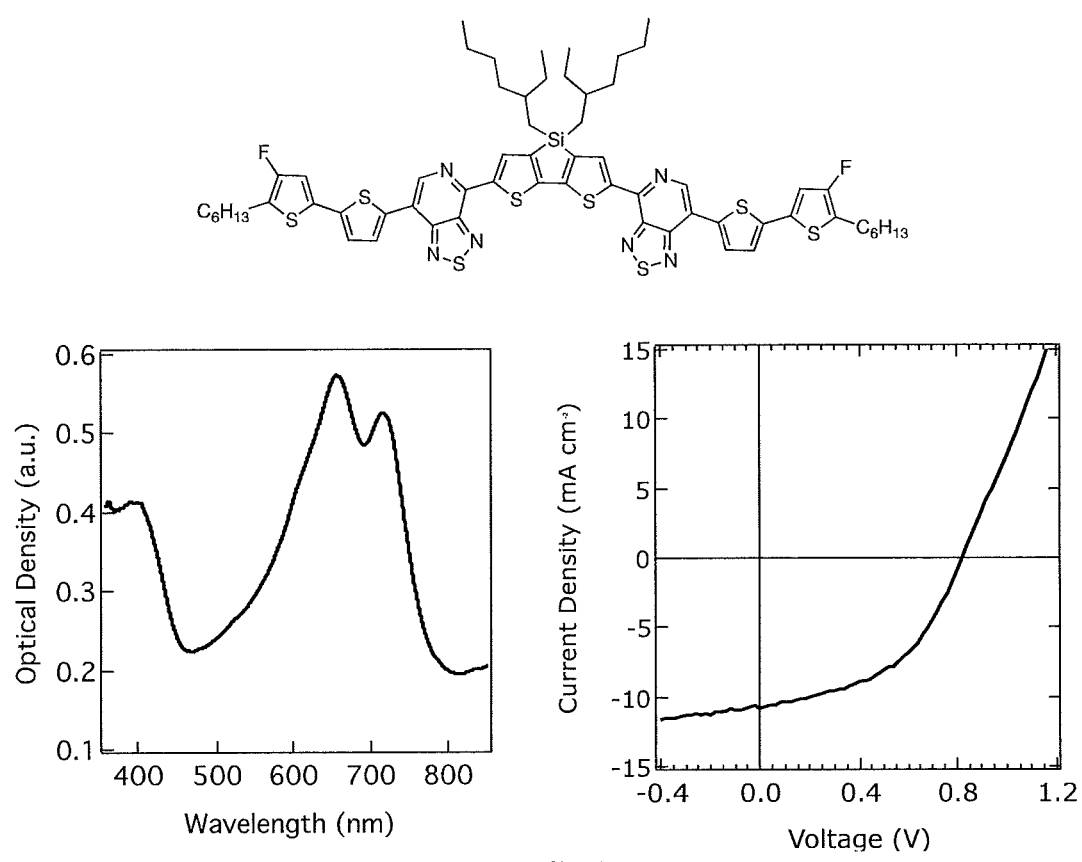
FIG. 6 shows the chemical structure of SDT[PT(4)]$_2$ (top), film optical absorption of BHJ film (bottom left) and J-V plot (bottom right) of an ITO/MoO$_3$/SDT[PT(4)]$_2$:PC$_{71}$BM/Al device processed from a chlorobenzene BHJ solution containing 0.4% 1,8-diiodooctane and a 60:40 SDT[PT(4)]$_2$:PC$_{71}$BM blend ratio.
Figure 7:
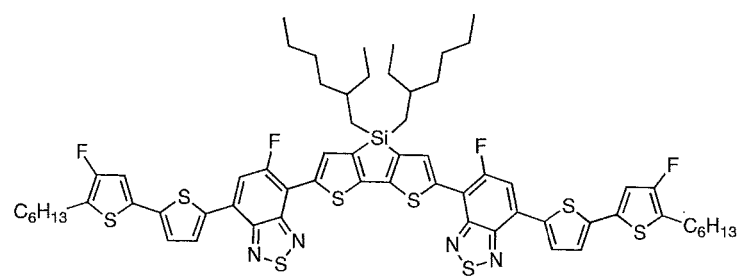
FIG. 7 shows the chemical structure of SDT[$^F$BT(4)]$_2$ (top), film optical absorption of BHJ film (bottom left) and J-V plot (bottom right) of an ITO/PEDOT:PSS/SDT[$^F$BT(4)]$_2$:PC$_{71}$BM/ZnO/Al device processed from a o-xylene BHJ solution containing 0.6% 1,8-diiodooctane and a 55:45 SDT[$^F$BT(4)]$_2$:PC$_{71}$BM blend ratio.
Figure 7:
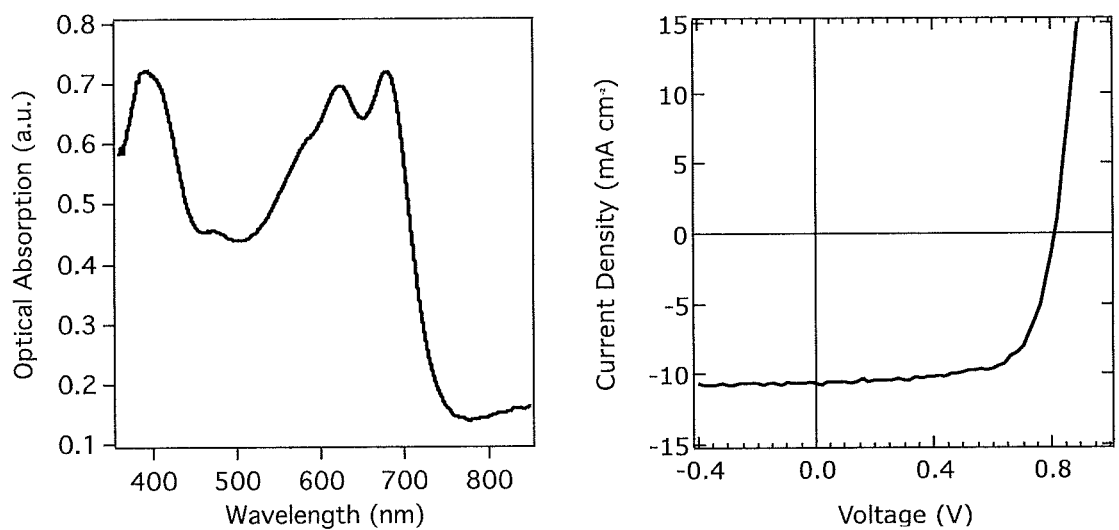
Figure 8:
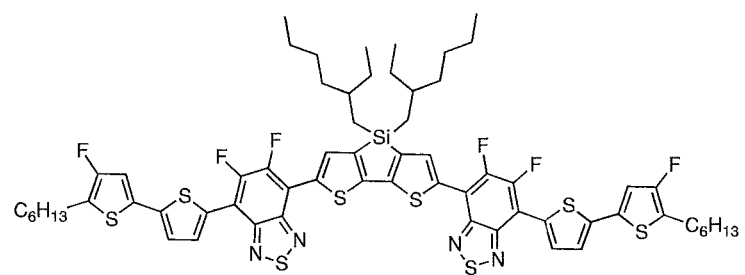
FIG. 8 shows the chemical structure of SDT[$^{FF}$BT(4)]$_2$ (top), film optical absorption of BHJ film and J-V plot (bottom right) of an ITO/PEDOT:PSS/SDT[$^{FF}$BT(4)]$_2$:PC$_{71}$BM/ZnO/Al device processed from a o-xylene BHJ solution containing 0.6% 1-phenylnathalene and a 55:45 SDT[$^{FF}$BT(4)]$_2$:PC$_{71}$BM blend ratio.
Figure 8:
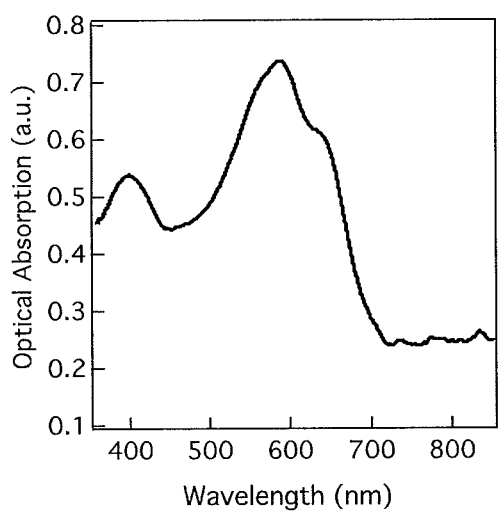
Figure 8:
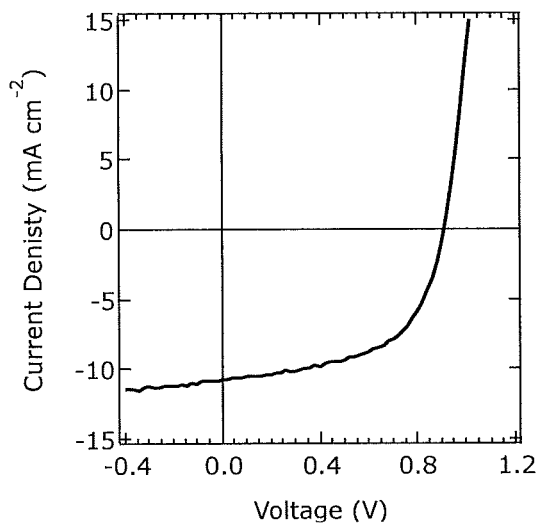

FIG. 1 is a schematic illustration of an electro-optic device 100 according to an embodiment of the current invention. The electro-optic device 100 has a first electrode 102, a second electrode 104 spaced apart from the first electrode 102, and an active layer 106 disposed between the first electrode and the second electrode. The electro-optic device 100 can have multiple layers of active materials and/or layers of material between the electrodes and the active layer such as the layer 108, for example.

The first electrode 102 and the second electrode 104 can be interfacial/transport layers to facilitate charge extraction and two conductive charge collecting electrodes, one or both of which may be transparent. The active layer 106 can include a photoactive layer. In an embodiment, the photoactive layer can include one or more dye compound of the present invention comprising at least one fluorinated thiophene unit. The photoactive layer can be formed from a blend of donor and acceptor organic semiconductors. In one embodiment, the donor organic semiconductors is one or more dye compounds of the present invention comprising at least one fluorinated thiophene unit. One or both of the electrodes 102 and 104 can be transparent electrodes in some embodiments.

In one aspect of the present invention, an electronic or optoelectronic device includes a first electrode; a second electrode proximate the first electrode with a space reserved therebetween; and an active layer arranged between and in electrical connection with the first and second electrodes. In some embodiments, the active layer includes one or more dye compound. In some embodiments, the dye compound comprises a small molecule compound of Formula (I), Formula (II), Formula (III), and/or Formula (IV), as provided below.

The term "aryl" used alone or as part of a larger moiety, refers to mono-, bi-, tri-, or larger aromatic hydrocarbon ring systems having five to thirty members. Aryl groups may be independently defined between any two endpoints within this range, so that a particular aryl group may have, for example, 5 to 24 members, 6 to 24 members, 6 to 14 members, 10 to 30 members, and so forth. The term "aryl" may be used interchangeably with the term "aryl ring". "Aryl" also includes fused polycyclic aromatic ring systems in which an aromatic ring is fused to one or more rings. Examples include 1-naphthyl, 2-naphthyl, 1-anthracyl and 2-anthracyl. Also included within the scope of the term "aryl", as it is used herein, is a group in which an aromatic ring is fused to one or more nonaromatic rings, such as in an indanyl, phenanthridinyl, or tetrahydronaphthyl, and including spiro compounds, such as spirobi[fluorene], where the radical or point of attachment is on the aromatic ring. The term "aralkyl" refers to an alkyl substituent substituted by an aryl group. The term "aryloxy" refers to an —O-aryl group, such as, for example phenoxy, 4-chlorophenoxy and so forth. The term "arylthio" refers to an —S-aryl group such as, for example phenylthio, 4-chlorophenylthio, and so forth. The term "aryl" used alone or as part of a larger moiety also refers to aryl rings that are substituted such as, for example, 4-chlorophenyl, 3,4-dibromophenyl and so forth. An aryl group may have more than one substituent, up to the total number of free substitution positions. For example, an aryl group may have 1, 2, 3, 4, 5 or more substituents. The substituents may be the same or different. Substituents on an aryl group include hydrogen, halogen, alkyl, alkenyl, nitro, hydroxyl, amino, alkylamino, alkoxy, and alkylthio, acyl, O-acyl, N-acyl, S-acyl as defined herein.

The term "aryl" is intended to denote a group which derives from an aromatic nucleus such as, in particular, a $C_6$-$C_{10}$ aromatic nucleus. Specific examples of such groups are phenyl, 1-tolyl, 2-tolyl, 3-tolyl, xylyl, 1-naphthyl and 2-naphthyl, in particular phenyl or naphthyl. The aryl group can optionally be substituted, e.g. by halogen, alkyl, or cycloalkyl.

The term "heteroaryl", used alone or as part of a larger moiety, refers to heteroaromatic ring groups having five to thirty members, in which one or more ring carbons (1 to 6, 1 to 4, 1 to 3, 1 to 2, or 1), are each replaced by a heteroatom such as N, O, S, or Si. Heteroaryl groups may be independently defined between any two endpoints within this range, so that a particular heteroaryl group may have, for example, 5 to 24 members, 6 to 24 members, 6 to 14 members, 10 to 30 members, and so forth. Examples of heteroaryl rings include 2-furanyl, 3-furanyl, N-imidazolyl, 2-imidazolyl, 4-imidazolyl, 5-imidazolyl, 3-isoxazolyl, 4-isoxazolyl, 5-isoxazolyl, 2-oxadiazolyl, 5-oxadiazolyl, 2-oxazolyl, 4-oxazolyl, 5-oxazolyl, 1-pyrrolyl, 2-pyrrolyl, 3-pyrrolyl, 1-pyrazolyl, 3-pyrazolyl, 4-pyrazolyl, 2-pyridyl, 3-pyridyl, 4-pyridyl, 2-pyrimidyl, 4-pyrimidyl, 5-pyrimidyl, 3-pyridazinyl, 2-thiazolyl, 4-thiazolyl, 5-thiazolyl, 5-tetrazolyl, 2-triazolyl, 5-triazolyl, 2-thienyl, 3-thienyl, carbazolyl, benzimidazolyl, benzothienyl, benzofuranyl, indolyl, quinolinyl, benzotriazolyl, benzothiazolyl, benzooxazolyl, benzimidazolyl, isoquinolinyl, indazolyl, isoindolyl, acridinyl, benzoisoxazolyl. Other specific examples include thiophene, pyrrole, furan, phosphole, benzodithiophene, spirothiophene, bithiophene, terthiophene, thienothiophene, dithienothiophene, benzothiophene, isobenzothiophene, benzodithiophene, cyclopentadithiophene, silacyclopentadiene, silacyclopentadienebithiophene, indole, benzene, naphthalene, anthracene, perylene, indene, fluorene, pyrene, azulene, pyridine, oxazole, thiazole, thiazine, pyrimidine, pyrazine, imidazole, benzoxazole, benzoxadiazole, benzothiazole, benzimidazole, benzofuran, isobenzofuran, thiadiazole, dithienopyrrole, dithienophosphole, and carbazole 9,9-RR'-9H-fluorene, 9-R-9H-carbazole, 3,3'-RR'silylene-2, 2'-bithiophene, 3,3'RR'-cyclopenta[2,1-b:3,4-b']-dithiophene where R and R'=$C_1$-$C_{30}$ alkyl or $C_6$-$C_{30}$ aryl. Also included within the scope of the term "heteroaryl", as it is used herein, is a group in which a heteroaromatic ring is fused to one or more aromatic or nonaromatic rings, including spiro compounds, where the radical or point of attachment is on the heteroaromatic ring. Examples include tetrahydroquinolinyl, tetrahydroisoquinolinyl, pyrido[3,4-d]pyrimidinyl, spirobi[dibenzo[b,c]silole], spirobi[cyclopenta[1,2-b:5,4-b']dithiophene], or spirobi[silolo[3,2-b:4,5-b']dithiophene]. The term "heteroaryl" may be used interchangeably with the term "heteroaryl ring" or the term "heteroaromatic." The term "heteroaralkyl" refers to an alkyl group substituted by a heteroaryl, such as, for example, 2-pyridylmethyl, 3-pyridylmethyl, 1-imidazolomethyl, 2-imidazolomethyl and so forth. The term "heteroaryloxy" refers to an —O-heteroaryl group. The term "heteroarylthio" refers to an —S-aryl group. A heteroaryl group may have more than one substituent, up to the total number of free substitution positions. For example, a heteroaryl group may have 1, 2, 3, 4, or 5 substituents. The substituents may the same or different. Substituents on a heteroaryl group include hydrogen, halogen, alkyl, alkenyl, nitro, hydroxyl, amino, alkylamino, alkoxy, and alkylthio, acyl, O-acyl, N-acyl, S-acyl as defined herein.

The term "heteroaryl" is intended to denote in particular a cyclic aromatic group made up of 3, 4, 5, 6, 7 or 8 atoms, at least one of which is a hetero atom. The hetero atom is often chosen from B, N, O, Si, P and S. It is more often chosen from N, O and S. Specific examples of such heteroaryls are pyridine, pyrimidine, thiophene, thiazole, quinoline, isoquinoline, isoxazole, pyrazole, imidazole, furan, dioxane. The heteroaryl group can optionally be substituted, e.g. by halogen, alkyl, or cycloalkyl.

The term "alkyl" is intended to denote in particular a linear or branched alkyl or a cycloalkyl group comprising from 1 to 20 carbon atoms, preferably 1, 2, 3, 4, 5, 6, 7, 8, 9 or 10 carbon atoms. Specific examples of such substituents are methyl, ethyl, n-propyl, isopropyl, n-butyl, isobutyl, tert-butyl, n-pentyl, isopentyl, n-hexyl, 2-hexyl, n-heptyl, n-octyl, cyclopropyl, cyclobutyl, cyclopentyl, cyclohexyl and cycloheptyl. If not further specified, the term "alkyl" is intended to denote n-alkyl, e.g. $C_6H_{13}$ is intended to denote n-$C_6H_{13}$. The alkyl or cycloalkyl group can optionally be substituted, e.g. by halogen. Halogen-substituted alkyl groups can also be referred to as "haloalkyl" groups, and include fluoro-substituted alkyl groups, i.e., "fluoroalkyl" groups. The term fluoroalkyl includes perfluoroalkyl.

The term "alkylidene" is intended to denote in particular a $C_2$ to $C_7$ alkylene group, including a vinylidene group, wherein the alkylidene group preferably comprises a bridge of 2, 3, 4, 5, or 6 carbon atoms, more preferably 2 carbon atoms. The alkylidene group can optionally be substituted, e.g. by halogen, alkyl, or cycloalkyl.

In some embodiments, the invention includes a small molecule compound of Formula (I):

T1a-T2a-(A1)$_m$-(B1)$_n$-P-(B2)$_n$-(A2)$_m$-T2b-T1b     (I)

In Formula (I), P can be an optionally substituted aryl group or an optionally substituted heteroaryl group, or P can be a group having the formula: -A1-P'-A2-, wherein P' is an optionally substituted aryl group or an optionally substituted heteroaryl group. Each B1 and each B2, independently, can be an optionally substituted thiophene. Each A1 and each A2, independently, can be an optionally substituted aryl group or an optionally substituted heteroaryl group.

T2a and T2b, independently, can have the formula:

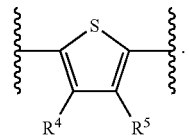

T1a and T1b, independently, can have the formula:

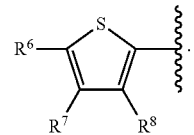

Each $R^4$, $R^5$, $R^6$, $R^7$, and $R^8$, independently, can be H, halo, alkyl, haloalkyl, alkoxy, alkenyl, alkynyl, thioalkyl, —NHR$^9$, —N(R$^9$)$_2$, aryl, heteroaryl, or acyl. Each R$^9$, independently, can be H, alkyl, or haloalkyl. Each n, independently, can be 0, 1, 2 or 3. Each m, independently, can be 1, 2, or 3.

In Formula (I), at least one of $R^4$ to $R^8$ is halo or haloalkyl, and when $R^4$ or $R^5$ is fluoro, the other is not alkyl or haloalkyl, and when $R^7$ or $R^8$ is fluoro, the other is not alkyl or haloalkyl.

Thus, in some embodiments, the compounds of Formula (I) can include a dithiophene moiety; at least one substituent within the dithiophene moiety can be a fluorinated substituent (e.g., fluoro or fluoroalkyl).

In some embodiments, each of $R^4$ to $R^8$, independently, is H, fluoro, alkyl, or fluoroalkyl.

In some embodiments, either (i) each $R^6$, independently, is alkyl, and at least one of $R^4$, $R^5$, $R^7$, and $R^8$ is fluoro, and the remaining of $R^4$ to $R^8$ are H or fluoro; or (ii) each $R^6$, independently, is fluoro or haloalkyl, and each $R^4$, $R^5$, $R^7$, and $R^8$, independently, is H or alkyl.

In some embodiments, each T1a, T2a, A1, B1, B2, A2, T2b, T1b, n and m are selected such that the small molecule compound is symmetric about P.

In some embodiments, P or P' is selected from the group consisting of

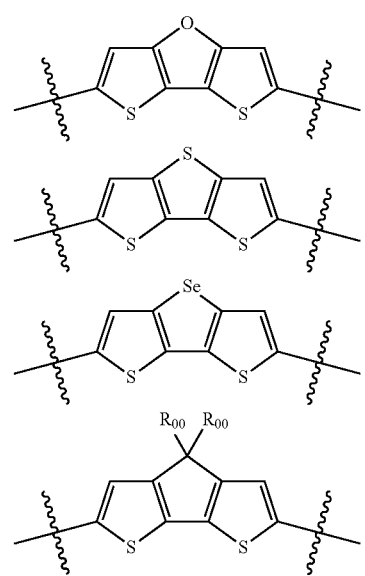

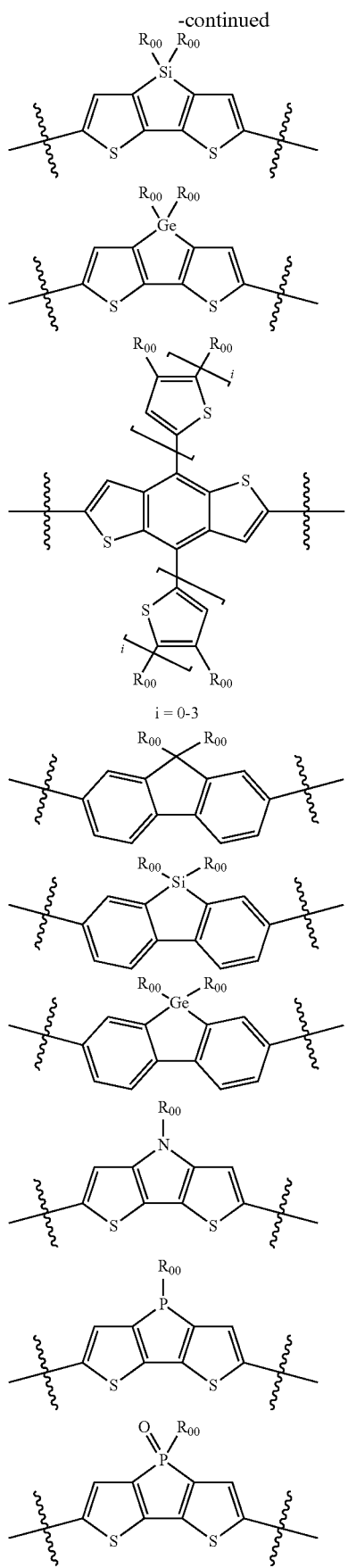

-continued
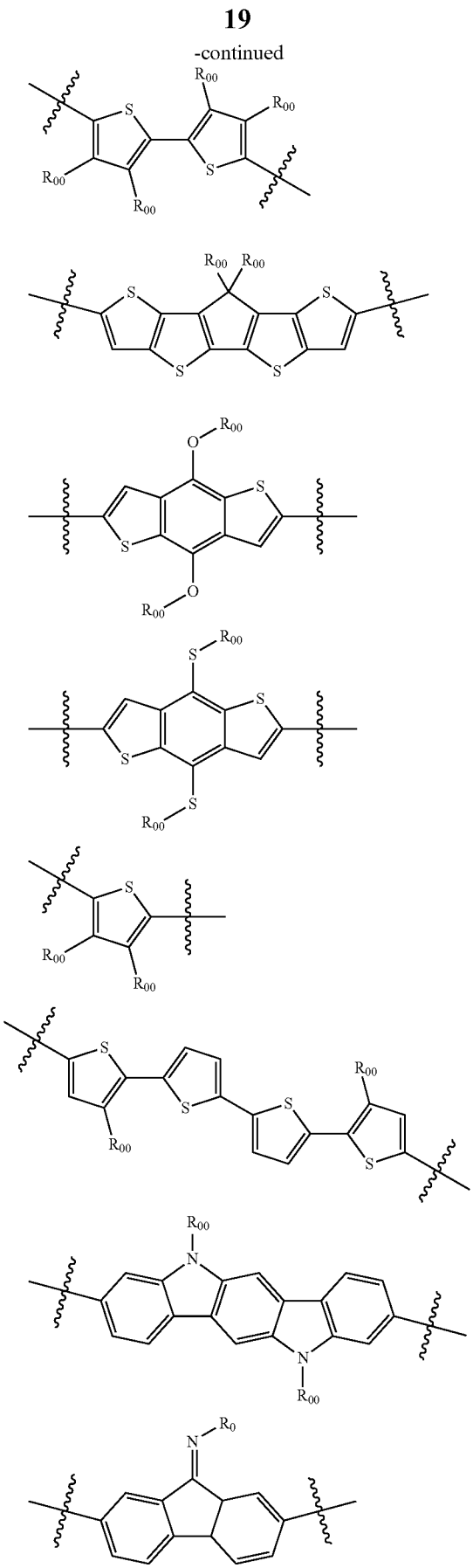
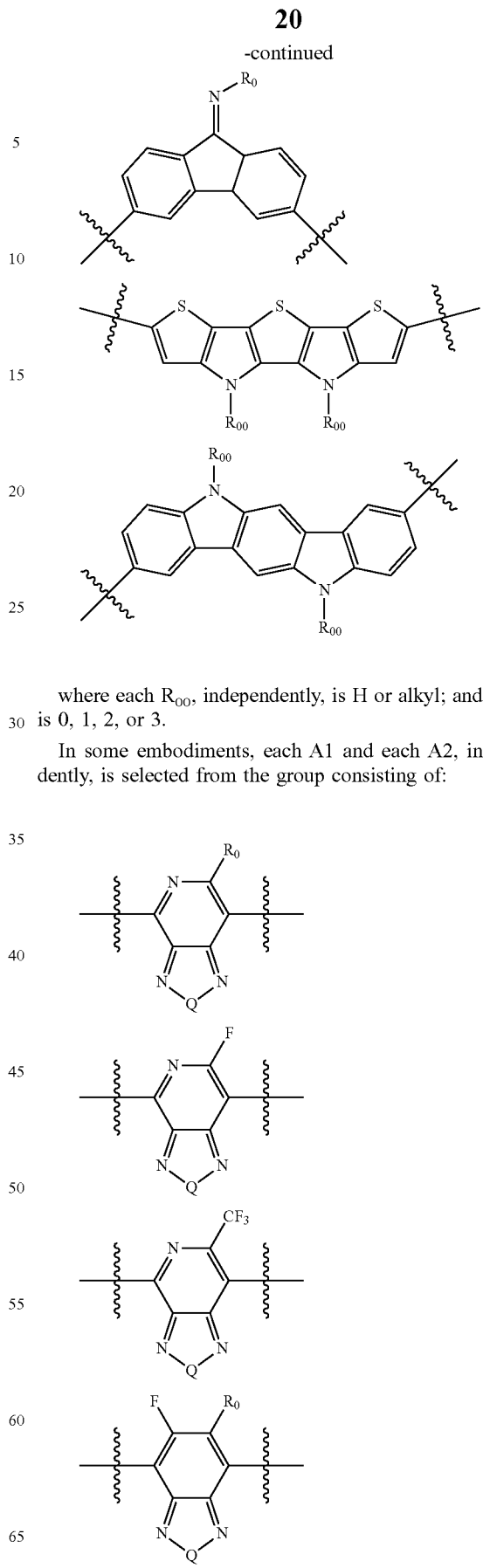
where each $R_{00}$, independently, is H or alkyl; and each i is 0, 1, 2, or 3.
In some embodiments, each A1 and each A2, independently, is selected from the group consisting of:

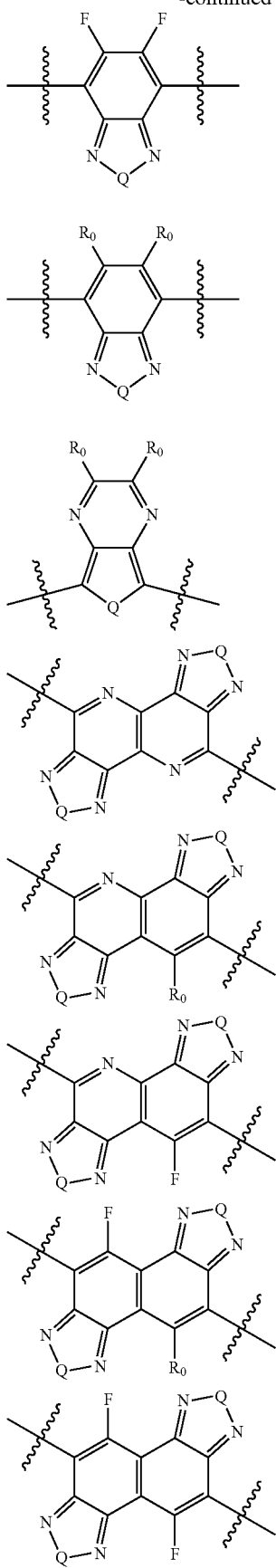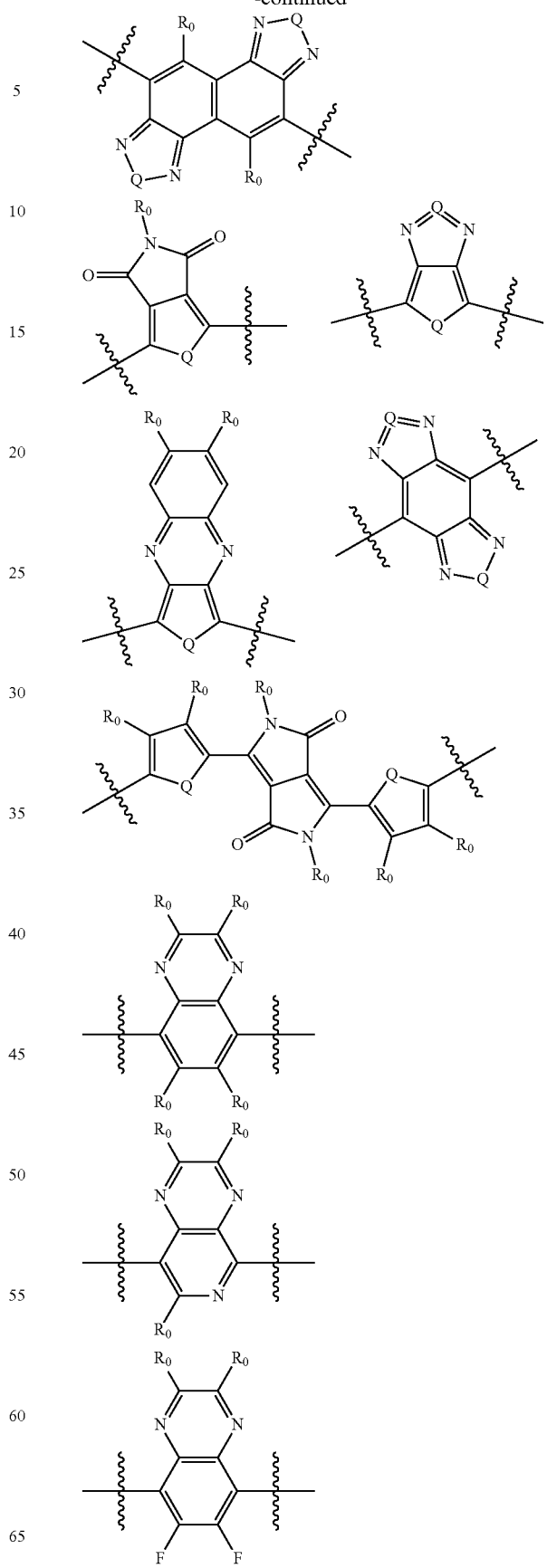

-continued
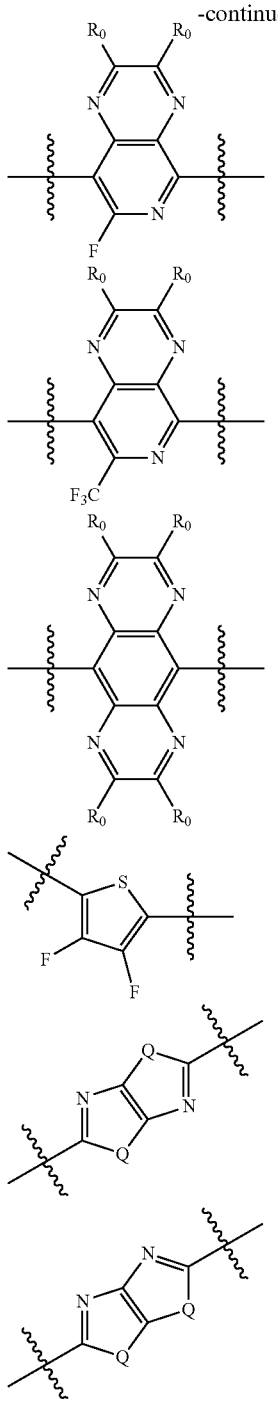
where each Q, independently, is O or S; and each $R_0$, independently, is H or alkyl.
In some embodiments, P is selected from the group consisting of
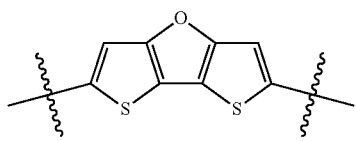
-continued
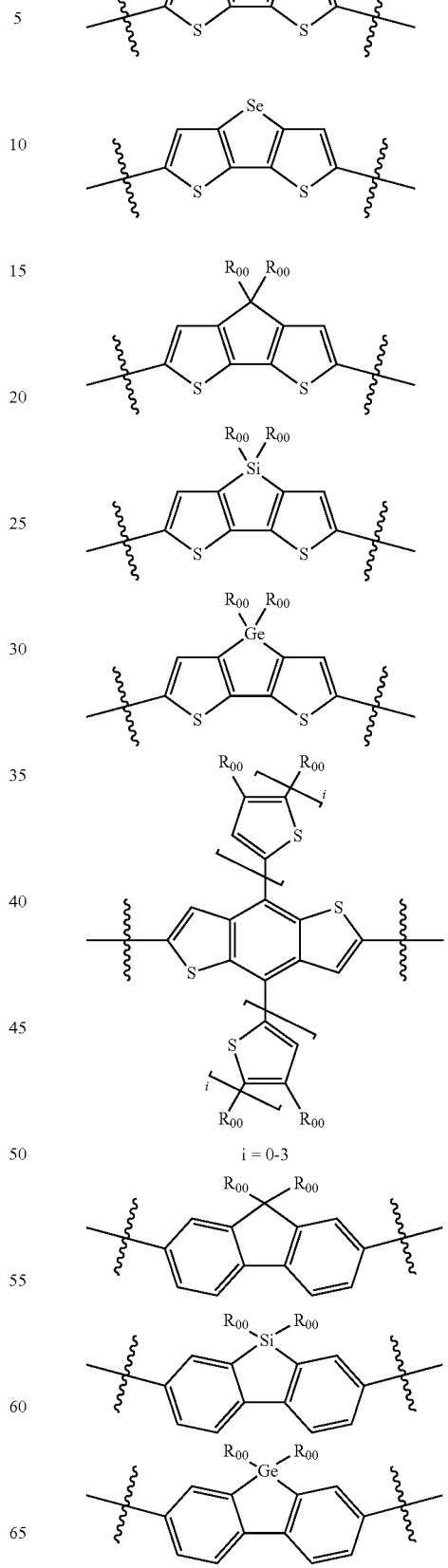

-continued
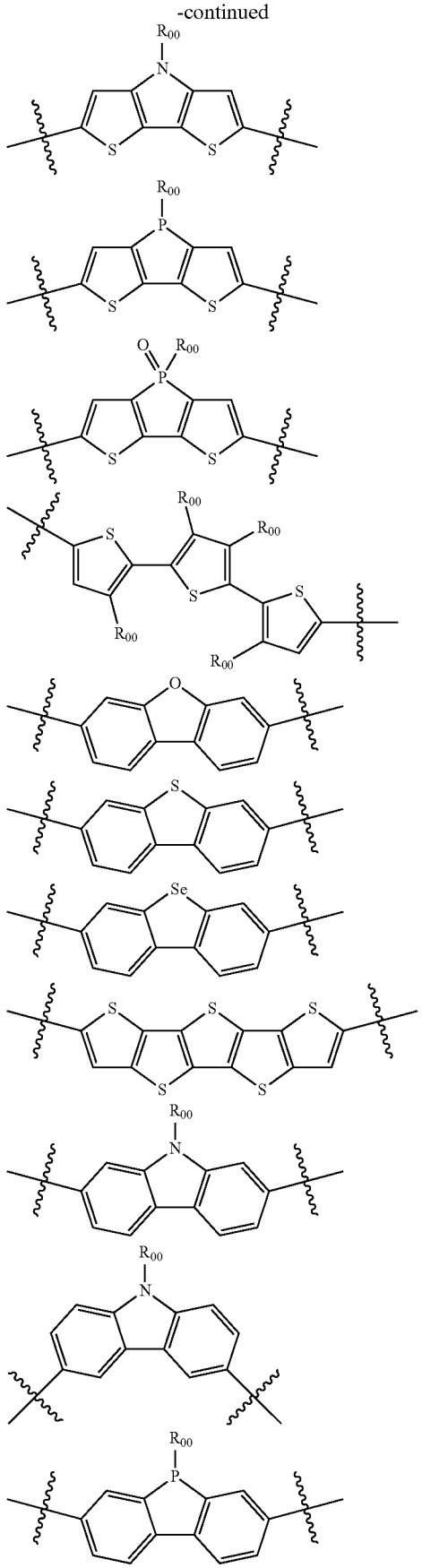
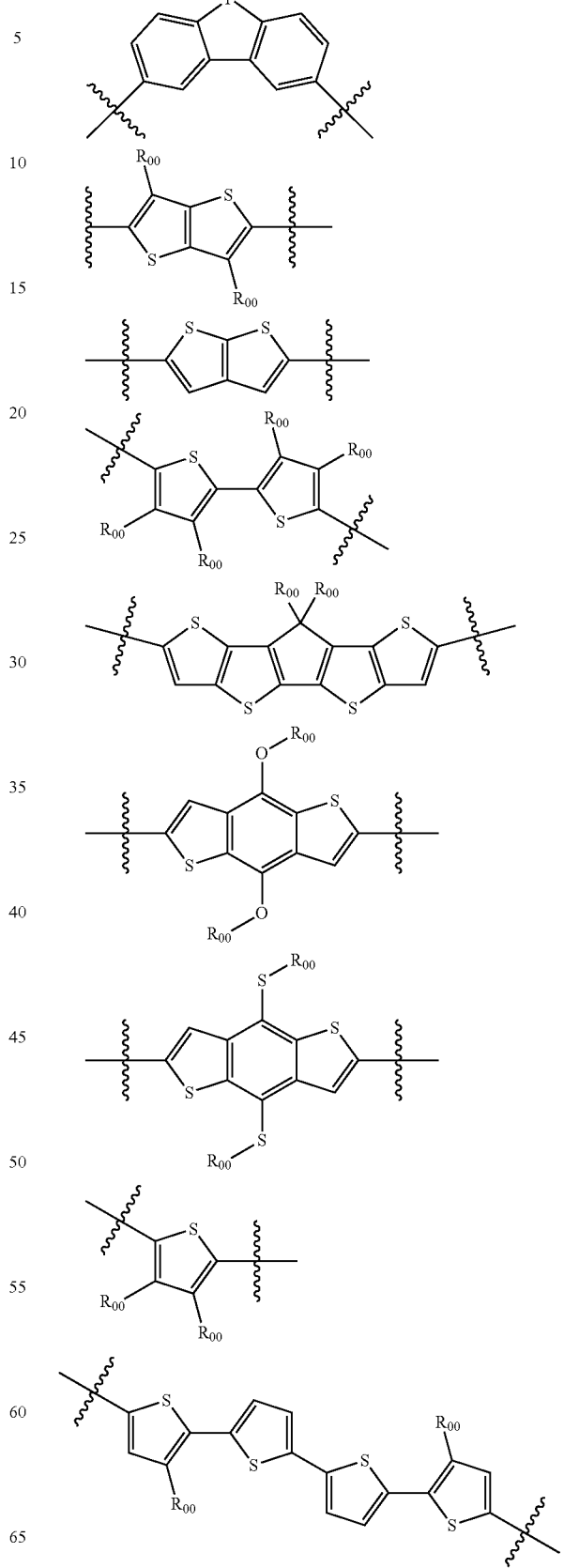

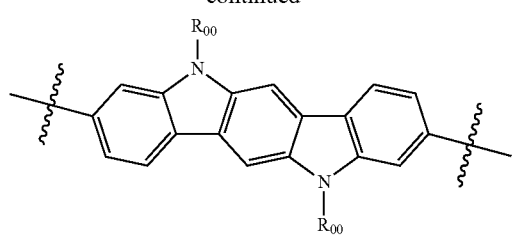
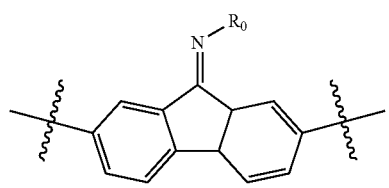
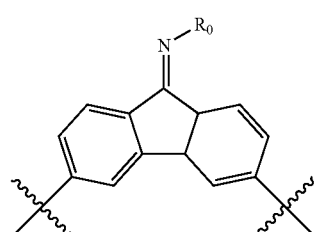
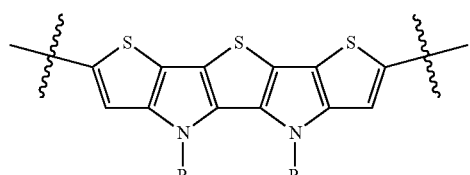
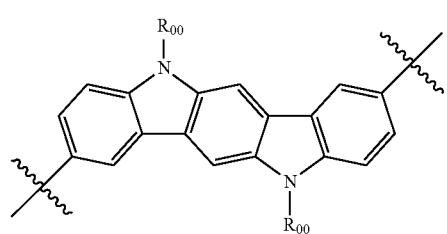
where each $R_{00}$, independently, is H or alkyl; and each i is 0, 1, 2, or 3; and
each A1 and each A2, independently, is selected from the group consisting of:
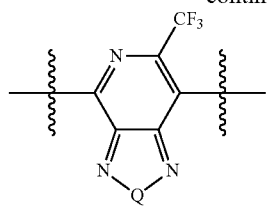
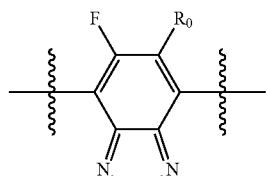
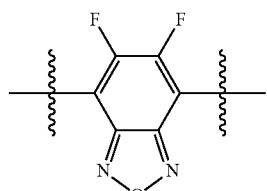
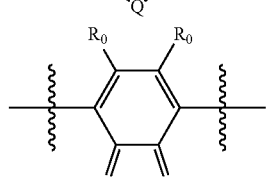
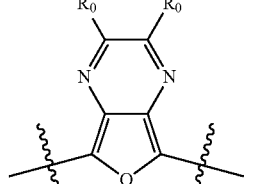
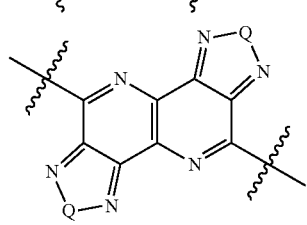
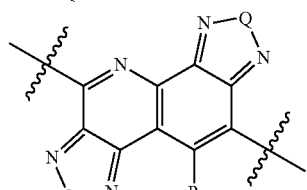
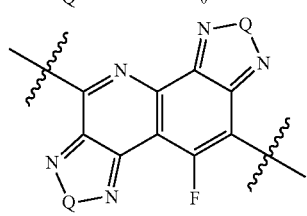

-continued
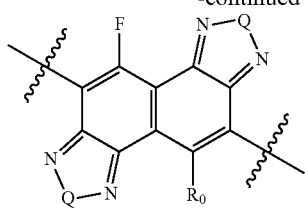
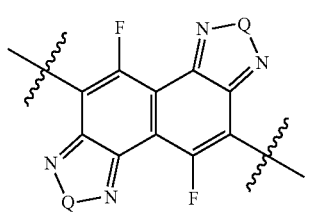
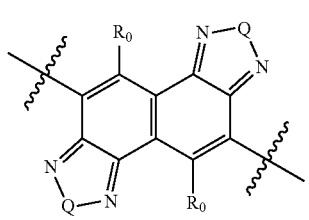
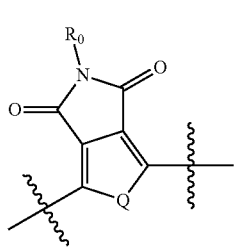
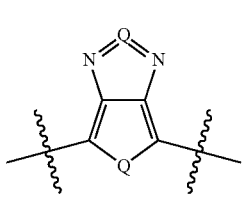
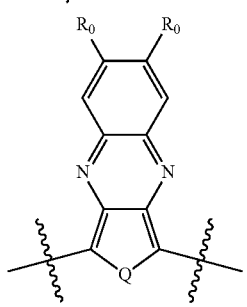
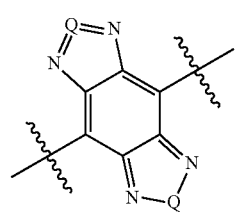
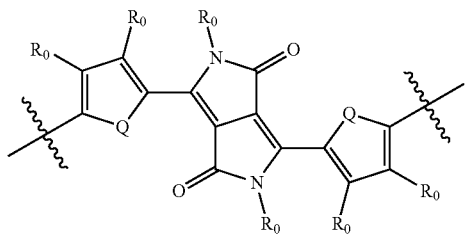
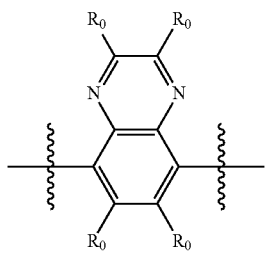
-continued
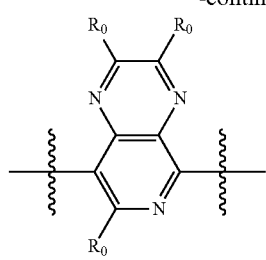
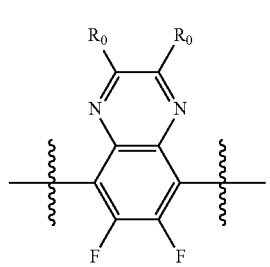
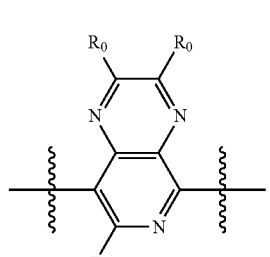
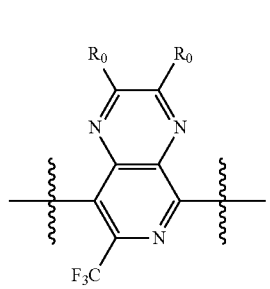
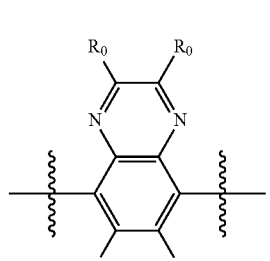
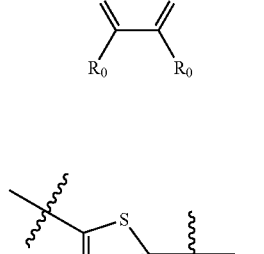
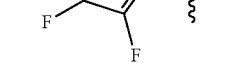

-continued

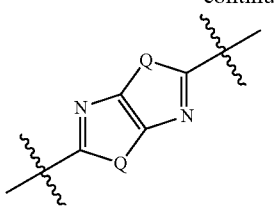

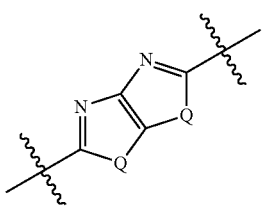

where each Q, independently, is O or S; each $R_0$, independently, is H or alkyl; and where each T1a, T2a, A1, B1, B2, A2, T2b, T1b, n and m are selected such that the small molecule compound is symmetric about P.

In some embodiments, P or P' has the formula:

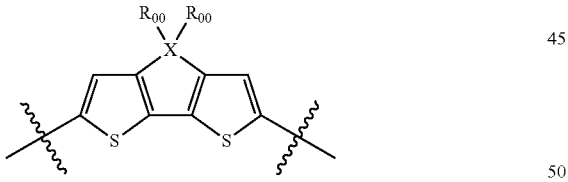

where X is C, Si, or Ge; and each $R_{OO}$, independently, is H or alkyl.

In some embodiments, each A1 and each A2, independently, is selected from the group consisting of:

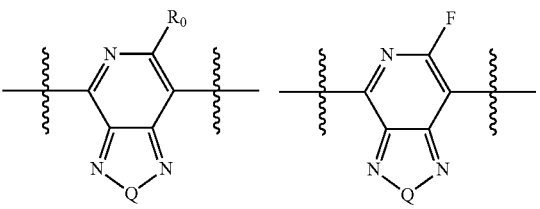

-continued

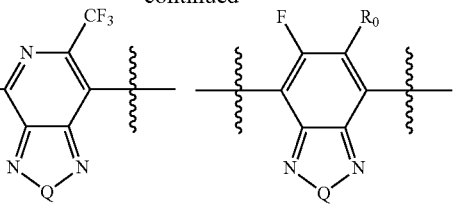

In some embodiments, each n is 0.

In some embodiments, the small molecule compound has the formula:

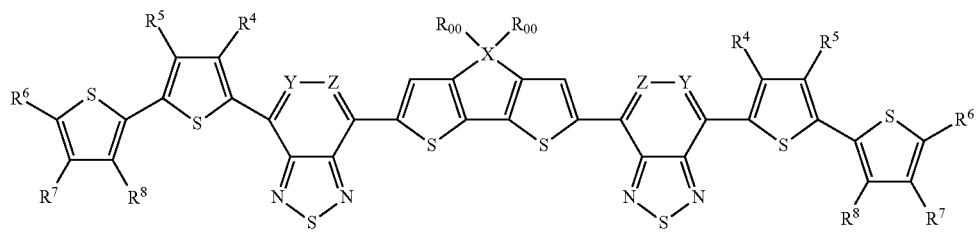

wherein each Y and each Z, independently, is N or $CR^3$;

each $R^3$, independently, is H, F, alkyl, or haloalkyl; and provided that Y-Z is not CH—CH.

In another aspect, a small molecule compound of Formula (II):

$$(T1a)_z\text{-}(T2a\text{-}T2a)_y\text{-}(B1)_x\text{-}(A1)_j\text{-}(B2)_x\text{-}(T2b\text{-}T2b)_y\text{-}(T1b)_z \qquad (II)$$

In Formula (II), each A1, independently, can be selected from the group consisting of

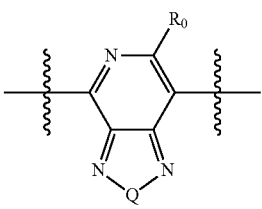

-continued
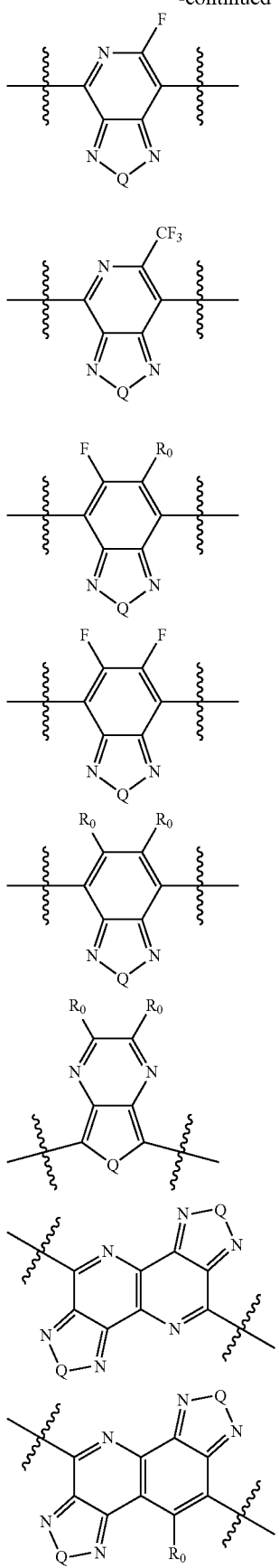
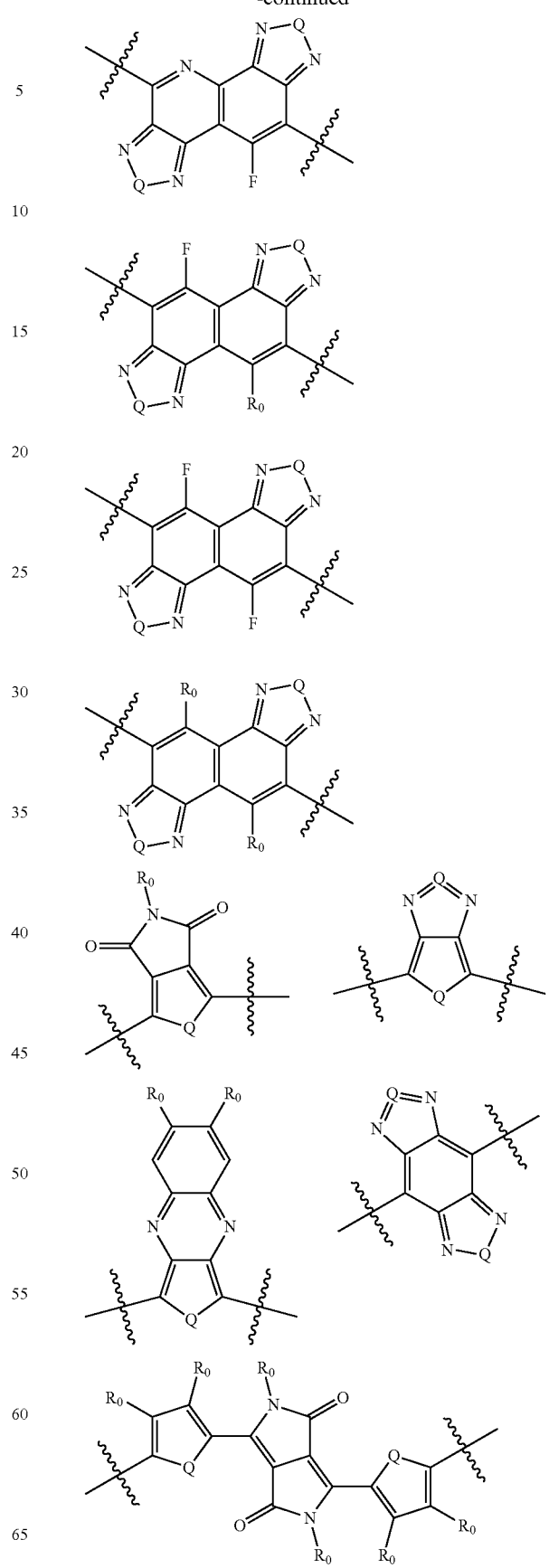

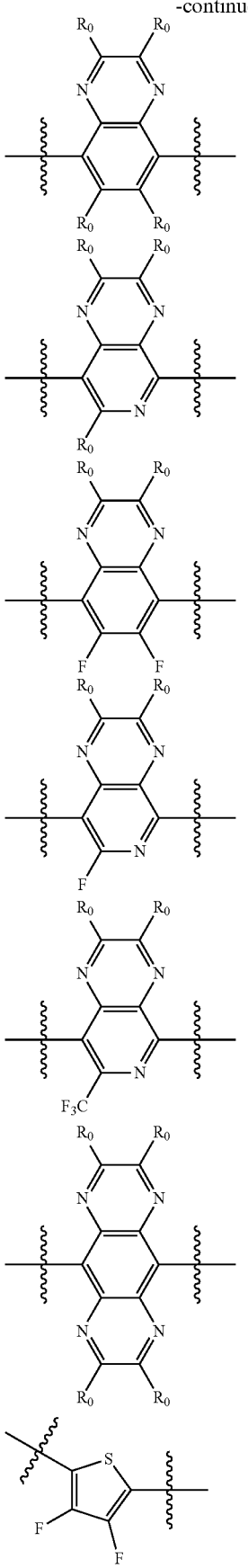

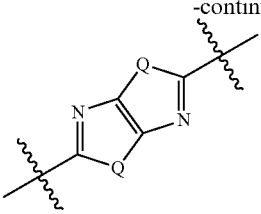

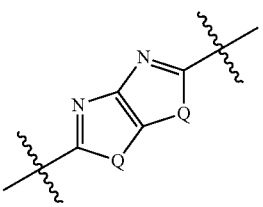

where each Q, independently, can be O or S; and each $R_0$, independently, can be H or alkyl. Each B1 and each B2, independently, is an optionally substituted thiophene. Each T2a and each T2b, independently, can have the formula:

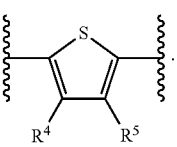

Each T1a and each T1b, independently, can have the formula:

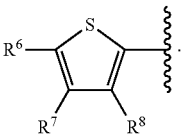

Each $R^4$, $R^5$, $R^6$, $R^7$, and $R^8$, independently, can be H, halo, alkyl, haloalkyl, alkoxy, alkenyl, alkynyl, thioalkyl, —$NHR^9$, —$N(R^9)_2$, aryl, heteroaryl, or acyl. Each $R^9$, independently, can be H, alkyl, or haloalkyl. j can be 1, 2, or 3. Each x, independently, can be 0, 1, or 2. Each y, independently, can be 1 or 2. Each z, independently, can be 0, 1, or 2.

In Formula II, at least one of $R^4$ to $R^8$ is halo or haloalkyl.

In another aspect, a small molecule compound of Formula (III):

$$(E)\text{-}(T2a\text{-}T2a)_y\text{-}(A2)_z\text{-}(P)_x\text{-}(A1)_j\text{-}(P)_x\text{-}(A2)_z\text{-}(T2b\text{-}T2b)_y\text{-}(E) \qquad (III)$$

In Formula (III), each A1 and each A2, independently, can be selected from the group consisting of

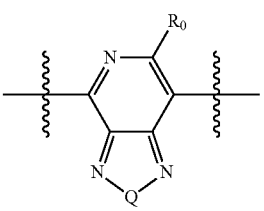

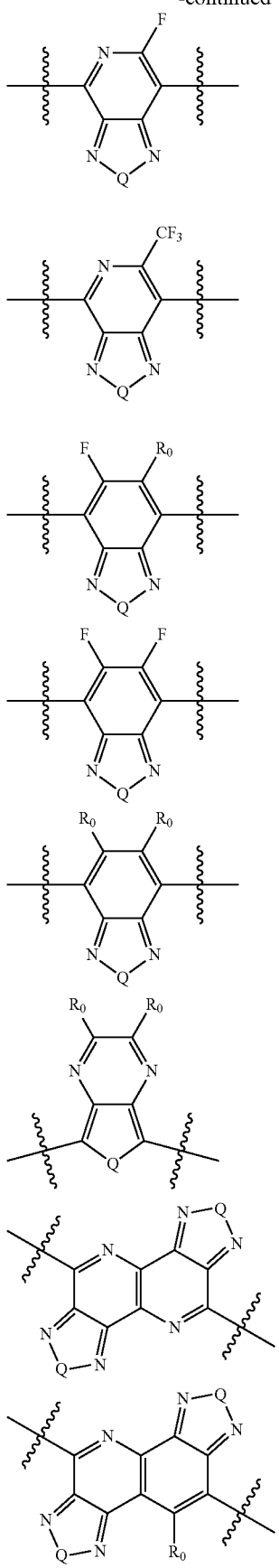
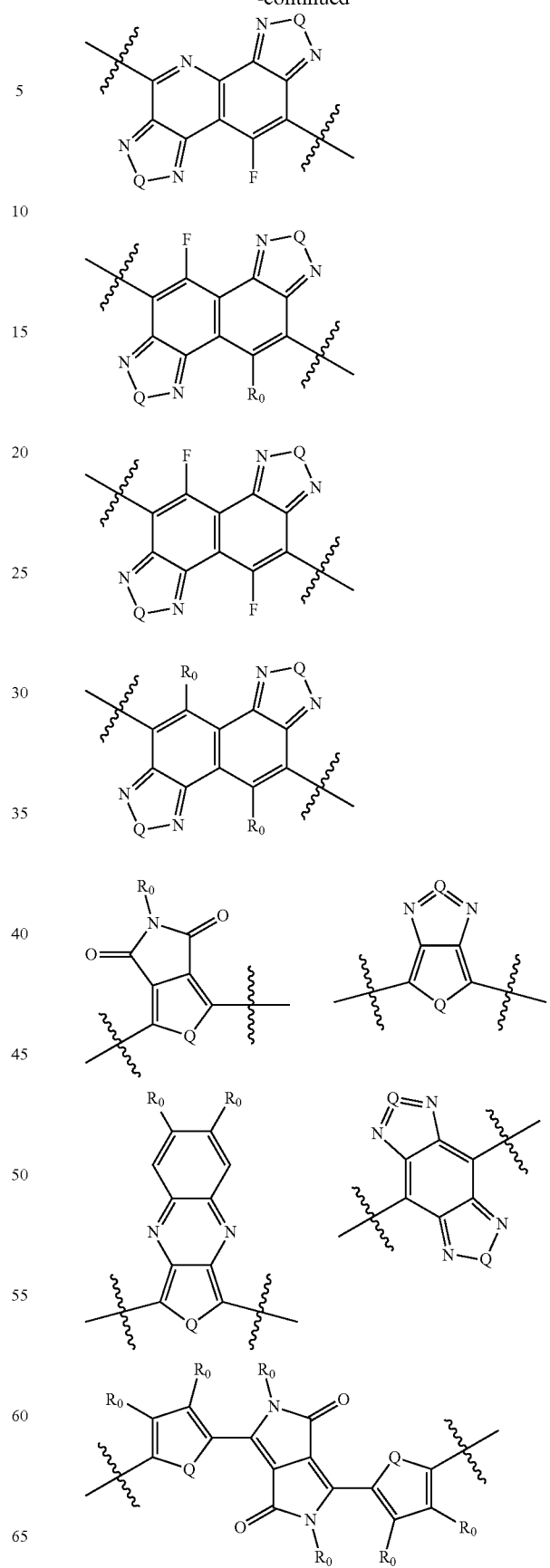

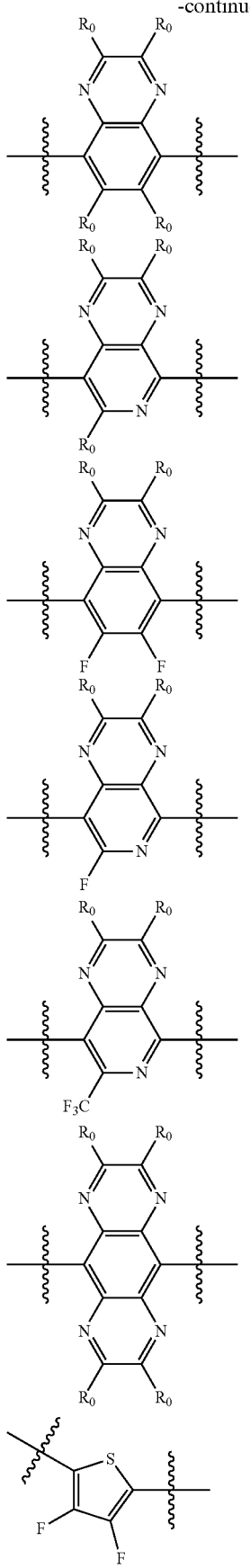
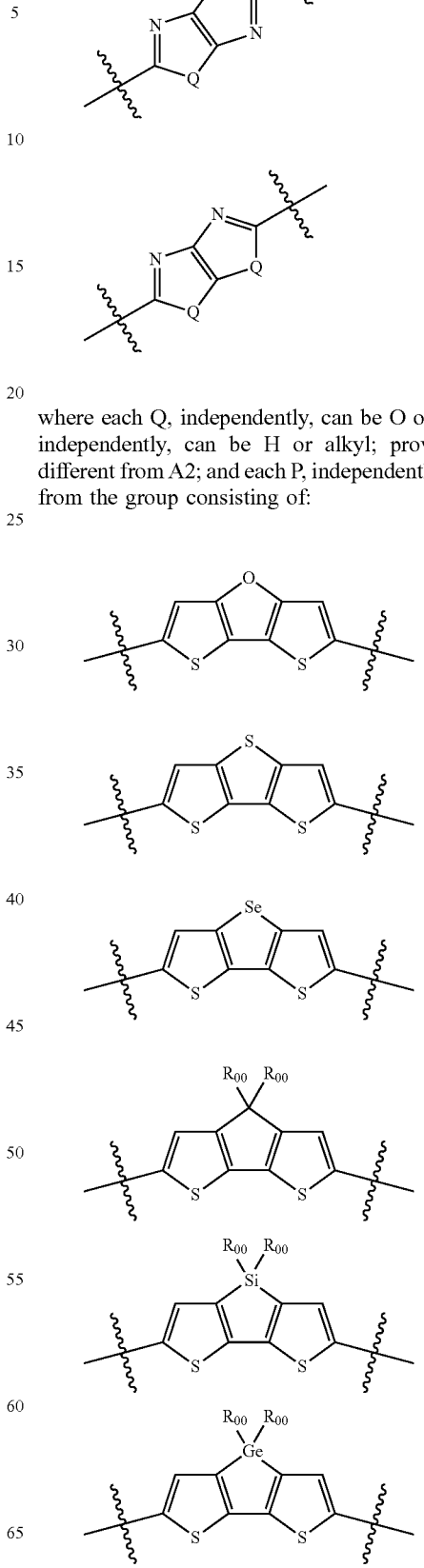
where each Q, independently, can be O or S; and each $R_0$, independently, can be H or alkyl; provided that A1 is different from A2; and each P, independently, can be selected from the group consisting of:

-continued
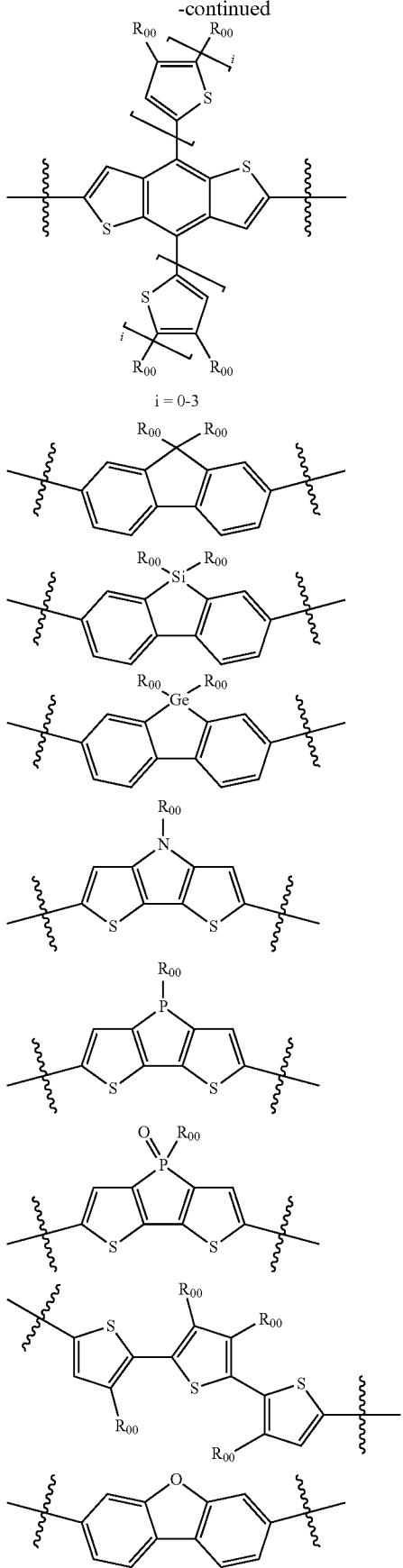
i = 0-3
-continued
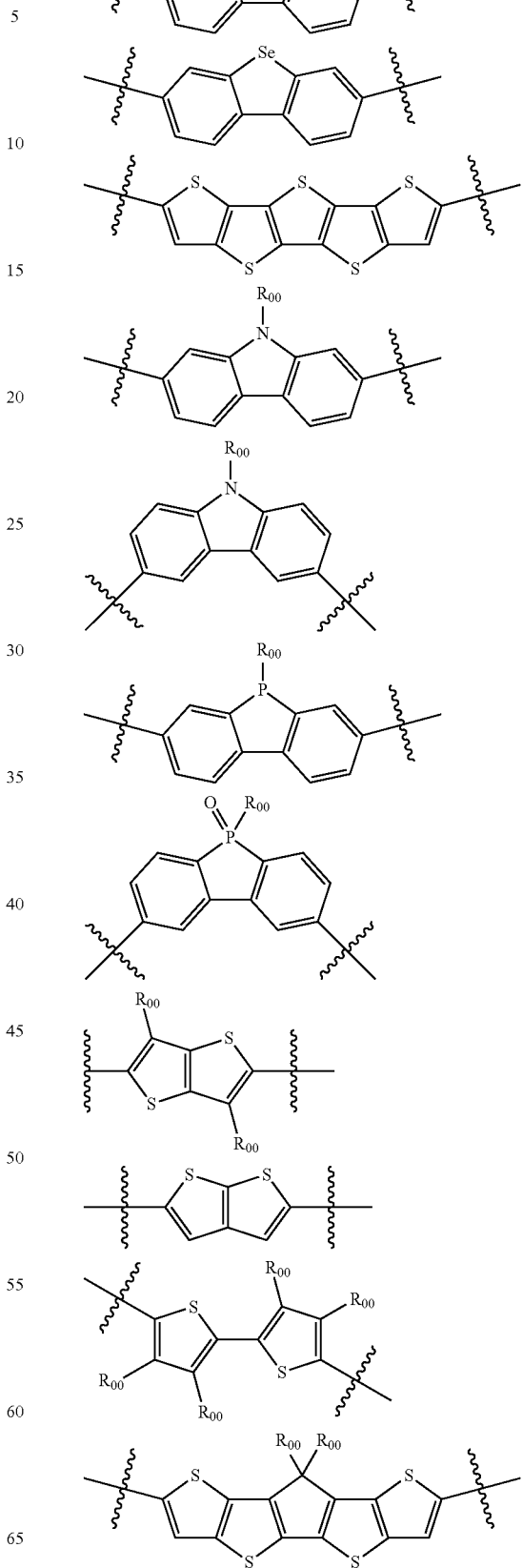

-continued

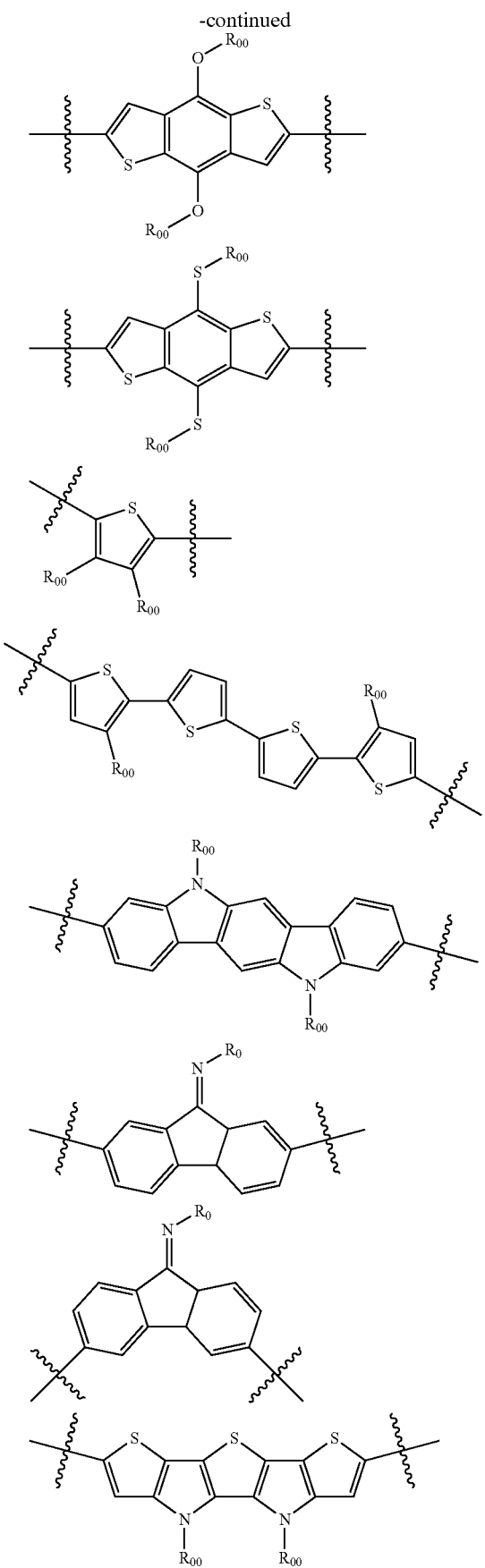

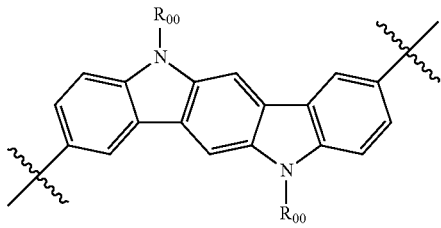

where each $R_{00}$, independently, is H or alkyl; and each i is 0, 1, 2, or 3; and each T2a and each T2b, independently, can have the formula:

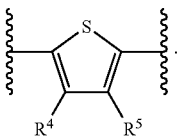

Each $R^4$, and $R^5$, independently, can be H, alkyl, haloalkyl, alkoxy, alkenyl, alkynyl, thioalky, —NHR$^9$, —N(R$^9$)$_2$, aryl, heteroaryl, or acyl. Each $R^9$, independently, can be H, alkyl, or haloalkyl. j can be 1, 2, or 3. Each x, independently, can be 0, 1, or 2. Each y, independently, can be 1 or 2. Each z, independently, can be 0, 1, or 2; and each E independently can be selected from the group consisting of:

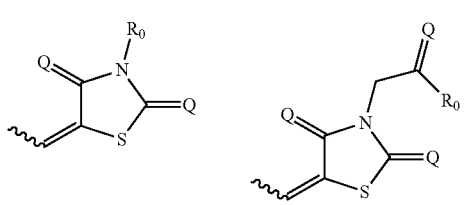

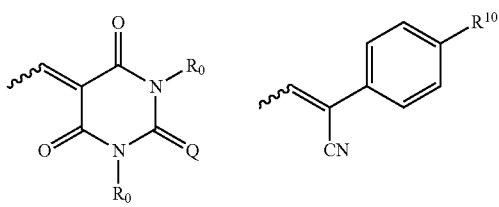

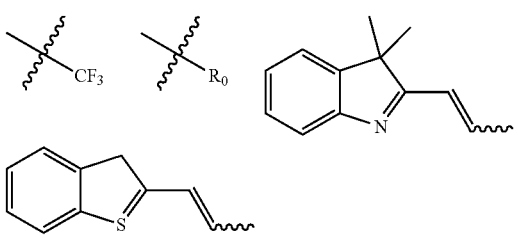

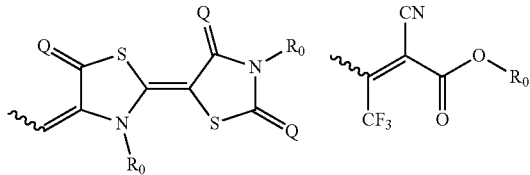

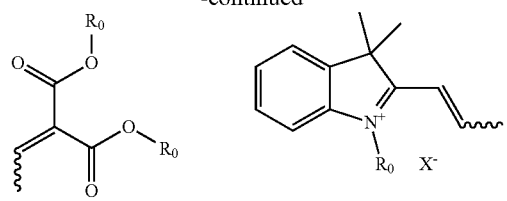
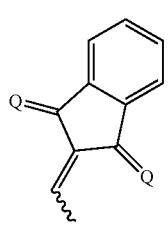
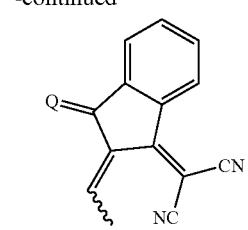
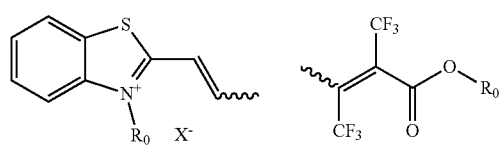
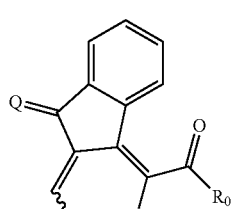
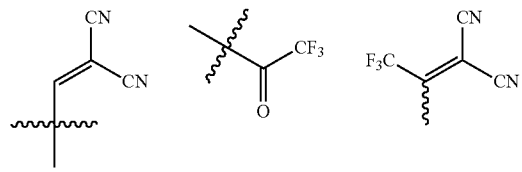
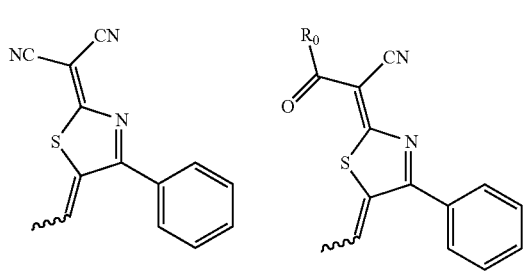
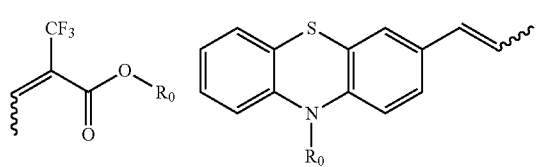
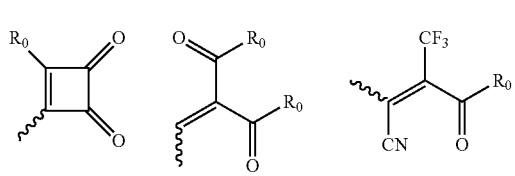
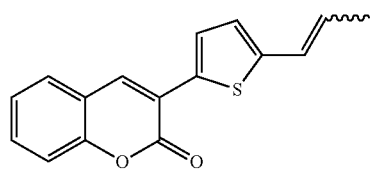
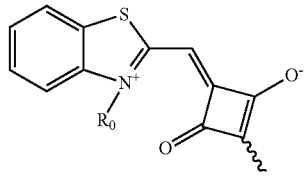
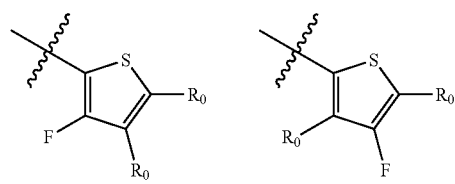
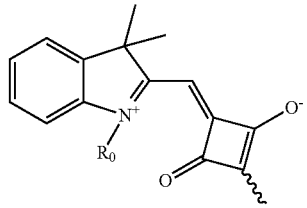
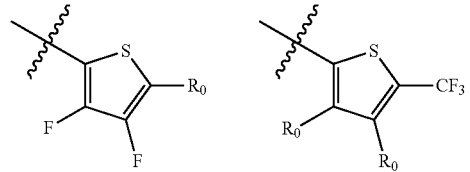
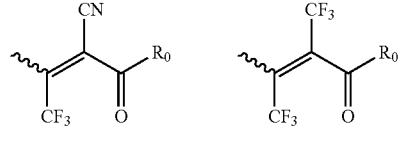
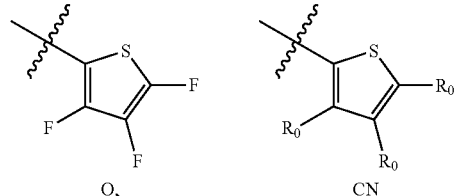
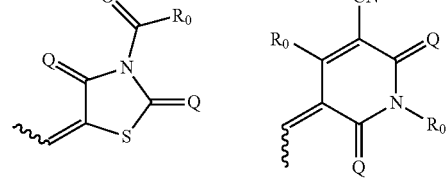
where each Q, independently, can be O or S; each $R_0$, independently, can be H or alkyl; and each $R_{10}$, independently, can be halo, —$NO_2$, —$N_3$, —CN, —$OR_0$, or $R_0$.
In another aspect, a small molecule compound of Formula (IV):
$$(T1a)\text{-}(T2a)_y\text{-}(B1)_x\text{-}A3\text{-}(B2)_x\text{-}(T2b)_y\text{-}(T1b) \qquad (IV)$$

In Formula (IV), each A3, independently, can be selected from the group consisting of
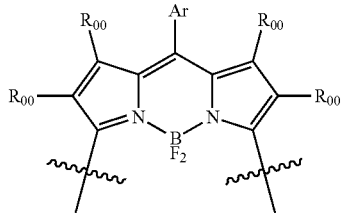
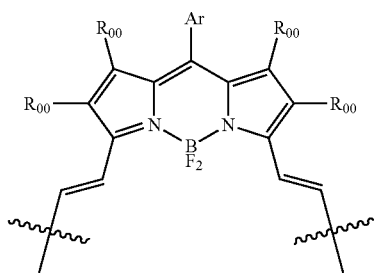
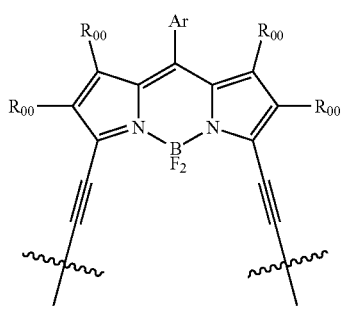
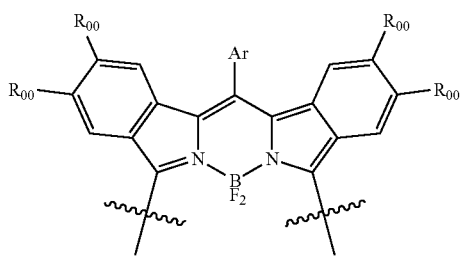
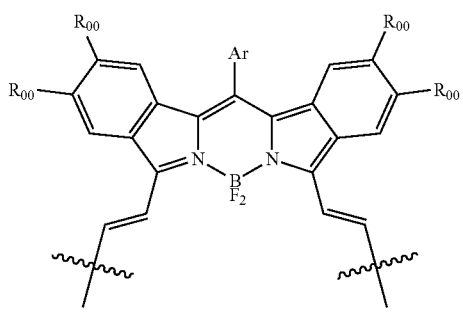
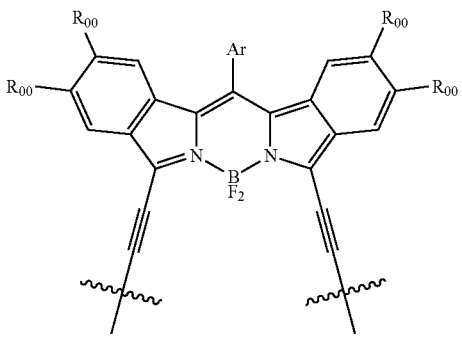
where each $R_{00}$, independently, can be H or alkyl; each Ar, independently, is selected from the group consisting of:
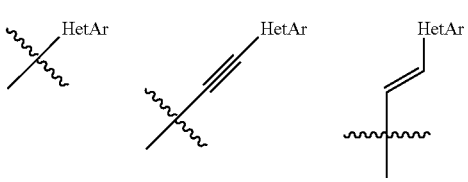
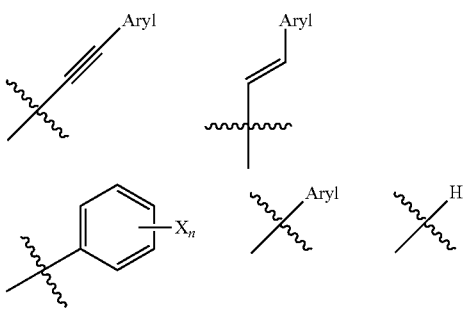
n = 0-5
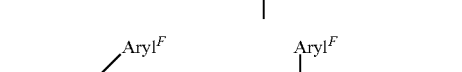
n = 0-5

-continued

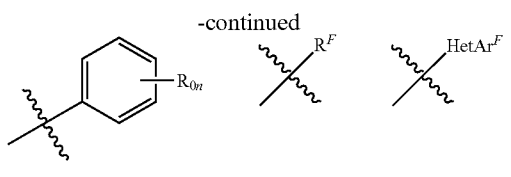

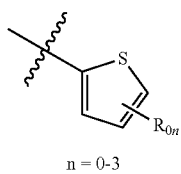
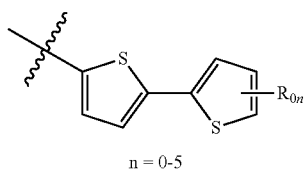

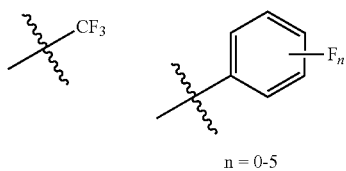

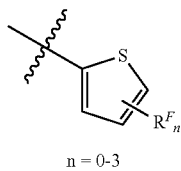
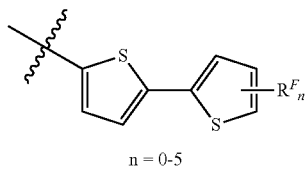

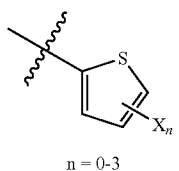
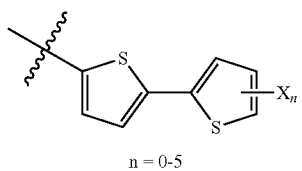

-continued

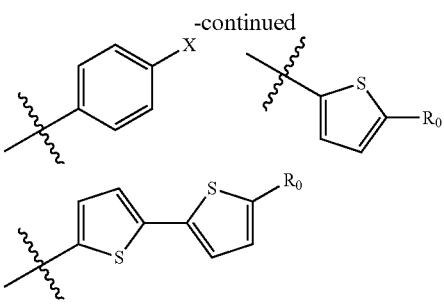

where Aryl=an aryl group;
where HetAryl=a heteroaryl group;
where Aryl$^F$=a fluorinated aryl group;
where HetAryl$^F$=a fluorinated heteroaryl group;
where R$^F$=a fluorinated alkyl group;
where X=F, Cl, Br, I, OR$_0$, SR$_0$, NHR$_0$, NR$_0$R$_0$, or R$_0$;
where R$_0$=H or alkyl;
where each B1 and each B2, independently, can be an optionally substituted thiophene; each T2a and each T2b, independently, can have the formula:

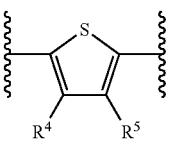

where each T1a and each T1b, independently, can have the formula:

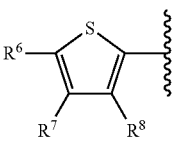

where each R$^4$, R$^5$, R$^6$, R$^7$, and R$^8$, independently, can be H, halo, alkyl, haloalkyl, alkoxy, alkenyl, alkynyl, thioalkyl, —NHR$^9$, —N(R$^9$)$_2$, aryl, heteroaryl, or acyl; each R$^9$, independently, can be H, alkyl, or haloalkyl; each x, independently, can be 0, 1, or 2; each y, independently, can be 1 or 2; and provided that at least one of R$^4$ to R$^8$ can be halo or haloalkyl.

Some examples of compounds according to Formula (I) include:

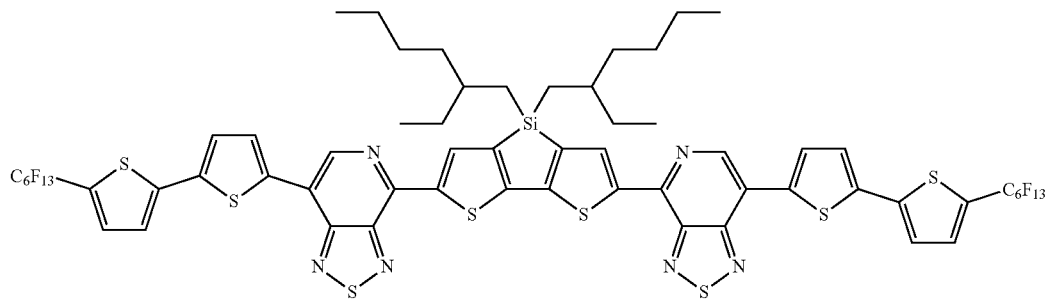

-continued
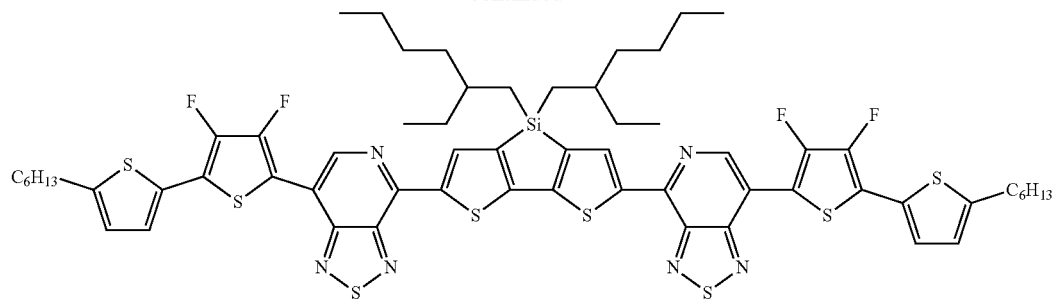
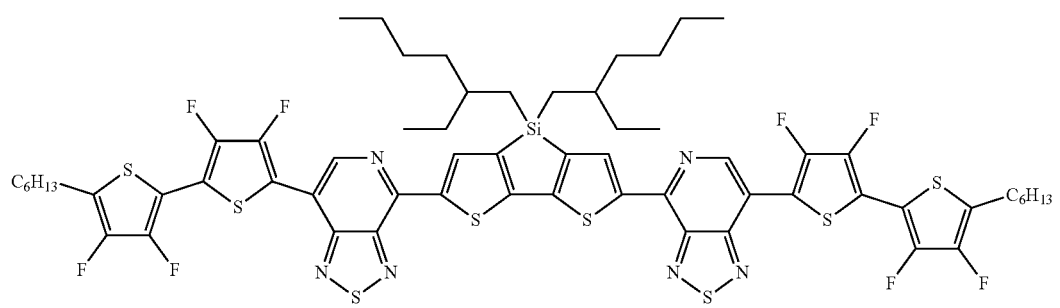
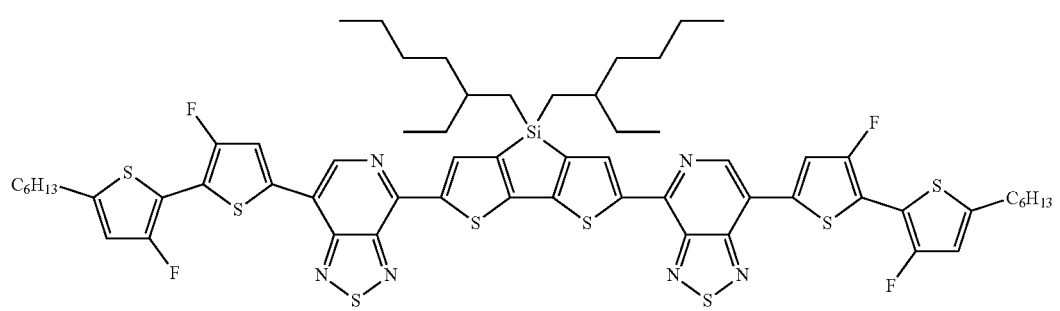
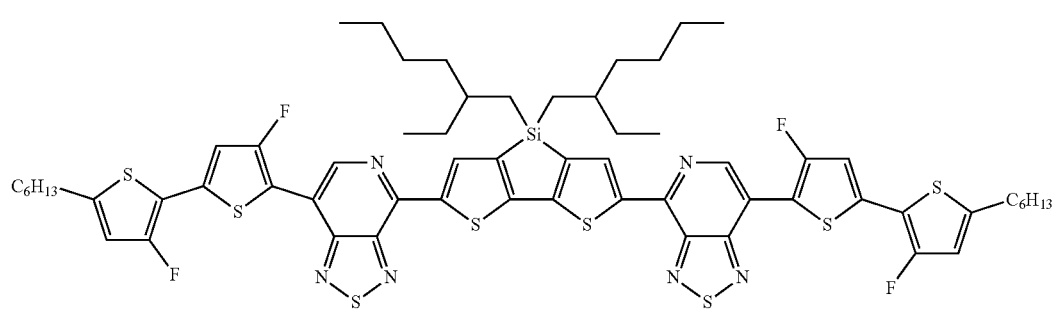
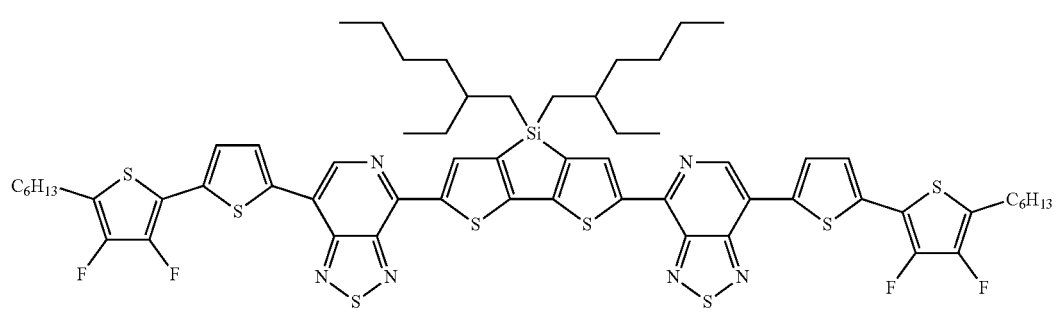

-continued
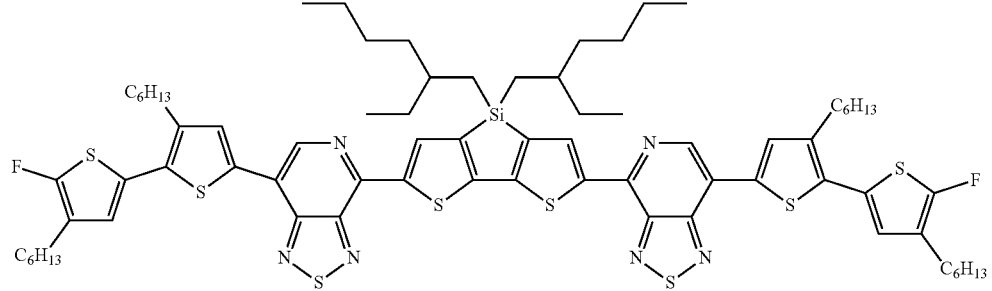
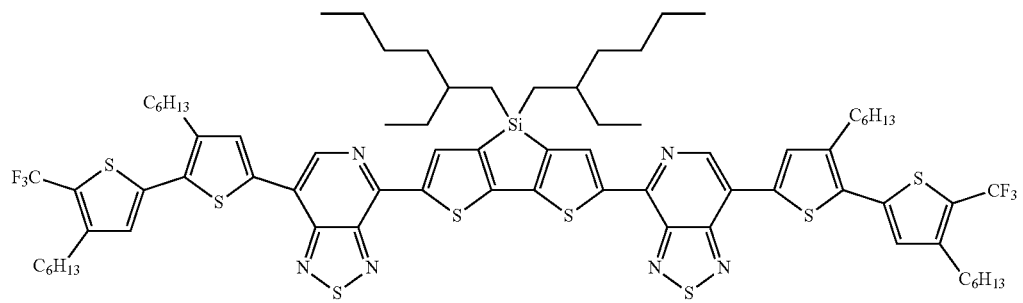
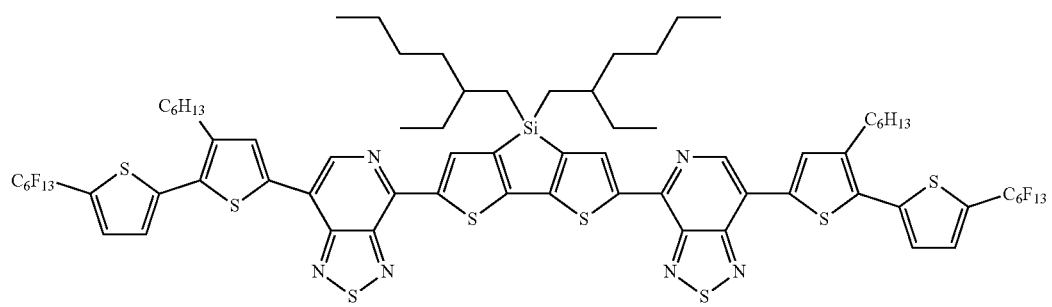
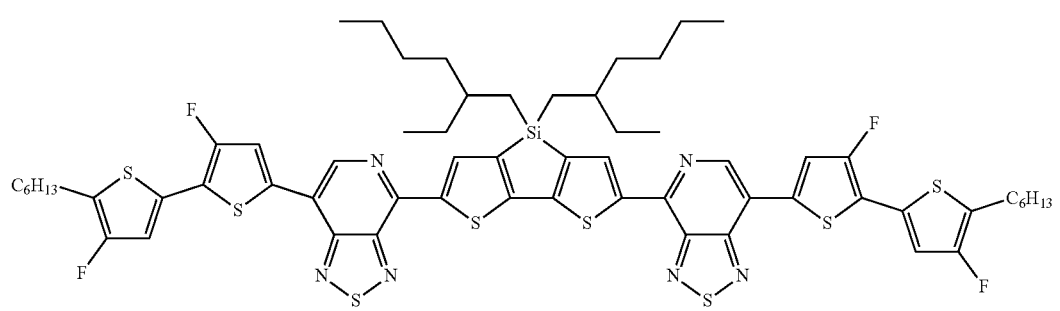
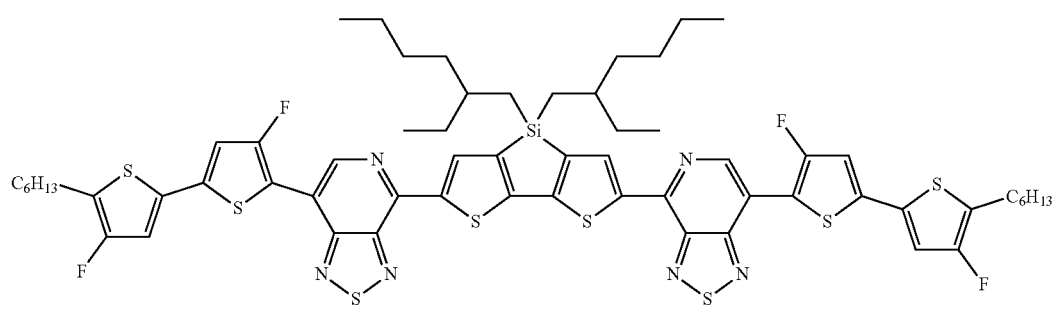

Some additional examples of compounds according to Formula (I) include:

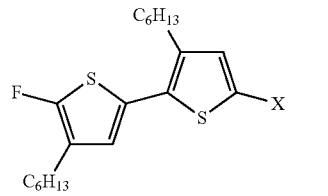

| | R₁ | R₂ | R₃ | R₄ | R₅ |
|---|---|---|---|---|---|
| 1 | H | H | F | F | C₆H₁₃ |
| 2 | F | F | H | H | C₆H₁₃ |
| 3 | H | C₆H₁₃ | H | C₆H₁₃ | CF₃ |
| 4 | H | H | H | F | C₆H₁₃ |

The compounds according to Formula (I) and Formula (II) can be advantageously prepared from fluorinated thiophene precursors. Such precursors include fluorinated dithiophene compounds, such as, for example, compounds selected from:

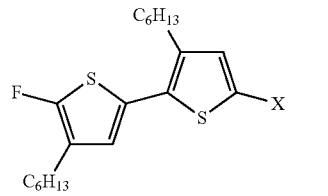

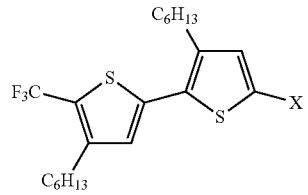

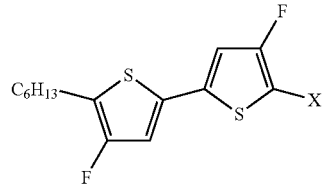

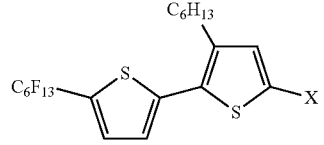

-continued

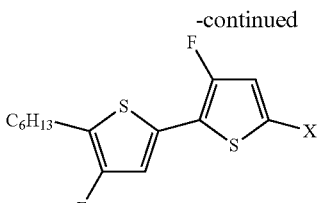

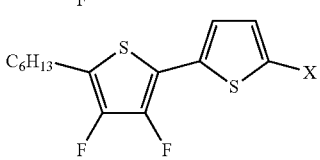

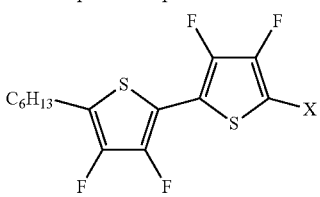

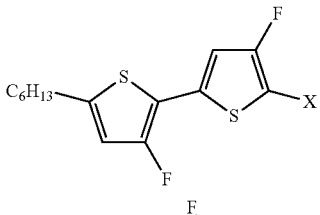

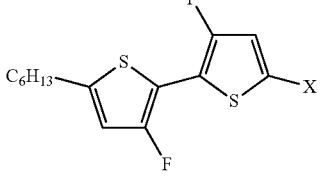

-continued

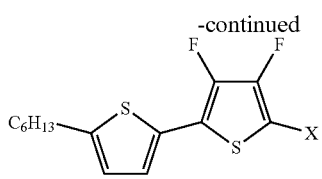

where X is selected from the group consisting of B(OR$_2$), SnR$_3$, and SiR$_3$, and where R is independently alkyl, alkylidene, aryl, or heteroaryl. These dithiophene compounds can be used in coupling reactions to prepare compounds of Formula (I) or Formula (II), or other compounds, e.g., by use in reactions that form a covalent bond between two different ring systems.

These processes for the preparation of compounds of Formula (I) or (II) are generally performed in presence of a solvent. Examples of suitable solvents include but are not limited to hydrocarbons (e.g. toluene), alcohols (e.g. tert-butanol), acetonitrile, tetrahydrofuran, dioxane, dimethylformamide, dimethylacetamide, or mixtures thereof. The processes are usually performed under inert atmosphere, i.e., under an atmosphere which is virtually free of oxygen, and in a solvent which is virtually free of dissolved oxygen. The solvent is usually degassed by passing nitrogen through the reaction mixture or by performing at least one freezing-thawing cycle under vacuum. Other methods for providing solvents that are virtually free of dissolved oxygen are known.

The coupling reactions can advantageously be carried out at a temperature in the range from 0 to 150° C., preferably in the range from 50 to 100° C.

Coupling reactions wherein X is SnR$_3$ are preferably carried out in dehydrated solvents, such as dehydrated dioxane. SnR$_3$ is preferably trialkyltin, for example, tributyltin or trimethyltin. LiCl can be added to the reaction mixture.

Coupling reactions wherein X is SiR$_3$ are preferably carried out in the presence of fluoride ions. Fluoride salts, for example, tetrabutylammonium fluoride, are a suitable source of fluoride ions. Also preferably, SiR$_3$ can be SiMe$_3$, Si(iso-Pr)$_3$ or SiEtCl$_2$.

The coupling reactions are advantageously carried out in the presence of a transition-metal catalyst.

Suitable examples of transition metal catalysts are tris(dibenzylideneacetone)dipalladium(0), Pd(Ph)$_4$, Pd(OAc)$_2$ or PdCl$_2$. Most preferred is Pd(Ph)$_4$.

The coupling reactions can advantageously be carried out in the presence of one or more phosphorus-containing ligands and/or one or more bases. Suitable examples of phosphorus-containing ligands are triphenylphosphine and 2-dicyclohexylphosphino-2',4',6'-triisopropylbiphenyl. Suitable examples for bases are hydroxides, phosphates, alkoxides and carbonates of elements of the group 1 or group 2 elements, e.g., sodium hydroxide, cesium carbonate, potassium phosphate or potassium tert-butoxide. Advantageously, these bases can be used in the form of an aqueous solution, more particularly a solution in water.

The compounds of the present invention may be further isolated, for instance by column chromatography, preferably by high pressure liquid chromatography (HPLC).

EXAMPLES

Dye Compounds
Dye Compound 1, SDT[PT(3)]$_2$

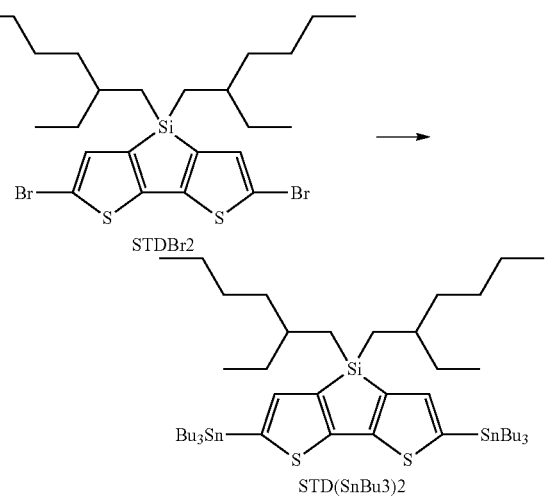

A flask was flushed with nitrogen and charged with SDTBr2 (5 g, 8.9 mmol) and THF (43 ml). The system was cooled down to −78° C. and n-BuLi (7.8 ml of a 2.5 M solution in THF) was added slowly. After stirring for 30 minutes, tributyltinchloride (4.8 ml, 17.8 mmol) was added slowly. The temperature of the system was allowed to come to ambient temperature and the mixture was stirred overnight. The mixture was poured into toluene and washed with water and brine. The obtained organic layer was dried over MgSO$_4$ and the solvent was removed using a rotary evaporator. A green oil (8.9 g, 8.9 mmol) was obtained.

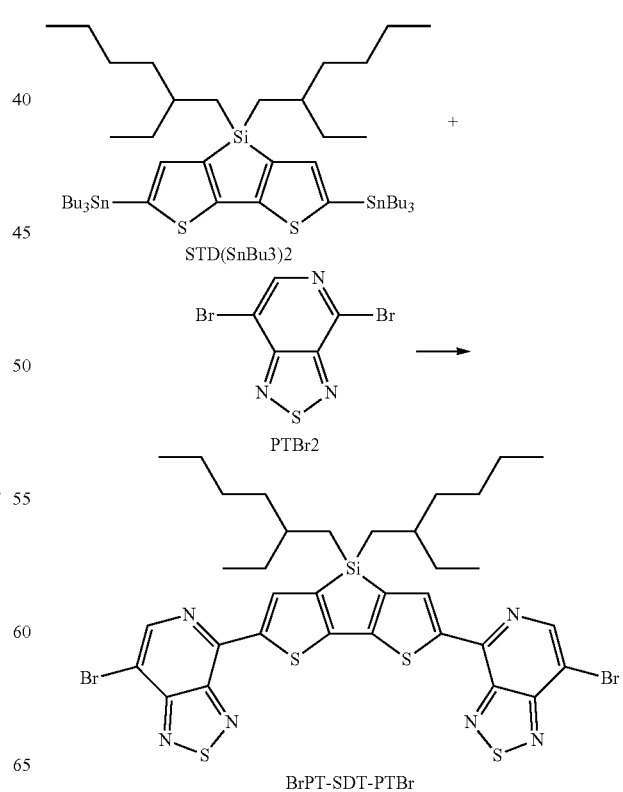

A flask was charged with PTBr2 (5.78 g, 19.6 mmol) and 20 mL toluene and was flushed with nitrogen for 30 minutes. SDT(SnBu₃)₂ (8.87 g, 9 mmol) was dissolved in 25 ml toluene and this mixture was added to the flask. After flushing for another 30 minutes with nitrogen, the catalyst Pd(PPh₃)₄ (0,6 g, 0,54 mmol) was added. The flask got closed and heated to 110° C. in the darkness for two days. After cooling to ambient temperature, the reaction mixture was poured into methanol, filtered and washed with methanol, acetone and hexanes. The collected solid was washed again with hexanes, filtered and the rest of solvent was removed using a rotary evaporator. A green solid was obtained (7.6 g, 9 mmol).

with brine, dried over Na₂SO₄ and evaporated. Having a lower boiling point as the product, all impurities were distilled off under reduced pressure (up to bp 100° C. at 2 mbar). The residue was filtered through silica gel with n-hexane to afford a colorless oil (27.9 g, 80%). MS=294.

3-hexyl-2-(trifluoromethyl)thiophene

A flask with 36.1 g (190 mmol, 2.00 eq) water-free CuI was evacuated and purged with argon several times. A solution of 27.9 g (94.8 mmol, 1.00 eq) 3-hexyl-2-iodothiophene and 24.0 ml (190 mmol, 2.00 eq) methyl 2,2-difluoro-2-fluorosulfonylacetate in 250 ml dimethylforma-

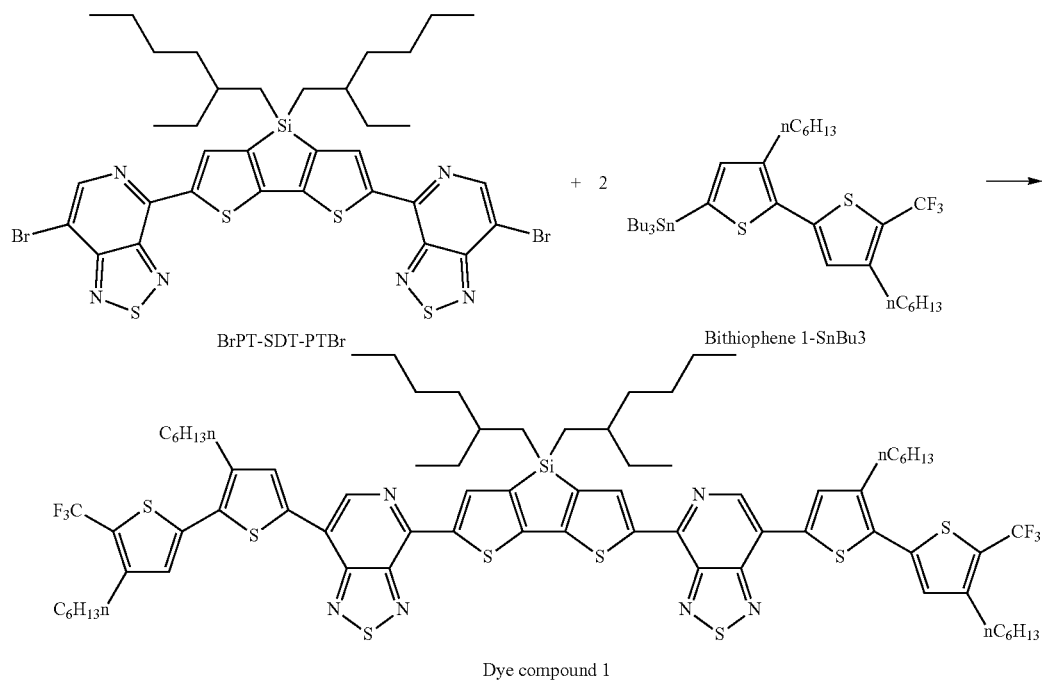

Dye compound 1

A flask was charged with BrPT-SDT-PTBr (0.85 g, 1 mmol), Bithiophene 1—SnBu₃ (1.59 g, 2.3 mmol) and 5 mL toluene and was flushed with nitrogen for 30 minutes. Pd(PPh₃)₄ (0.09 g) was added. The flask was closed and heated to 110° C. in the darkness for two days. After cooling to ambient temperature, the reaction mixture was poured into methanol, filtered and washed with methanol, acetone and hexanes. The resulting solid was washed again with hexanes, filtered and the rest of the solvent was removed using a rotary evaporator to yield 1.5 g (1.0 mmol) of Dye Compound 1, SDT[PT(3)]₂.

Bithiophene 1—SnBu₃
3-hexyl-2-iodo-thiophene 26.7 g (178 mmol, 1.50 eq) sodium iodide was dissolved in a mixture of AcOH (150 ml) and acetonitrile (150 ml) and cooled down with an ice bath. To this solution, 19.0 g (143 mmol, 1.20 eq) N-chlorosuccinimide were added in one portion and stirring continued for 15 min. Next, 20.0 g (118 mmol, 1.00 eq) 3-hexyl-thiophene were added, the reaction mixture stirred for 15 min. under ice-cooling and 4 h at room temperature. The solution was quenched with saturated Na₂S₂O₃-sol. and extracted with MTBE (methyl tert-butyl-ether). The organic layer was washed once again with Na₂S₂O₃-sol., three times with 1 M NaOH solution and once mide DMF was added and the reaction mixture stirred at 90° C. for 24 h. 6.00 ml (47.4 mmol, 0.50 eq) methyl-2,2-difluoro-2-fluorosulfonylacetate was added and stirring continued for another day at 90° C. After cooling down to room temperature the reaction mixture was diluted with water and MTBE and filtered. The organic layer was washed once with water and twice with brine, dried over Na₂SO₄ and the solvent removed under reduced pressure. The residue was purified by distillation to obtain a colourless oil (14.9 g, 63%, bp: 75-78° C. at 3 mbar).

2-[4-hexyl-5-(trifluoromethyl-2-thienyl]-4,4,5,5-tetramethyl-1,3,2-dioxaborolane A solution of 13.8 g (58.4 mmol, 1.00 eq) 3-hexyl-2-(trifluoromethyl)thiophene was cooled down to −78° C. and 25.7 ml (64.3 mmol, 1.10 eg, 2.50 mol/l) n-BuLi was added dropwise. After 30 min, 13.1 g (70.1 mmol, 1.20 eq) 2-isopropoxy-4,4,5,5-tetramethyl-1,3,2-dioxaborolane was added and stirring continued for 30 min. The cooling bath was removed and the reaction mixture stirred over night at room temperature. It was quenched with water and extracted three times with EtOAc. The combined organic layers were dried over Na₂SO₄ and evaporated. The crude product was purified by column chromatography (dichloromethane/n-hexane 1:4). A pale yellow oil was obtained (11.6 g, 55%). MS=362.3-hexyl-5-(3-hexyl-2-thienyl)-2-(trifluoromethyl) thiophene.

7.90 g (32.0 mmol, 1.00 eq) 2-bromo-3-hexyl-thiophene, 11.6 g (32.0 mmol, 1.00 eq) 2-[4-hexyl-5-(trifluoro-methyl)-2-thienyl]-4,4,5,5-tetramethyl-1,3,2-dioxaborolane and 11.1 g (80.1 mmol, 2.50 eq) $K_2CO_3$ were dissolved in a mixture of THF (100 ml) and water (100 ml). This solution was degassed with argon prior to the addition of 1.10 g (1.60 mmol, 0.05 eq) $PdCl_2(PPh_3)_2$ and stirred over night at 50° C. The reaction mixture was diluted with MTBE, washed twice with water and once with brine, dried over $Na_2SO_4$ and the solvents removed under reduced pressure. The residue was filtered through silica gel with n-hexane. All impurities with a lower boiling point were removed by kugelrohr distillation to afford a colourless oil (5.48 g, 43%). MS=402.

Bithiophene 1—SnBu₃

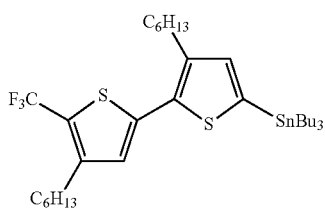

Bithiophene 1- SnBu3

A flask was flushed with nitrogen and charged with 3,4'-dihexyl-5'-(trifluoromethyl)-2,2'-bithiophene (1.21 g, 3 mmol) and 15 ml THF. The system was cooled down to 0° C. and then, 7.5 ml lithium diisopropylamine (0.5 M in THF) was slowly added dropwise. After stirring for 1 hour, SnBu₃Cl (0.95 ml, 3.75 mmol) was added dropwise. The reaction mixture was poured into hexane, washed with water and the resulting organic layer was dried over MgSO₄. The solvent was removed on a rotary evaporator. A yellow, brown liquid was obtained (1.76 g, 85%).

Employing techniques similar to those described above, additional tin reagents, such as those shown, can readily be prepared by one skilled in the art.

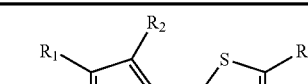

| | $R_1$ | $R_2$ | $R_3$ | $R_4$ | $R_5$ |
|---|---|---|---|---|---|
| 1 | H | H | F | F | $C_6H_{13}$ |
| 2 | F | F | H | H | $C_6H_{13}$ |
| 3 | H | $C_6H_{13}$ | H | $C_6H_{13}$ | $CF_3$ |
| 4 | H | H | H | F | $C_6H_{13}$ |

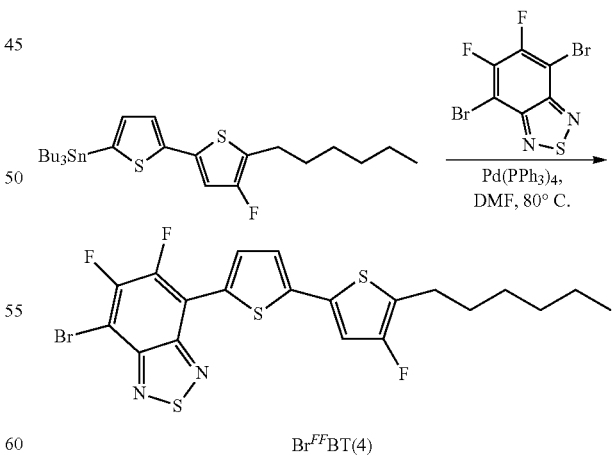

BrFBT(X)
X = 1-4

| | $R_1$ | $R_2$ | $R_3$ | $R_4$ | $R_5$ |
|---|---|---|---|---|---|
| 1 | H | H | F | F | $C_6H_{13}$ |
| 2 | F | F | H | H | $C_6H_{13}$ |
| 3 | H | $C_6H_{13}$ | H | $C_6H_{13}$ | $CF_3$ |
| 4 | H | H | H | F | $C_6H_{13}$ |

Br$^F$BT(1)
$^1$H NMR (600 MHz, CDCl₃) δ=8.05 (d, J=4 Hz, 1H), 7.70 (d, J=12 Hz, 1H), 7.27 (d, J=4 Hz, 1H), 2.73 (t, J=4 Hz, 2H), 1.67 (m, 2H), 1.45-1.3 (m, 6H), 0.90 (m, 3H); $^{19}$F NMR (376 MHz, CDCl₃) δ=−103 (d, J=11 Hz, 1F), −133 (d, J=11 Hz, 1F), −140 (d, J=11 Hz, 1F).

Br$^F$BT(2)
$^1$H NMR (600 MHz, CDCl₃) δ=8.02 (d, J=4 Hz, 1H), 7.68 (d, J=10 Hz, 1H), 7.19 (d, J=4 Hz, 1H), 6.96 (s, 1H), 2.74 (t, J=8 Hz, 2H), 1.66 (m, 2H), 1.44-1.28 (m, 6H), 0.90 (m, 3H).

Br$^F$BT(4)
$^1$H NMR (500 MHz, CDCl₃) δ=8.01 (dd, J=10 Hz, J=1 Hz, 1H), 7.23 (d, J=4 Hz, 1H), 6.78 (d, J=4 Hz, 1H), 2.84 (t, J=7 Hz, 2H), 1.71 (p, J=8 Hz, 2H), 1.44-1.29 (m, 6H), 0.90 (m, 3H).

Br$^{FF}$BT(4)

Br$^{FF}$BT(4)
$^1$H NMR (500 MHz, CDCl₃) δ=8.16 (d, J=4 Hz, 1H), 7.22 (d, J=4 Hz, 1H), 6.97 (s, 1H), 2.74 (t, 7 Hz, 2H), 1.66 (m, 2H), 1.4-1.2 (m, 6H), 0.91 (m, 3H); $^{19}$F NMR (376 MHz, CDCl₃) δ=−120.3 (d, J=18 Hz, 1F), −126.5 (d, J=18 Hz, 1F), −132 (s, 1F).

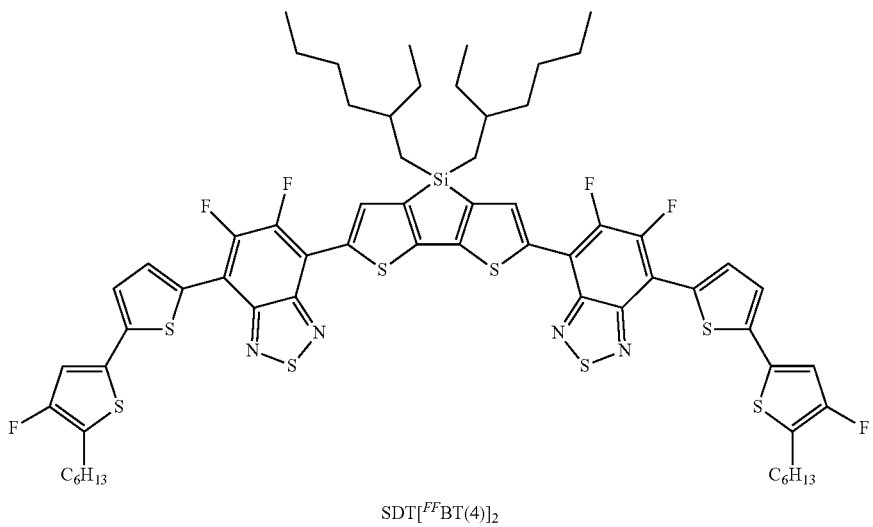

SDT[$^{FF}$BT(4)]$_2$

SDT[$^{FF}$BT(4)]$_2$
$^1$H NMR (400 MHz, CDCl$_3$) δ=8.27 (t, J=4 Hz, 2H), 7.89 (m, 2H), 6.95 (d, 2H), 6.75 (s, 2H), 2.62 (t, J=8 Hz, 4H), 1.63 (m, 4H), 1.49-1.25 (m, 30H), 1.13 (m, 4H), 0.91 (m, 18H); $^{19}$F NMR (376 MHz, CDCl$_3$) δ=−127.4 (s, br, 4F), −132.4 (s, 2F).

(m, 18H); $^{19}$F NMR (376 MHz, CDCl$_3$) δ=−107 (m, 2F), −133 (d, J=15 Hz, 2F), −140 (d, J=15 Hz, 2F); MS-FD (m/z) 1290.25 (M$^+$), 645.14 (M$^{2+}$)

SDT[$^F$BT(4)]$_2$
$^1$H NMR (400 MHz, CDCl$_3$) δ=8.34 (t, J=4 Hz, 2H), 7.98 (d, J=4 Hz, 2H), 7.71 (d, J=12 Hz, 2H), 7.18 (d, J=4 Hz, 2H),

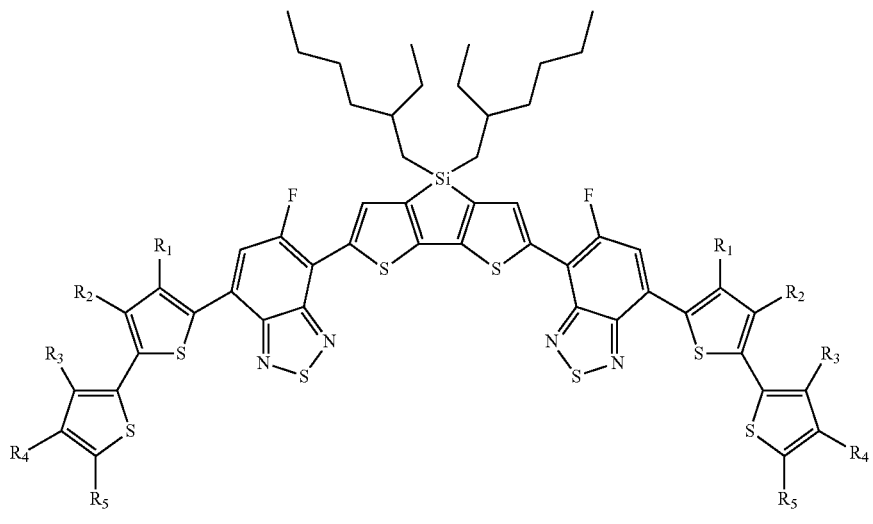

| | R$_1$ | R$_2$ | R$_3$ | R$_4$ | R$_5$ |
|---|---|---|---|---|---|
| 1 | H | H | F | F | C$_6$H$_{13}$ |
| 2 | F | F | H | H | C$_6$H$_{13}$ |
| 3 | H | C$_6$H$_{13}$ | H | C$_6$H$_{13}$ | CF$_3$ |
| 4 | H | H | H | F | C$_6$H$_{13}$ |

SDT[$^F$BT(1)]$_2$
$^1$H NMR (400 MHz, CDCl$_3$) δ=8.35 (m, 2H), 8.05 (d, J=4 Hz, 2H), 7.75 (d, J=12 Hz, 2H), 7.27 (d, J=4 Hz, 2H), 2.74 (t, J=8 Hz, 4H), 1.66 (m, 4H), 1.43-1.01 (m, 34H), 0.95-0.75 6.93 (s, 2H), 2.73 (t, J=8 Hz, 2H), 1.66 (p, J=7 Hz, 4H), 1.45-1.04 (m, 34H), 0.91 (m, 6H), 0.83 (m, 12H); $^{19}$F NMR (376 MHz, CDCl$_3$) δ=−107 (q, J=16 Hz), −132 (s). MS-FD (m/z) 1254.27 (M$^+$), 627.15 (M$^{2+}$).

Dye Compound, 4-bromo-BODIPY-(2)
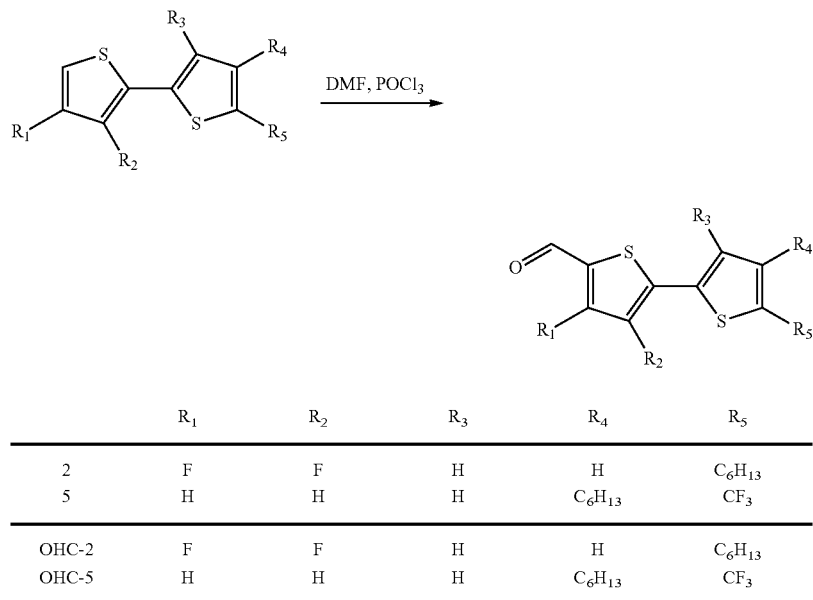
| | R₁ | R₂ | R₃ | R₄ | R₅ |
|---|---|---|---|---|---|
| 2 | F | F | H | H | C$_6$H$_{13}$ |
| 5 | H | H | H | C$_6$H$_{13}$ | CF$_3$ |
| OHC-2 | F | F | H | H | C$_6$H$_{13}$ |
| OHC-5 | H | H | H | C$_6$H$_{13}$ | CF$_3$ |
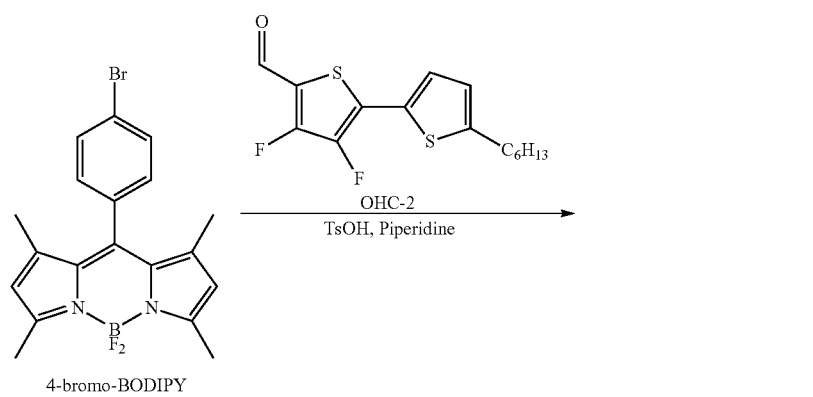
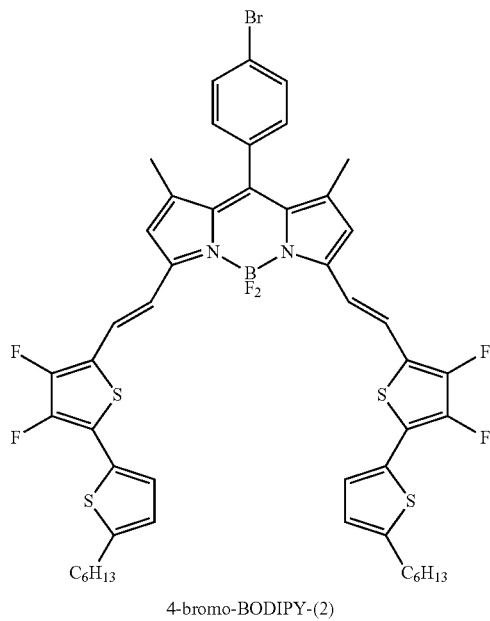

3,4-difluoro-5'-hexyl-[2,2'-bithiophene]-5-carbaldehyde (OHC-2)

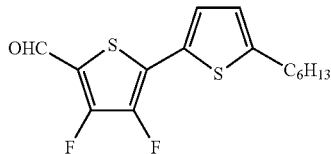

In a flame dried flask equipped with an addition funnel, 3,4-difluoro-5'-hexyl-2,2'-bithiophene [2] (8.5 g, 29.7 mmol) was dissolved in dry 1,2-dichloroethane (150 mL) and cooled to 0° C. The Vilsmeier reagent was prepared by adding POCl$_3$ (5.46 g, 35.6 mmol, 3.32 mL) to DMF (3.3 g, 45 mmol, 3.43 mL) and the orange solution was added dropwise via addition funnel. The reaction was then heated at 80° C. for 20 hours. After cooling to room temperature, the reaction was neutralized with saturated NaHCO$_3$. The aqueous portion was extracted with DCM (3×100 mL) and the combined organics were washed with water and brine, dried over Na$_2$SO$_4$, and concentrated in vacuo to give the crude product, which was further purified by chromatography on silica gel (2% EtOAc/hexanes) to furnish a yellow solid (6.53 g, 20.8 mmol, 70% yield). $^1$H NMR (600 MHz, CDCl$_3$) δ=9.98 (s, 1H), 7.29 (d, J=3.6 Hz, 1H), 6.80 (d, J=3.6 Hz, 1H), 2.84 (t, J=7.5 Hz, 2H), 1.70 (quint, J=7.2 Hz, 2H), 1.40-1.29 (m, 6H), 0.89 (t, J=6.6 Hz, 3H); $^{19}$F NMR (400 MHz, CDCl$_3$) δ=−127.02 (s, 2F).

4'-hexyl-5'-(trifluoromethyl)-[2,2'-bithiophene]-5-carbaldehyde (OHC-5)

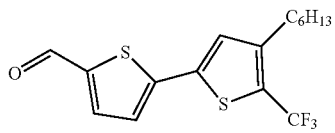

OHC-5 was prepared in an analogous fashion to that reported for OHC-2. $^1$H NMR (400 MHz, CDCl$_3$) δ=9.89 (s, 1H), 7.69 (d, J=4 Hz, 1H), 7.28 (d, J=4 Hz, 1H), 7.16 (m, 1H), 2.71 (t, J=8 Hz, 2H), 1.63 (p, J=7 Hz, 2H), 1.42-1.27 (m, 6H), 0.89 (m, 3H); $^{19}$F NMP (376 MHz, CDCl$_3$) δ=−53.8.

General BODYIPY Synthesis

To a stirring solution of appropriately substituted pyrrole (5 g, 52 mmol) dissolved in DCM (100 mL) at 40° C. was added an acid chloride (heptanoyl, benzoyl, etc) (25 mmol) dropwise. Once the addition was complete the reaction was allowed to stir until it was deep red in colour (1-18 hours). At this time the reaction mixture was cooled to room temperature and treated with Hunig's base (75 mmol) at a rate that prevented excessive boiling of the solvent. After stirring for 30 minutes the (now pale) reaction was treated with BF$_3$OEt$_2$ and heated at 30° C. overnight. The next day the reaction mixture was diluted with DCM and washed repeatedly with water before drying with MgSO$_4$ and concentrating in vacuo. The crude material was then dissolved in DCM and passed through a plug of SiO$_2$ (eluting with DCM) and the red band with yellow/green emission was collected. Further purification was performed using flash column chromatography 20-60% DCM in hexane.

4-bromo-BODIPY

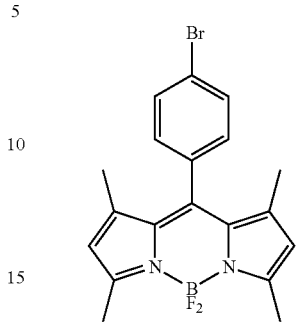

The above compound was prepared according to the general BODIPY synthesis described above using 2,4-dimethyl-pyrrole, and 4-bromobenzoyl chloride. $^1$H NMR (400 MHz, CDCl$_3$) δ=7.64 (d, J=8 Hz, 2H), 7.18 (d, J=8 Hz, 2H), 5.99 (s, 2H), 2.55 (s, 6H), 1.41 (s, 6H).

4-Bromo-BODIPY-(2)

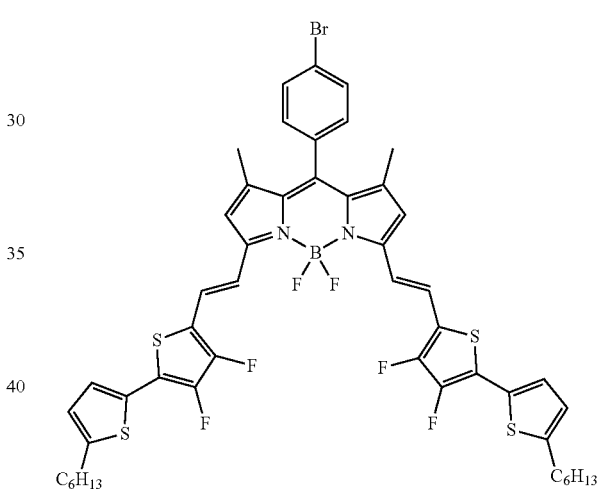

4-bromo-BODIPY (0.412 g, 1.02 mmol), 3,4-difluoro-5'-hexyl-[2,2'-bithiophene]-5-carbaldehyde [OHC-2] (0.71 g, 2.25 mmol), p-toluenesulfonic acid monohydrate (0.1 g, 0.5 mmol) were dissolved in toluene (10 mL). Piperidine (1 mL) was added and the solution heated to 120° C. The reaction was monitored by UV/Vis and was stopped after the consumption of the starting material. After cooling, the solution was passed through a short silica plug, eluting with toluene. The solvent was evaporated and the crude material was fused to silica gel (10 g) and purified by flash chromatography (35% DCM/hexanes). The DCM was removed by rotary evaporation and the resultant solids were collected by gravity filtration, washed with hexanes and acetone, then dried in vacuo to yield the final product as a purple solid (350 mg, 0.35 mmol, 34% yield). $^1$H NMR (600 MHz, CDCl$_3$) δ=7.65 (d, J=8.3 Hz, 2H), 7.43 (s, 4H), 7.23 (d, J=8.3 Hz, 2H), 7.13 (d, J=3.6 Hz, 2H), 6.74 (d, J=3.4 Hz, 2H), 6.59 (s, 2H), 2.83 (t, J=7.4 Hz, 4H), 1.75-1.61 (m, 8H), 1.45 (s, 6H), 1.43-1.31 (m, 8H), 0.90 (t, J=6.8 Hz, 6H). $^{19}$F NMR (376 MHz, CDCl$_3$) δ=−125.96 (s, 1F), −138.84 (q, J=34 Hz, 1F). $^{11}$B NMR (128 MHz, CDCl$_3$) δ=1.14 (t, J=34 Hz, 1B).

Device Fabrication and Measurements

The small molecule dyes described are useful in organic solar cell applications. The bulk heterojunction (BHJ) device structure was utilized to show the applicability of the dyes, although other device structures can be used. In the fabricated BHJ devices the photoactive layer includes a blended film of the small molecule dye manufactured and an electron deficient/accepting molecule or polymer. As examples, the BHJ devices consisted of blended films with {6,6}-phenyl C71 butyric acid methyl ester (PC$_{70}$BM) acceptors.

A typical BHJ device structure includes the photoactive layer sandwiched between interfacial/transport layers to facilitate charge extraction and two conductive charge collecting electrodes, one of which is transparent. The devices fabricated were composed of the following layers; glass/ITO/PEDOT:PSS or MoOx/BHJ/ZnO-np/Al, where ITO is indium tin oxide, PEDOT:PSS is poly(3,4-ethylenedioxythiophene)-poly(styrenesulfonate), MoOx is molybdenum trioxide, ZnO-np is zinc oxide nanoparticles and Al is aluminum.

Films for devices were prepared on patterned ITO-coated glass substrates (Thin Film Devices Inc.) and served as the bottom transparent charge-collecting electrode. The ITO substrates were cleaned by sonication in a soap solution, acetone, isopropanol followed drying with a nitrogen gas flow and baking in an oven. Cleaned ITO substrates were exposed to a UV-ozone treatment for >30 min. and immediately used for either a 25 nm spin coated PEDOT:PSS (Clevious P VP AL 4083) layer or a 15 nm vacuum thermal deposited MoO$_3$ (99.98%, Sigma-Aldrich) layer.

The following BHJ films were prepared from ≥40 mg/ml chlorobenzene (CB) or o-xylene stock solutions of donor compounds and PC$_{71}$BM (Solenne Inc.) depending on the small molecule dye used. Stock solutions were mixed at various ratios and addition of high boiling additives to make the appropriate BHJ solutions. Filtered (0.45 μm PTFE) BHJ solutions were spun cast at various spin speed to control films thickness and immediately annealed at the appropriate temperature for >5 minutes. ZnO-np films were then spun cast on top of the BHJ film from 2-methoxyethanol stock solutions and did not required any additional annealing. The organic solar cell devices were completed by thermal deposition (<10$^{-6}$ torr base pressure) of 120 nm Al top electrodes having a 13.2 mm$^2$ area via a shadow mask.

Device performance was assessed from current density versus voltages (J-V) measurements acquired with a LabView controlled multiplexed Keithley source-measured unit under 100 mW/cm$^2$ illumination from a Newport 1600 W Xenon arc lamp. The illumination intensity was calibrated using a Newport meter and calibrated 91150V reference cell. All measurements were performed in inert atmosphere glovebox with <0.5 ppm oxygen. Optical absorption measurements were measured with a PerkinElmer Lambda Spectrometer.

Performance characteristics of organic solar cell devices containing dye compounds are shown in FIGS. 1A-8, and summarized in Table 1. The fluorine substituents have effects on both the physical and electronic properties of the small molecular dye compounds as observed by differences in solubility, film forming ability, film quality and device performance. The effects on electronic properties are most evident in the solar cell device parameters such as the V$_{OC}$ in which up to ~100 mV differences are observed by the fluorine substituents.

TABLE 1

Solar cell parameters of example devices with small molecular dye compounds.

| | J$_{SC}$ (mA cm$^{-2}$) | V$_{OC}$ (mV) | Fill Factor | PCE (%) |
|---|---|---|---|---|
| SDT[PT(1)]$_2$ | 10.1 | 832 | 0.55 | 4.7 |
| SDT[$^F$BT(1)]$_2$ | 10.7 | 781 | 0.49 | 4.1 |
| SDT[PT(2)]$_2$ | 10.3 | 905 | 0.53 | 4.9 |
| SDT[$^F$BT(2)]$_2$ | 10.9 | 762 | 0.57 | 4.7 |
| SDT[PT(3)]$_2$ | 1.9 | 808 | 0.33 | 0.5 |
| SDT[PT(4)]$_2$ | 11.3 | 822 | 0.47 | 4.4 |
| SDT[$^F$BT(4)]$_2$ | 12.4 | 810 | 0.68 | 6.9 |
| SDT[$^{FF}$BT(4)]$_2$ | 10.8 | 909 | 0.56 | 5.5 |

While preferred embodiments of this invention have been shown and described, modifications thereof can be made by one skilled in the art without departing from the spirit or teaching of this invention. The embodiments described herein are exemplary only and are not limiting. Many variations and modifications of systems and methods are possible and are within the scope of the invention. Accordingly, the scope of protection is not limited to the embodiments described herein, but is only limited by the claims that follow, the scope of which shall include all equivalents of the subject matter of the claims.

Should the disclosure of any patents, patent applications, and publications which are incorporated herein by reference conflict with the description of the present application to the extent that it may render a term unclear, the present description shall take precedence.

What is claimed is:

1. An electronic or optoelectronic device comprising a first electrode;
   a second electrode proximate the first electrode with a space reserved therebetween; and
   an active layer arranged between and in electrical connection with the first and second electrodes,
   wherein the active layer comprises at least one dye compound,
   wherein the dye compound comprises a small molecule compound of Formula (I):

T1a-T2a-(A1)$_m$-(B1)$_n$-P-(B2)$_n$-(A2)$_m$-T2b-T1b     (I)

wherein
   P is an optionally substituted aryl group or an optionally substituted heteroaryl group;
   or P is a group having the formula: -A1-P'-A2-, wherein P' is an optionally substituted aryl group or an optionally substituted heteroaryl group;
   each B1 and each B2, independently, is an optionally substituted thiophene;
   each A1 and each A2, independently, is an optionally substituted aryl group or an optionally substituted heteroaryl group;
   T2a and T2b, independently, have the formula:

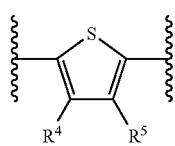

T1a and T1b, independently, have the formula:

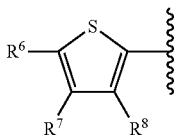

wherein each $R^4$, $R^5$, $R^6$, $R^7$, and $R^8$, independently, is H, halo, alkyl, haloalkyl, alkoxy, alkenyl, alkynyl, thioalkyl, —$NHR^9$, —$N(R^9)_2$, aryl, heteroaryl, or acyl;

each $R^9$, independently, is H, alkyl, or haloalkyl;

each n, independently, is 0, 1, 2 or 3;

each m, independently, is 1, 2, or 3;

provided that at least one of $R^4$ to $R^8$ is fluoro or fluoroalkyl; and further provided that when $R^4$ or $R^5$ is fluoro, the other is not alkyl or haloalkyl, and when $R^7$ or $R^8$ is fluoro, the other is not alkyl or haloalkyl.

2. The electronic or optoelectronic device of claim 1, wherein each of $R^4$ to $R^8$, independently, is H, fluoro, alkyl, or fluoroalkyl.

3. The electronic or optoelectronic device of claim 1, wherein (i) each $R^6$, independently, is alkyl, and at least one of $R^4$, $R^5$, $R^7$, and $R^8$ is fluoro, and the remaining of $R^4$ to $R^8$ are H or fluoro; or (ii) each $R^6$, independently, is fluoro or fluoroalkyl, and each $R^4$, $R^5$, $R^7$, and $R^8$, independently, is H or alkyl.

4. The electronic or optoelectronic device of claim 1, wherein P or P' is selected from the group consisting of

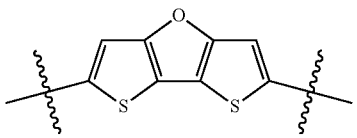

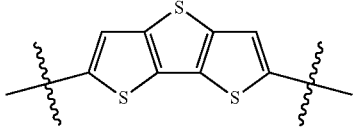

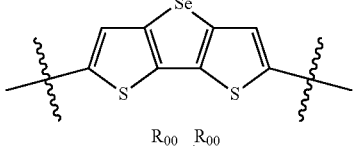

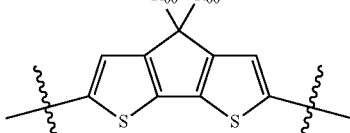

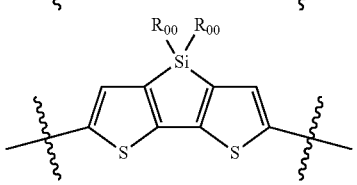

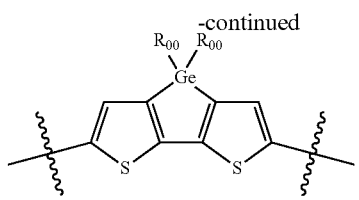

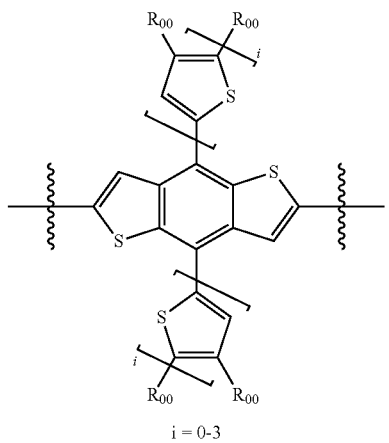

i = 0-3

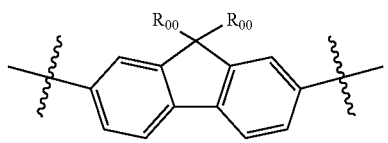

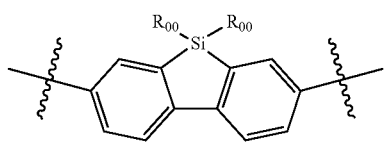

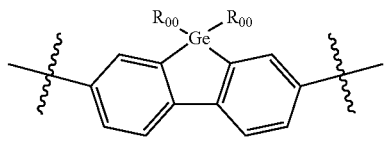

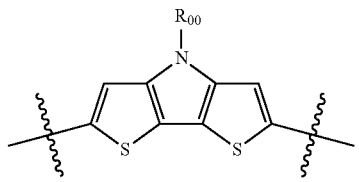

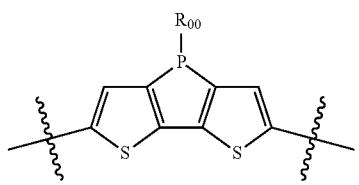

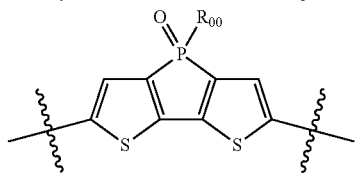

-continued
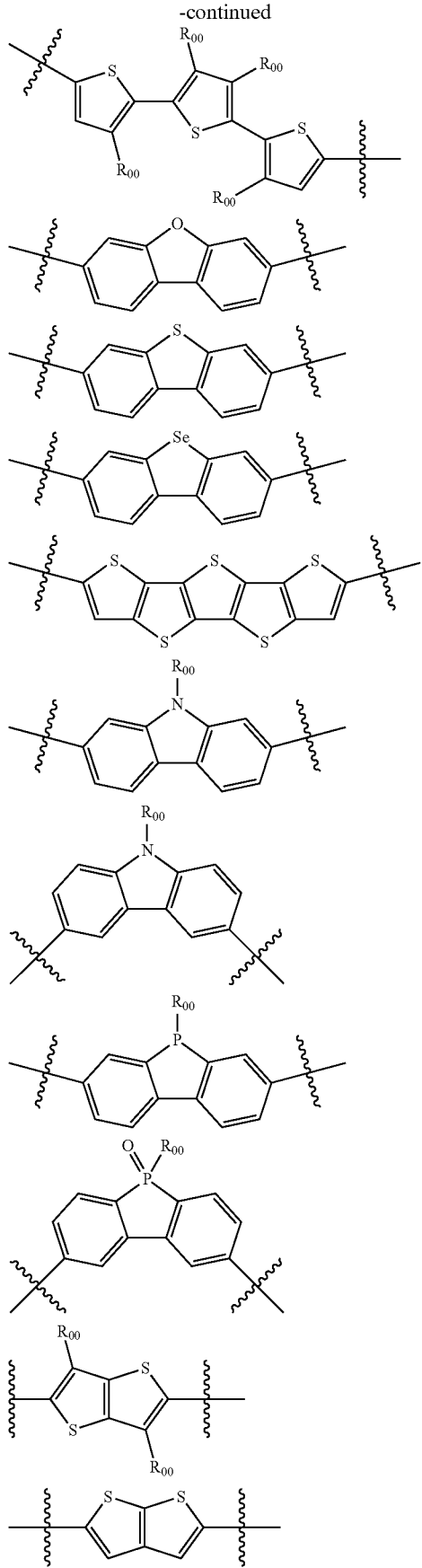
-continued
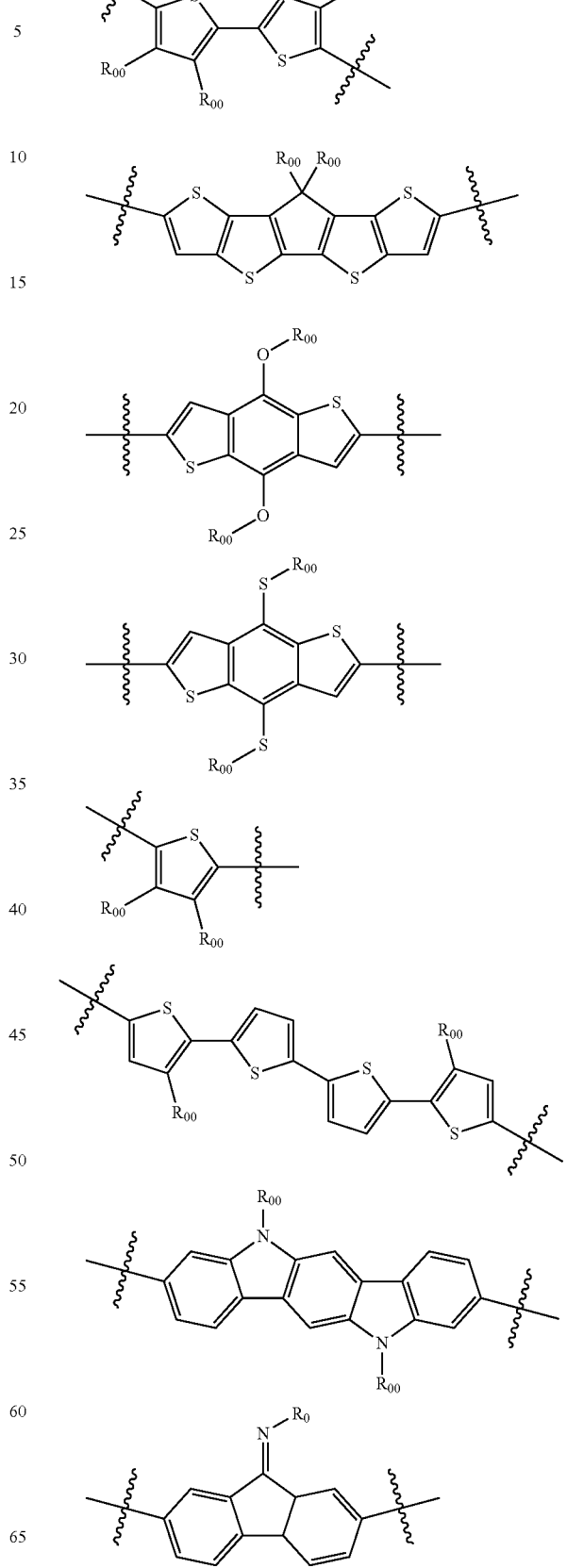

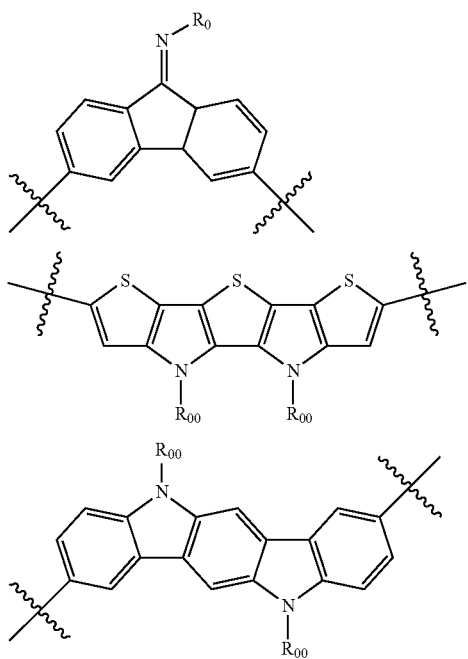
wherein each R$_{00}$, independently, is H or alkyl; and each i is 0, 1, 2, or 3;
each A1 and each A2, independently, is selected from the group consisting of:
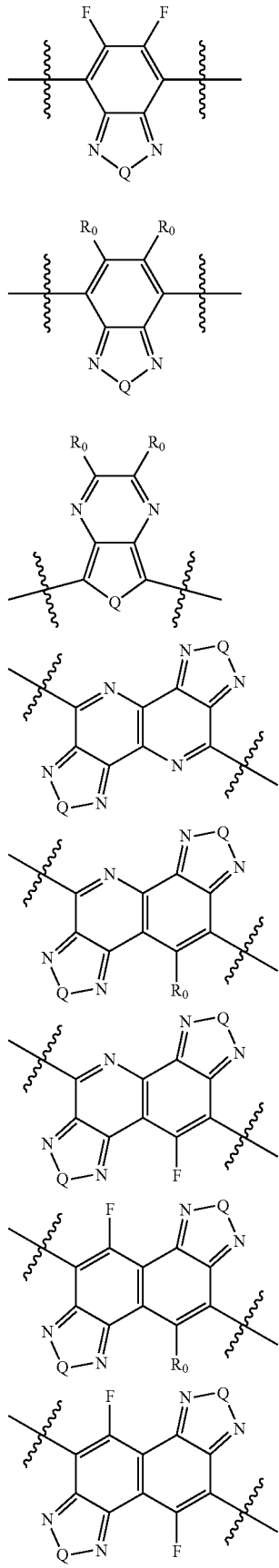

-continued
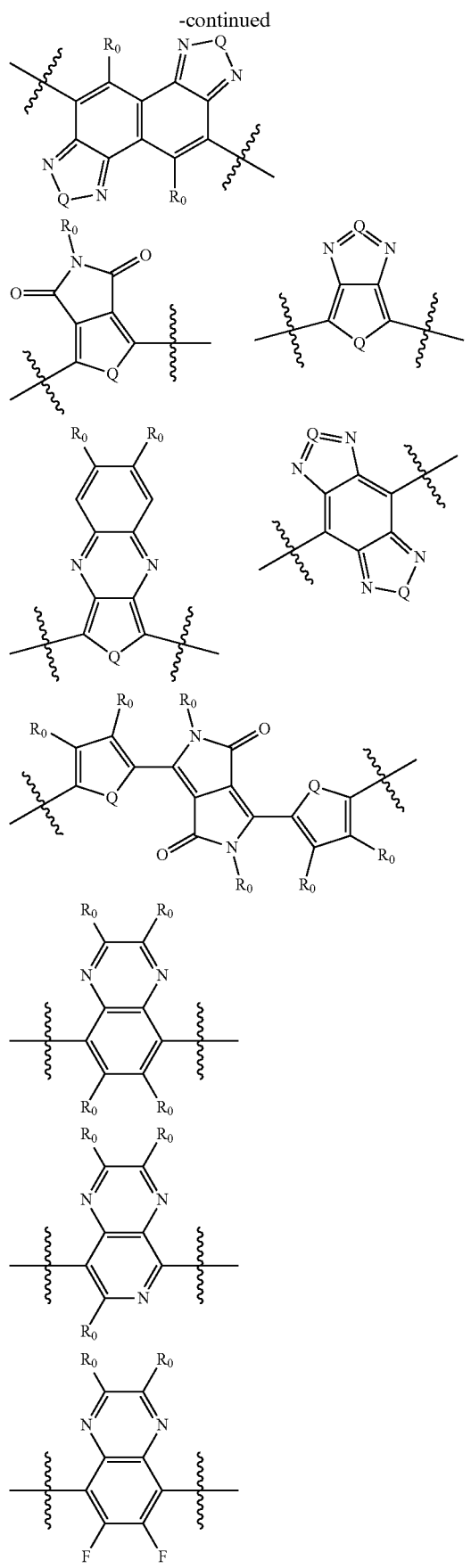
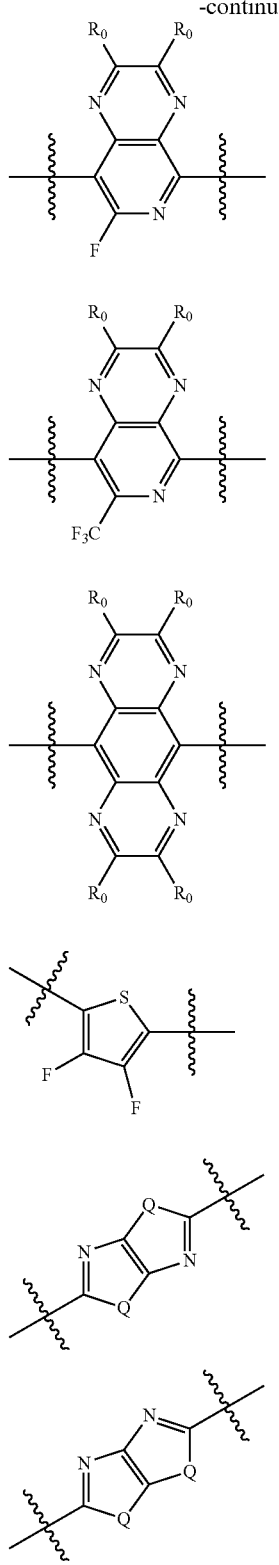
wherein each Q, independently, is O or S;
each R₀, independently, is H or alkyl; and
wherein each T1a, T2a, A1, B1, B2, A2, T2b, T1b, n and m are selected such that the small molecule compound is symmetric about P.

5. The electronic or optoelectronic device of claim 1, wherein P or P' has the formula:

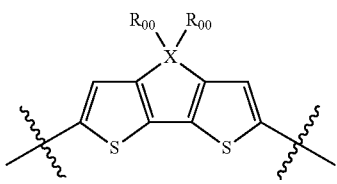

wherein X is C, Si, or Ge; and
each $R_{00}$, independently, is H or alkyl.

6. The electronic or optoelectronic device of claim 1, wherein each A1 and each A2, independently, is selected from the group consisting of:

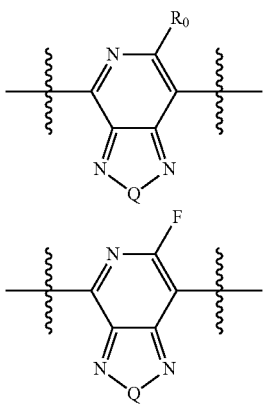

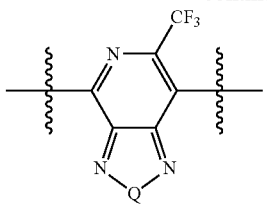

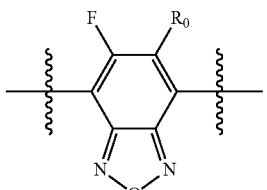

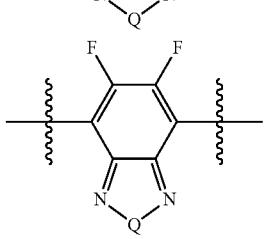

wherein Q is O or S.

7. The electronic or optoelectronic device of claim 1, wherein each n is 0.

8. The electronic or optoelectronic device of claim 1, having the formula:

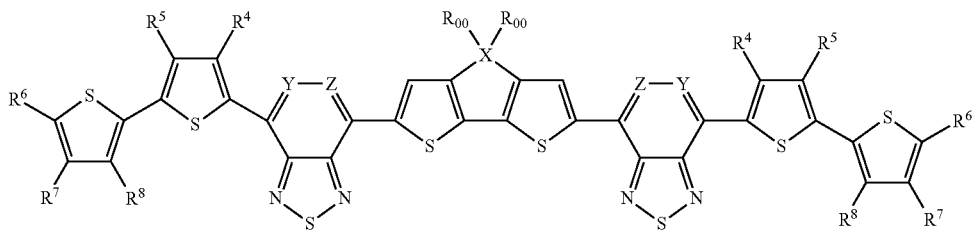

wherein
each Y and each Z, independently, is N or $CR^3$;
each $R^3$, independently, is H, F, alkyl, or haloalkyl; and
provided that Y—Z is not CH—CH.

9. The electronic or optoelectronic device of claim 1, wherein the small molecule compound of Formula (I) is selected from the group consisting of:

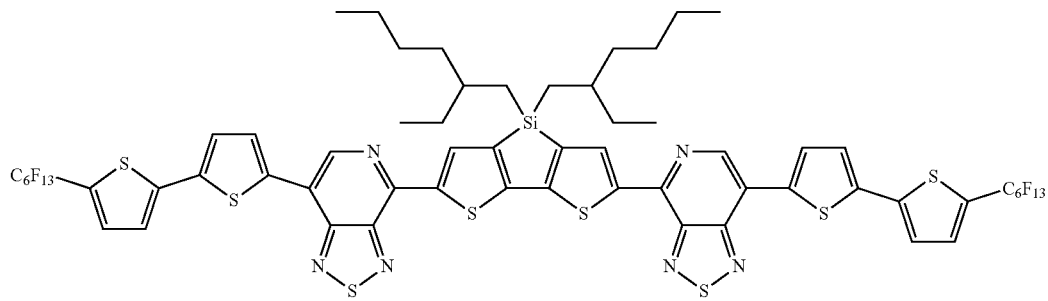

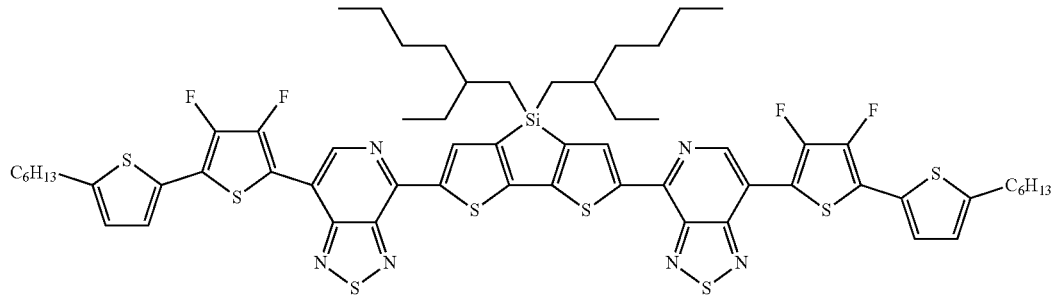
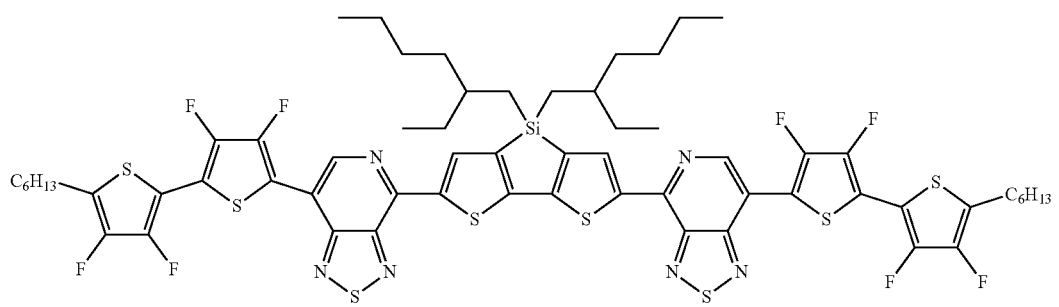
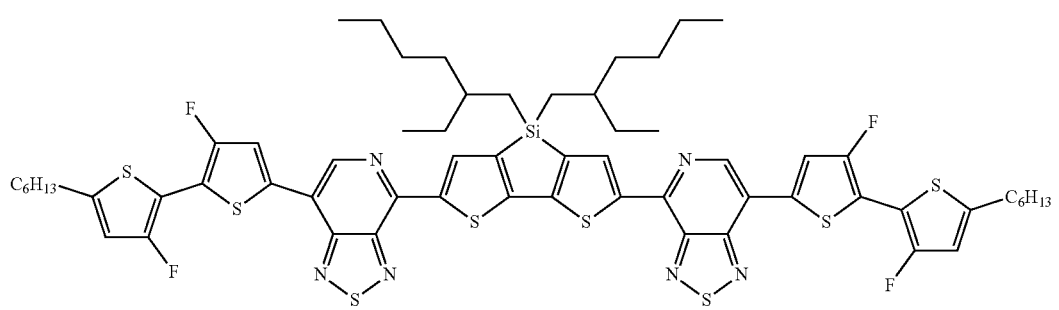
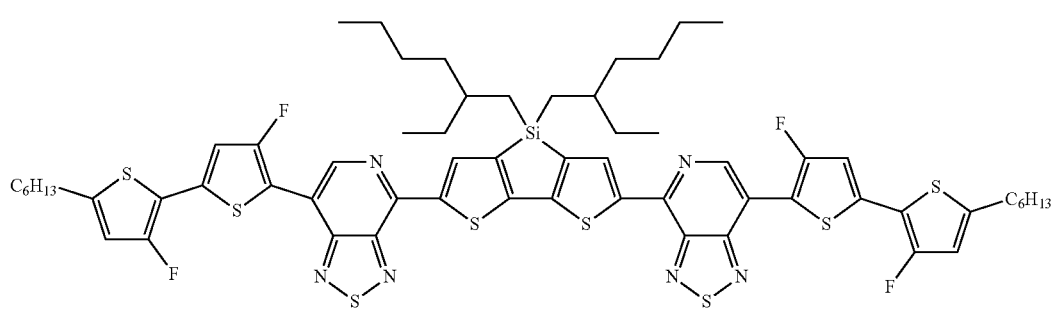
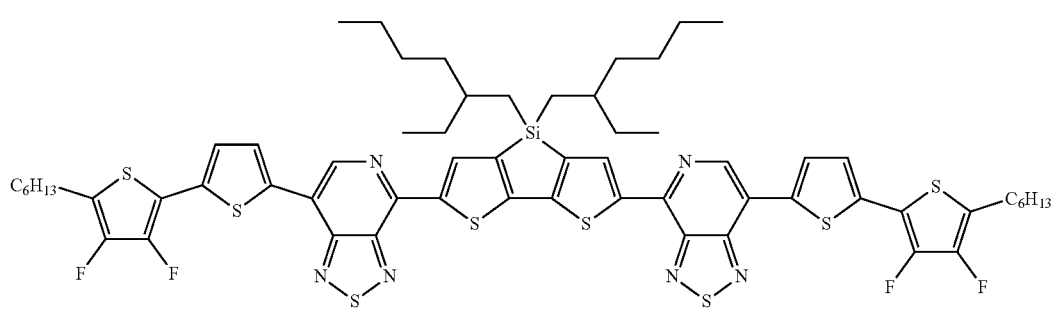

-continued
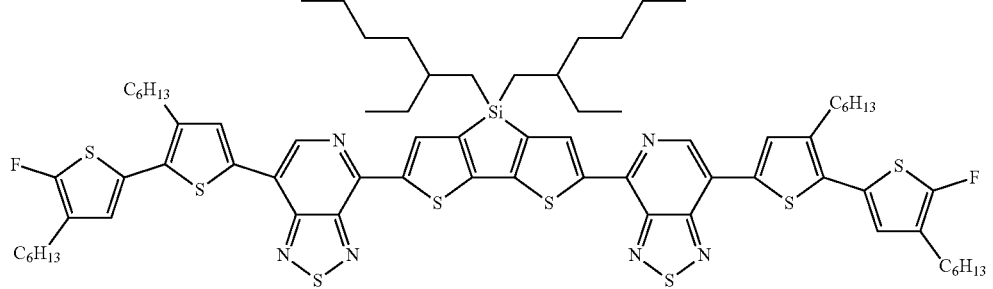
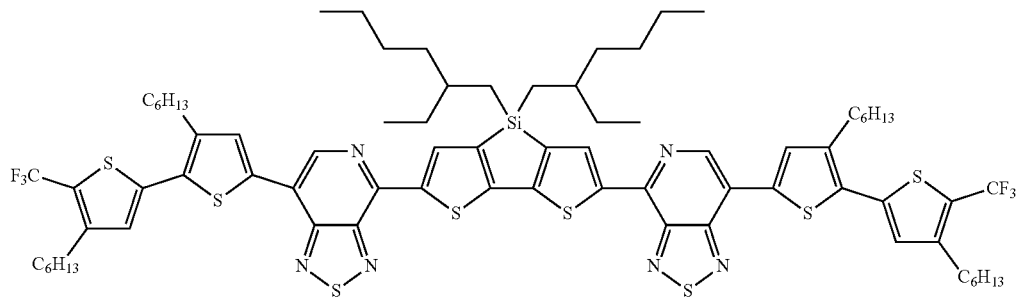
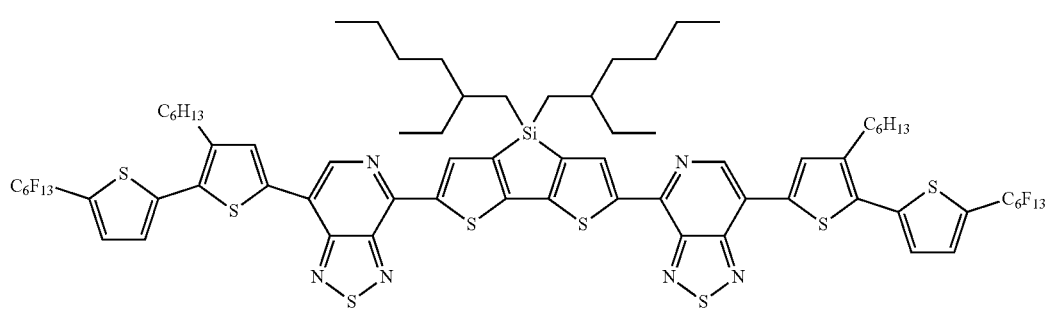
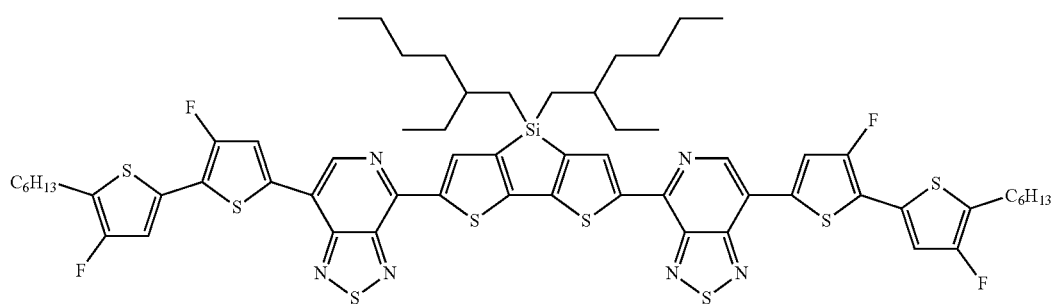
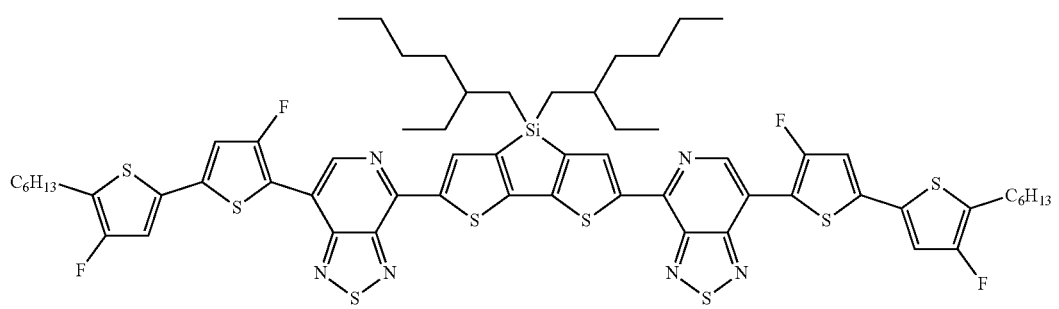

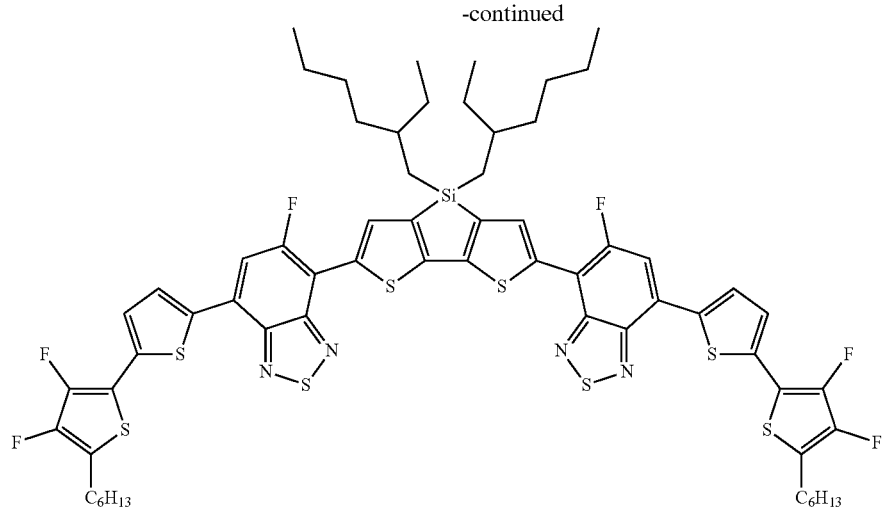
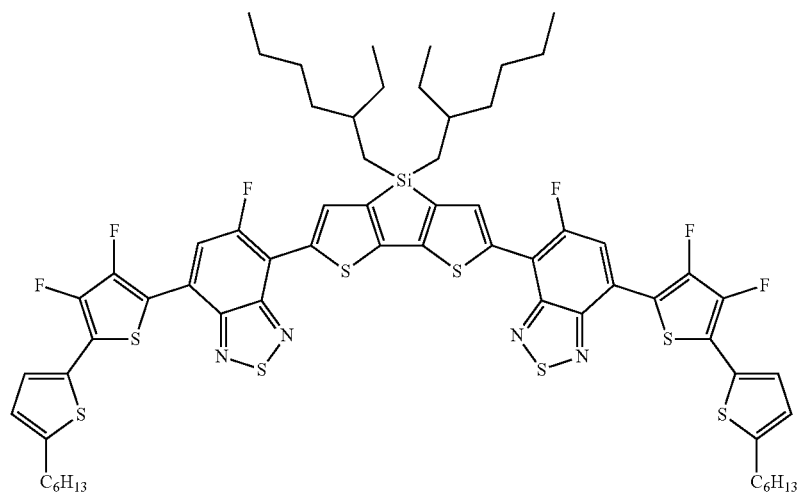
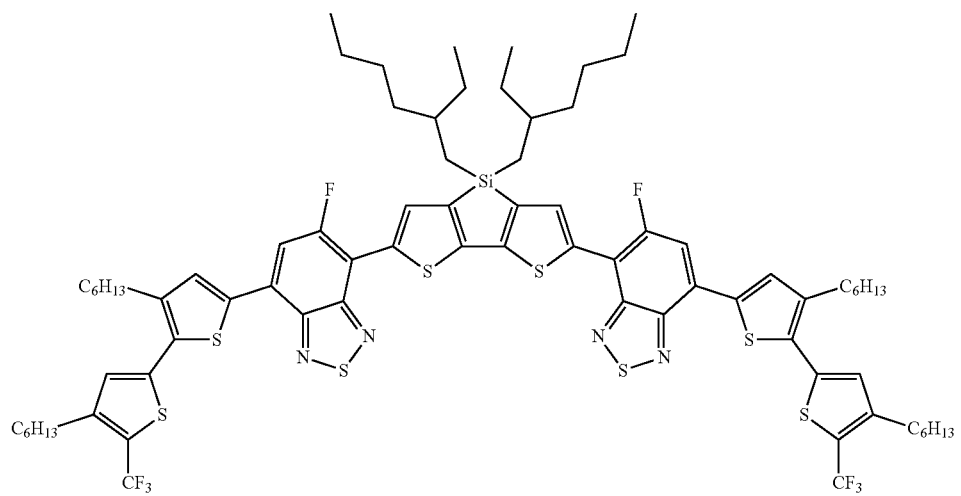

-continued
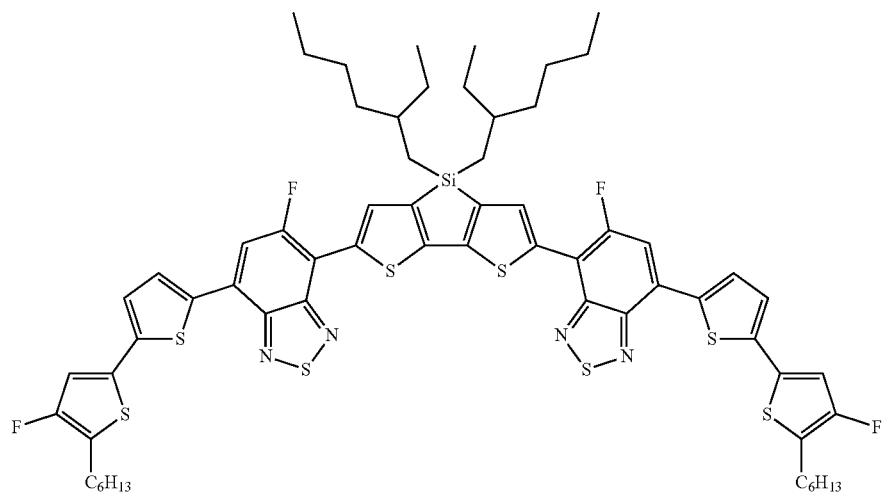
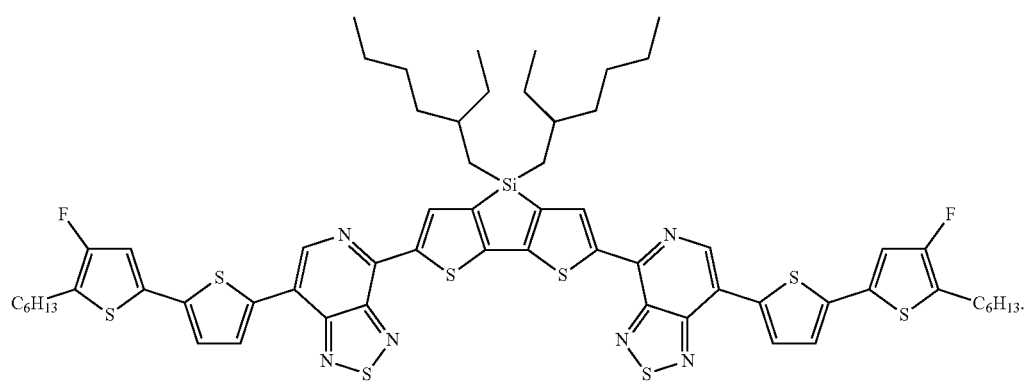
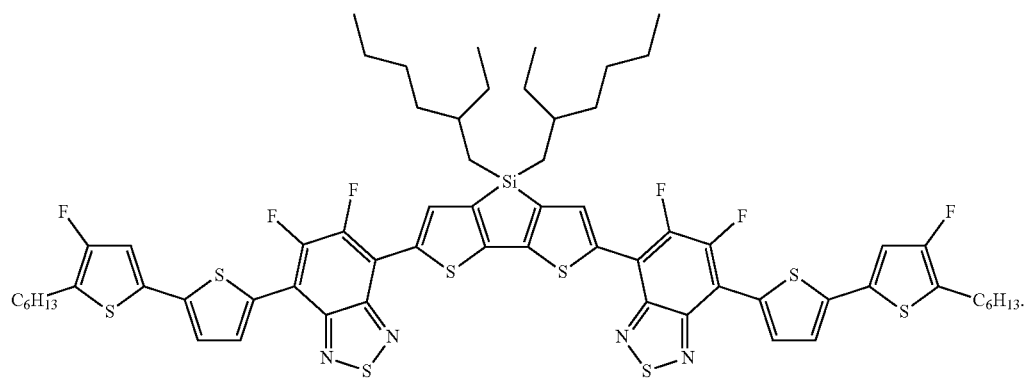

10. The electronic or optoelectronic device of claim 1, wherein the small molecule compound of Formula (I) is selected from the group consisting of:
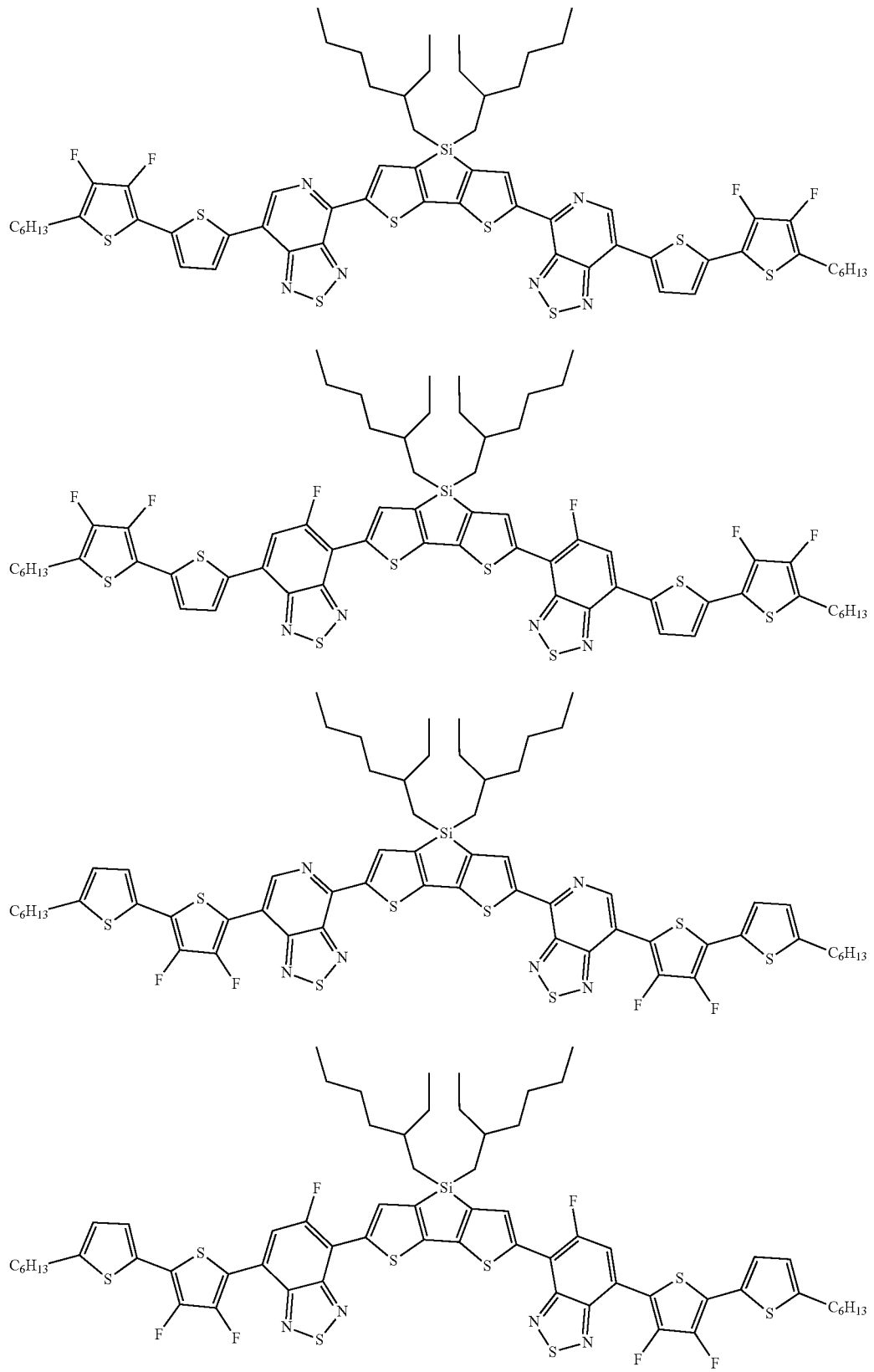

-continued
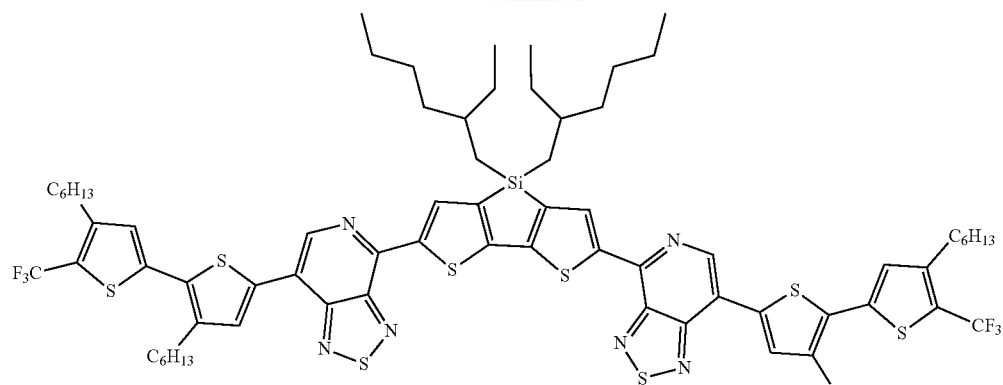
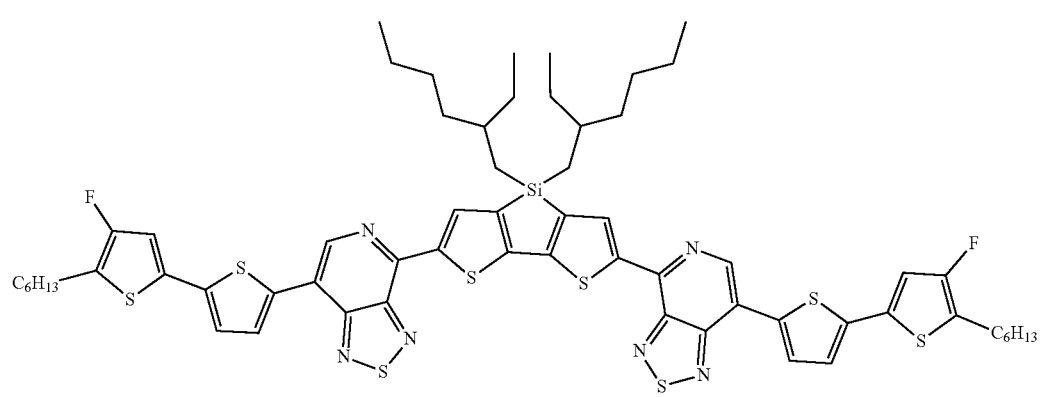
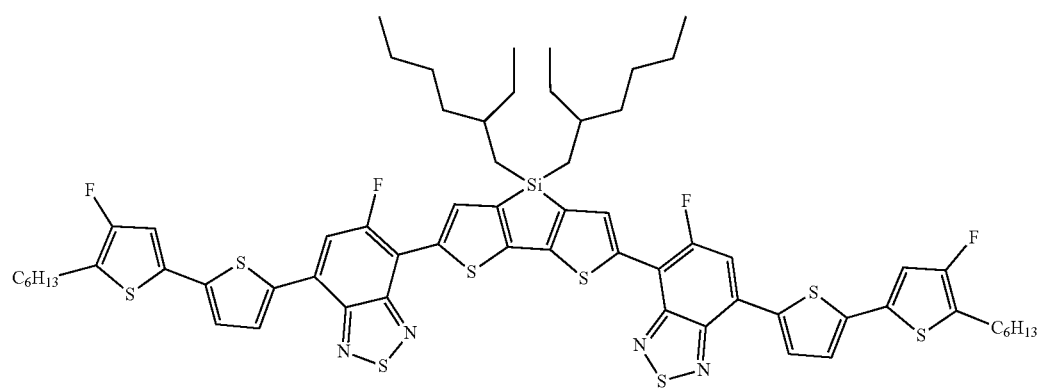
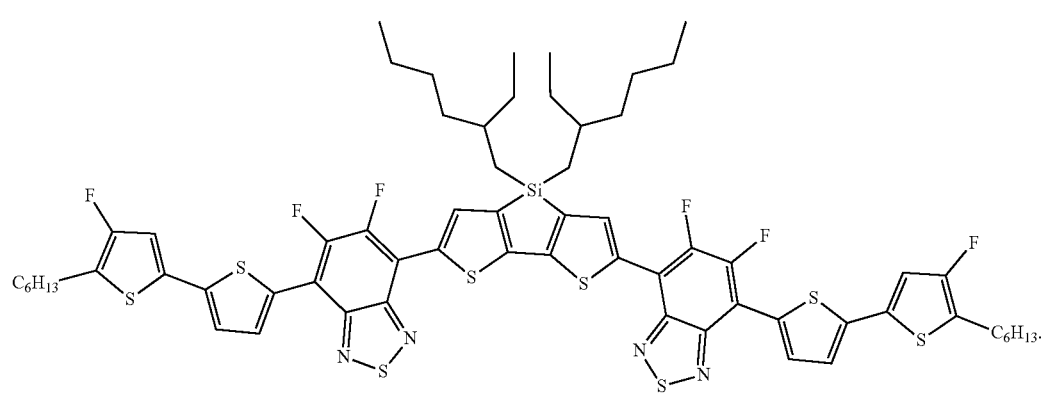

11. A small molecule compound of Formula (I):

$$T1a\text{-}T2a\text{-}(A1)_m\text{-}(B1)_n\text{-}P\text{-}(B2)_n\text{-}(A2)_m\text{-}T2b\text{-}T1b \quad (I)$$

wherein
P is an optionally substituted aryl group or an optionally substituted heteroaryl group;
or P is a group having the formula: -A1-P'-A2-, wherein P' is an optionally substituted aryl group or an optionally substituted heteroaryl group;
each B1 and each B2, independently, is an optionally substituted thiophene;
each A1 and each A2, independently, is an optionally substituted aryl group or an optionally substituted heteroaryl group;
T2a and T2b, independently, have the formula:

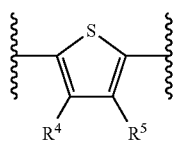

T1a and T1b, independently, have the formula:

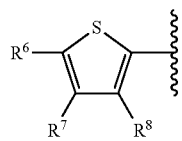

wherein each $R^4$, $R^5$, $R^6$, $R^7$, and $R^8$, independently, is H, halo, alkyl, haloalkyl, alkoxy, alkenyl, alkynyl, thioalkyl, —$NHR^9$, —$N(R^9)_2$, aryl, heteroaryl, or acyl;
each $R^9$, independently, is H, alkyl, or haloalkyl;
each n, independently, is 0, 1, 2 or 3;
each m, independently, is 1, 2, or 3;
provided that at least one of $R^4$ to $R^8$ is fluoro or fluoroalkyl; and
further provided that when $R^4$ or $R^5$ is fluoro, the other is not alkyl or haloalkyl, and when $R^7$ or $R^8$ is fluoro, the other is not alkyl or haloalkyl.

12. The small molecule compound of claim 11, wherein each of $R^4$ to $R^8$, independently, is H, fluoro, alkyl, or fluoroalkyl.

13. The small molecule compound of claim 11, wherein
(i) each $R^6$, independently, is alkyl, and at least one of $R^4$, $R^5$, $R^7$, and $R^8$ is fluoro, and the remaining of $R^4$ to $R^8$ are H or fluoro; or
(ii) each $R^6$, independently, is fluoro or fluoroalkyl, and each $R^4$, $R^5$, $R^7$, and $R^8$, independently, is H or alkyl.

14. The small molecule compound of claim 11, wherein P or P' is selected from the group consisting of

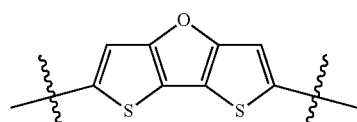

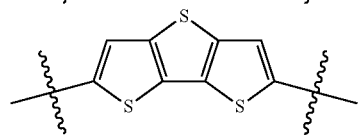

-continued

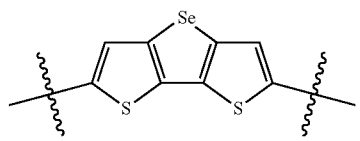

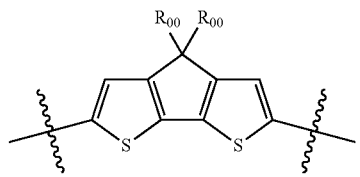

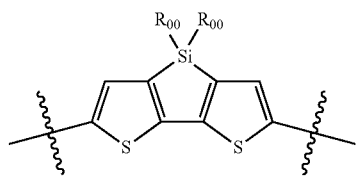

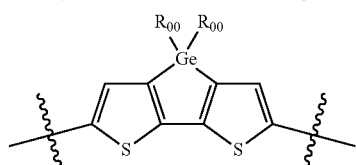

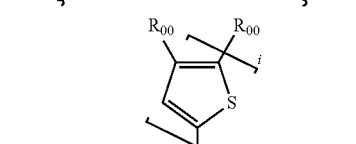

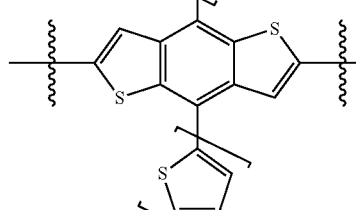

i = 0-3

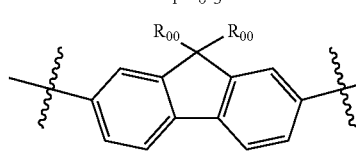

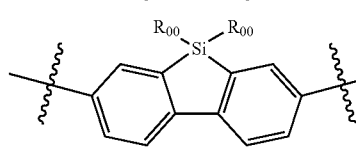

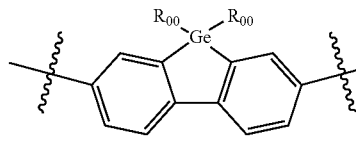

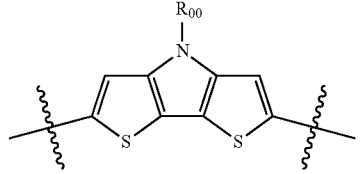

-continued
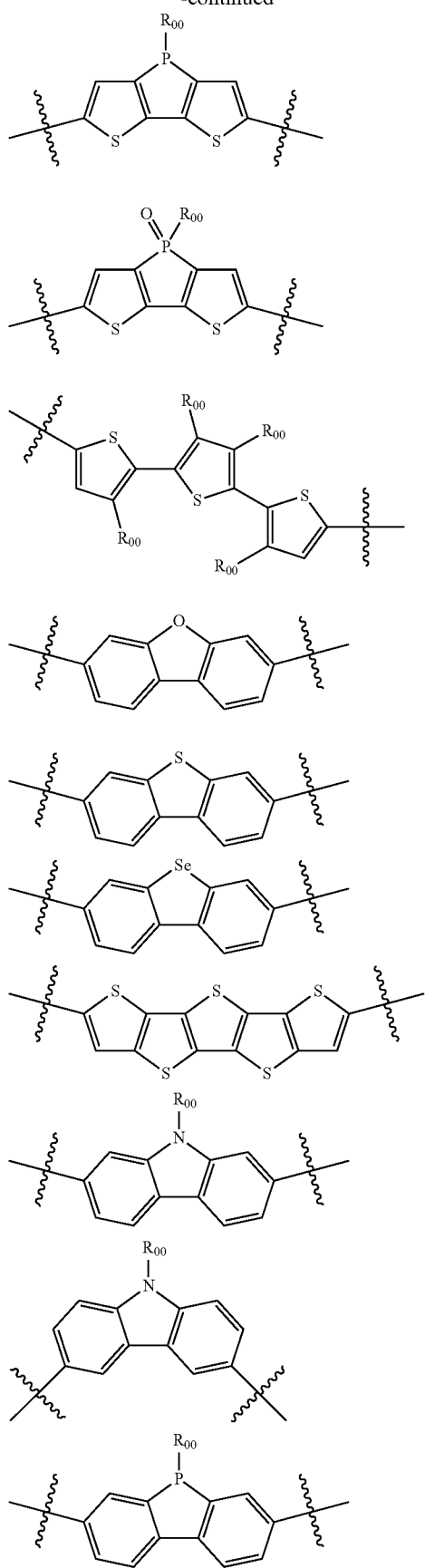
-continued
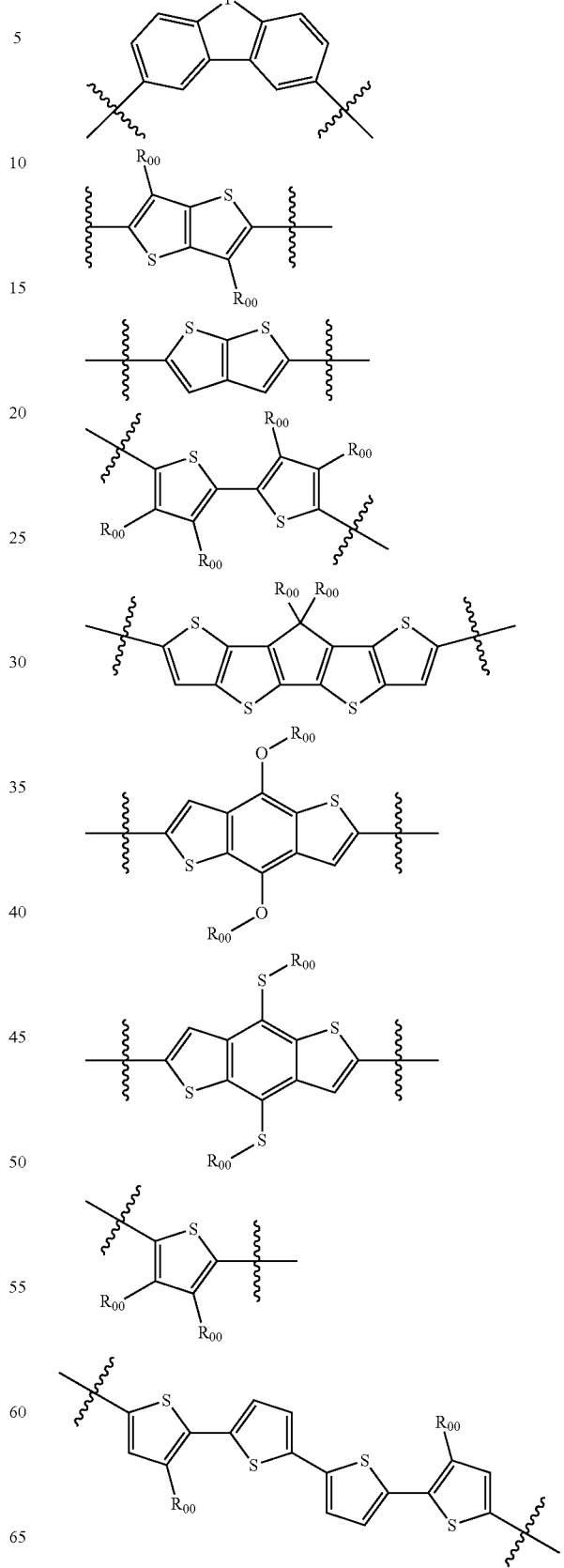

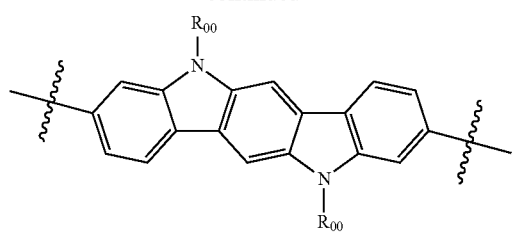
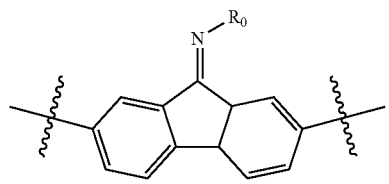
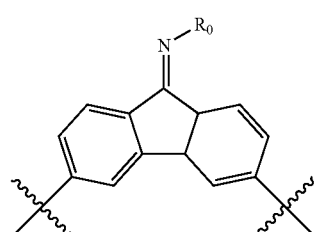
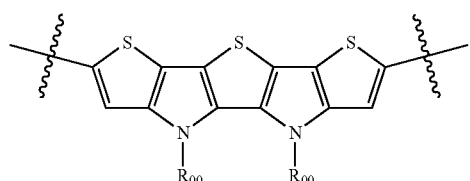
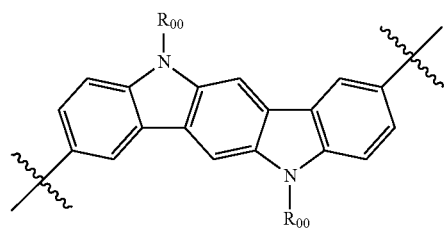
wherein each $R_{00}$, independently, is H or alkyl; and each i is 0, 1, 2, or 3;
each A1 and each A2, independently, is selected from the group consisting of:
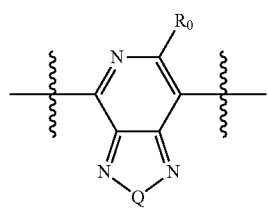
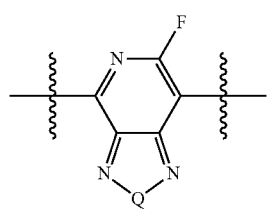
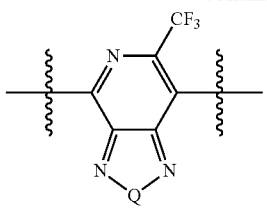
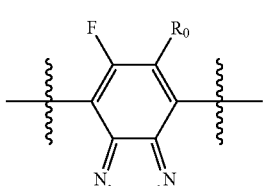
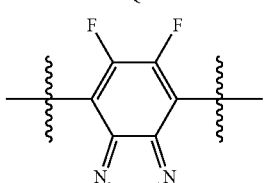
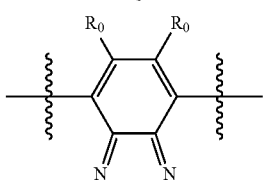
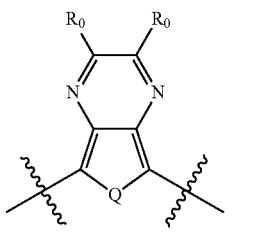
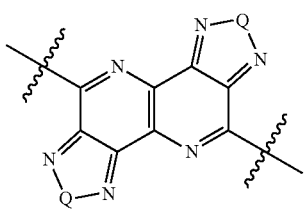
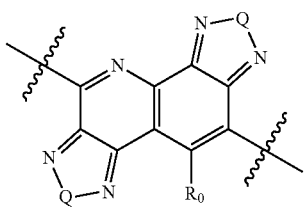
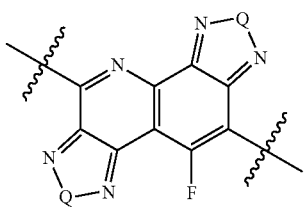

-continued
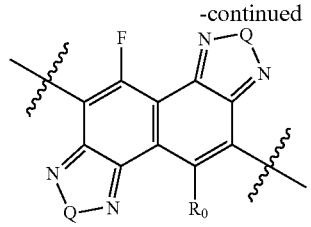
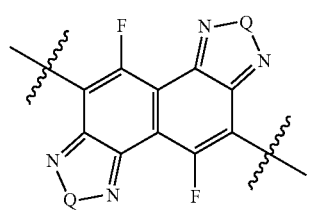
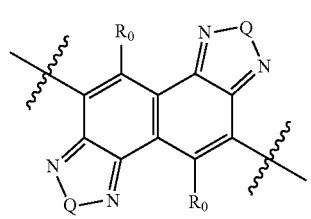
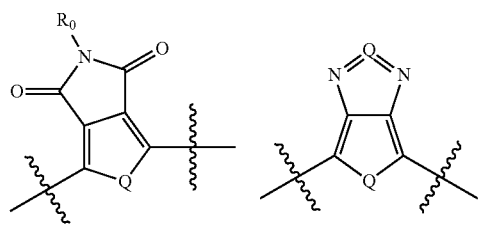
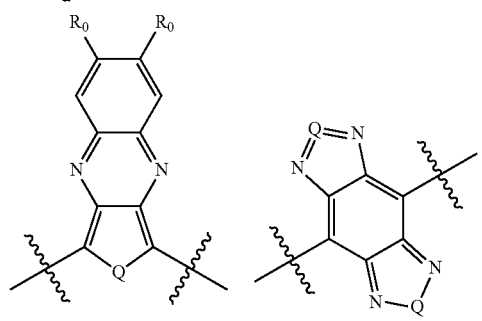
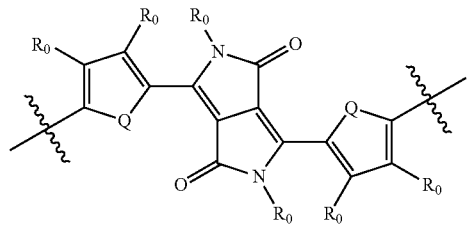
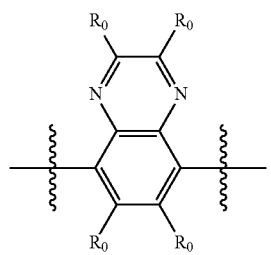
-continued
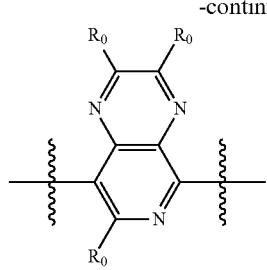
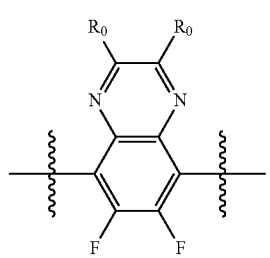
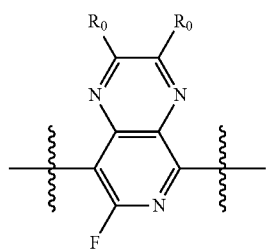
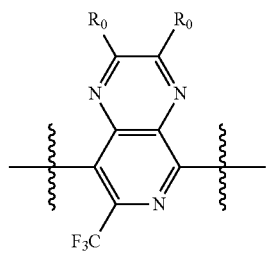
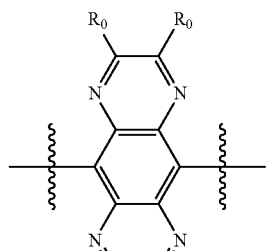
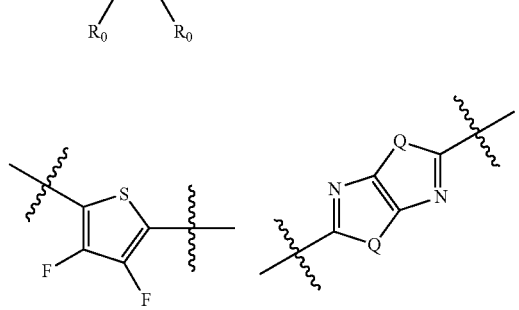

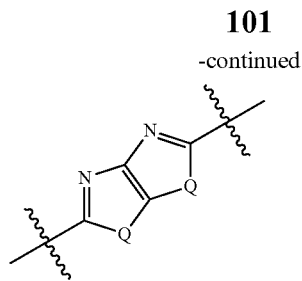

wherein each Q, independently, is O or S;

each $R_0$, independently, is H or alkyl; and wherein each T1a, T2a, A1, B1, B2, A2, T2b, T1b, n and m are selected such that the small molecule compound is symmetric about P.

15. The small molecule compound of claim 11, wherein P or P' has the formula:

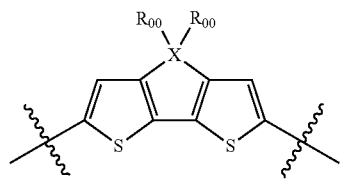

wherein X is C, Si, or Ge; and each $R_{00}$, independently, is H or alkyl.

16. The small molecule compound of claim 11, wherein each A1 and each A2, independently, is selected from the group consisting of:

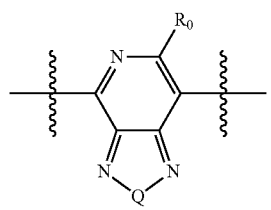

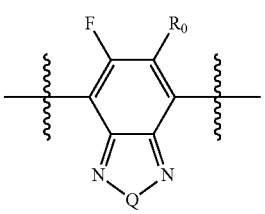

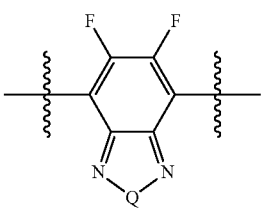

wherein Q is O or S.

17. The small molecule compound of claim 11, wherein each n is 0.

18. The small molecule compound of claim 11, having the formula:

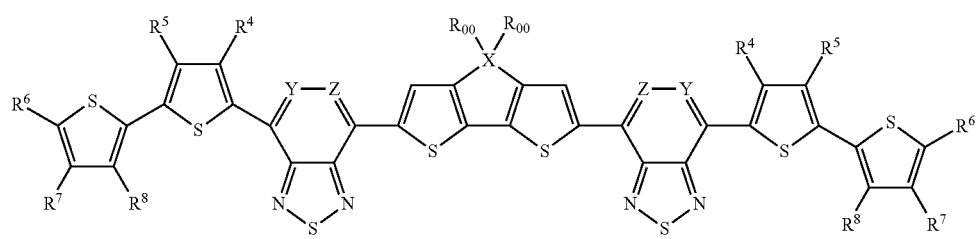

wherein
each Y and each Z, independently, is N or $CR^3$;
each $R^3$, independently, is H, F, alkyl, or haloalkyl; and
provided that Y—Z is not CH—CH.

19. The small molecule compound of claim 11, wherein the small molecule compound of Formula (I) is selected from the group consisting of:

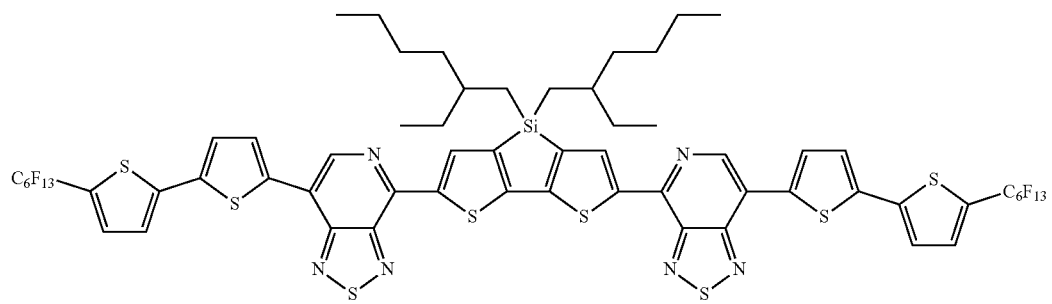
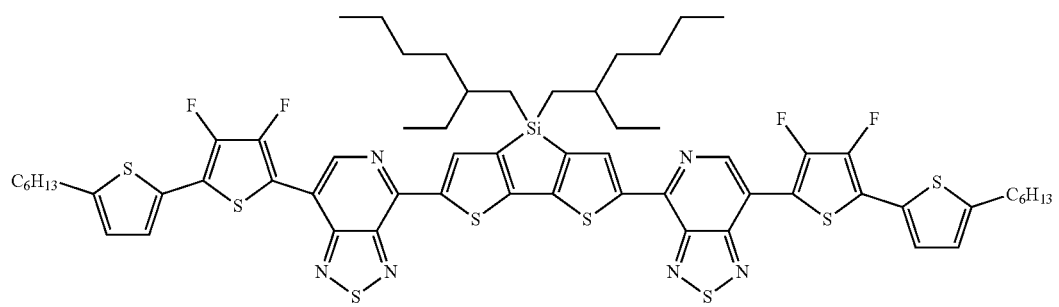
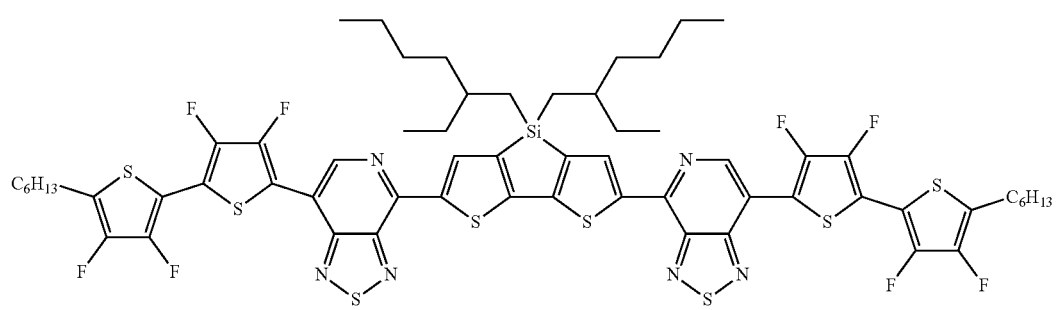
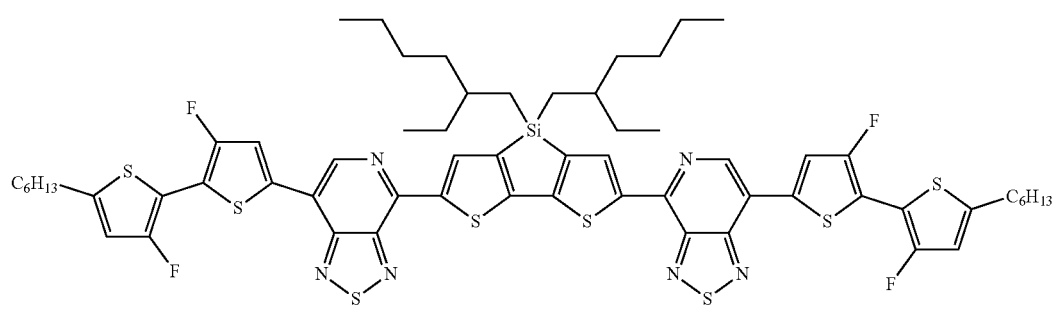
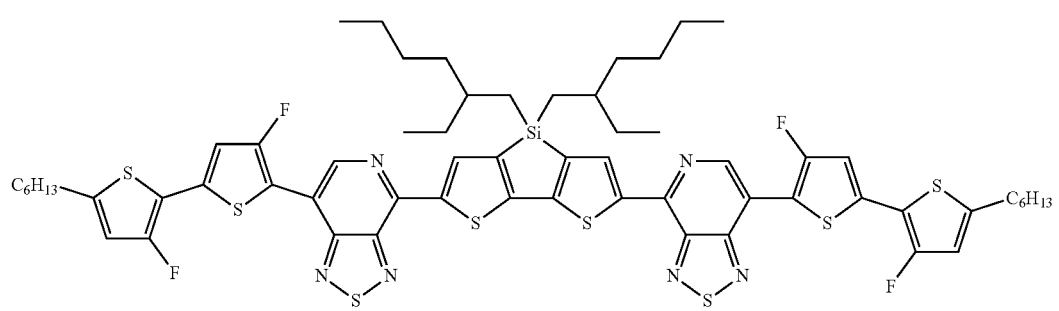

-continued
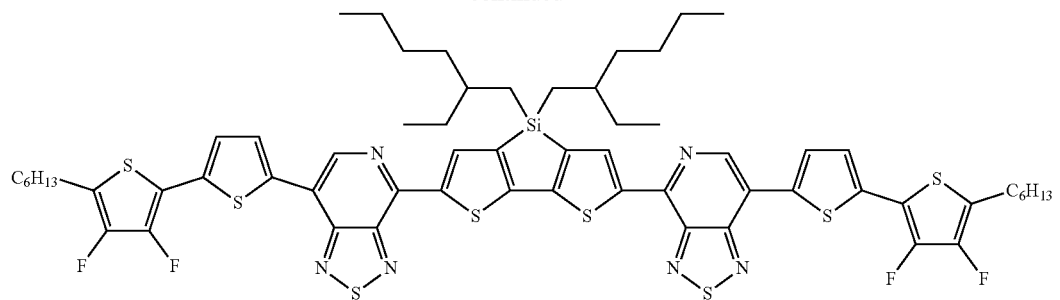
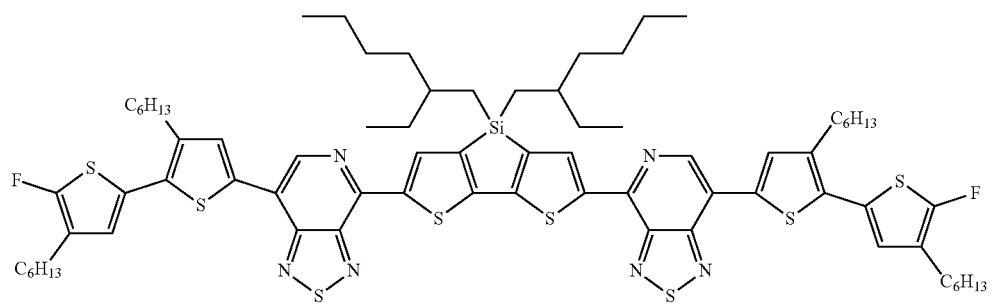
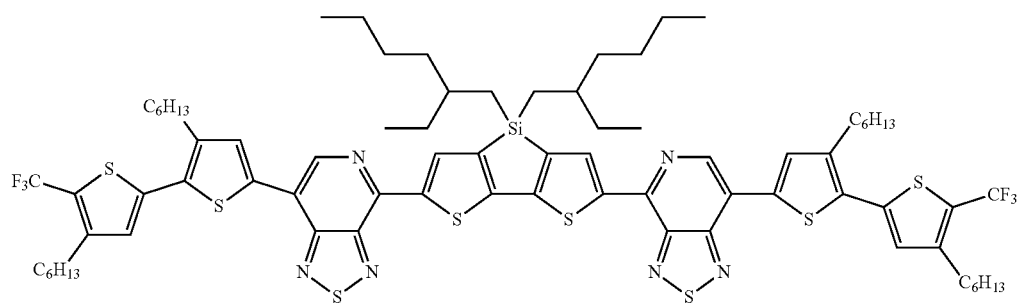
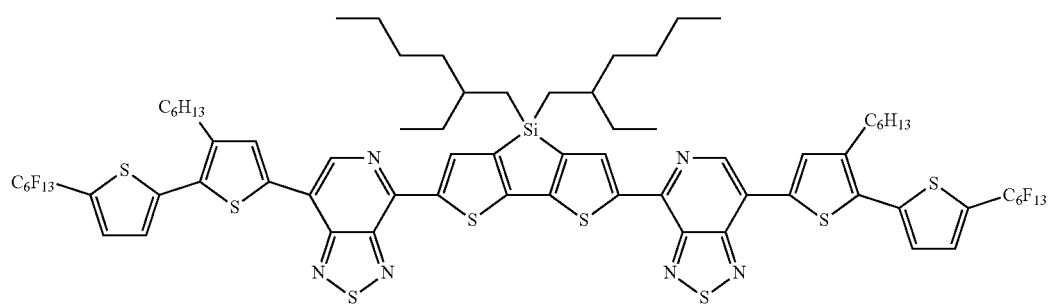
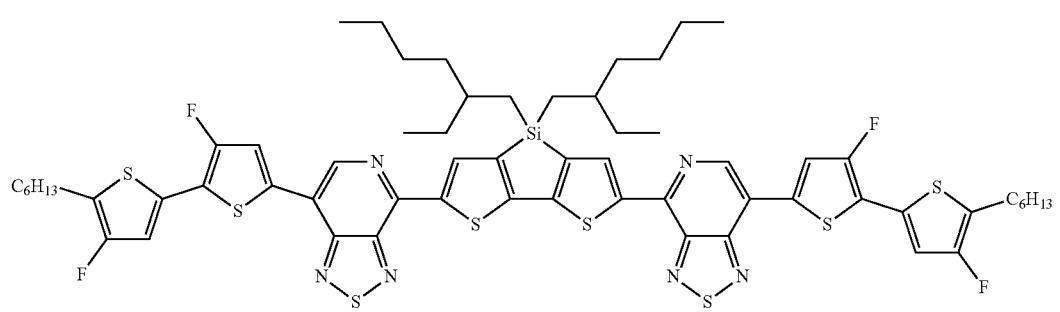

-continued
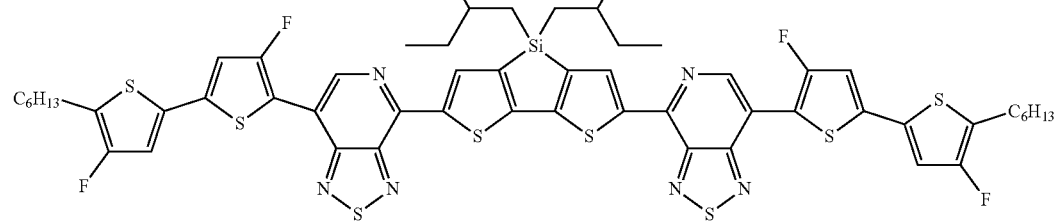
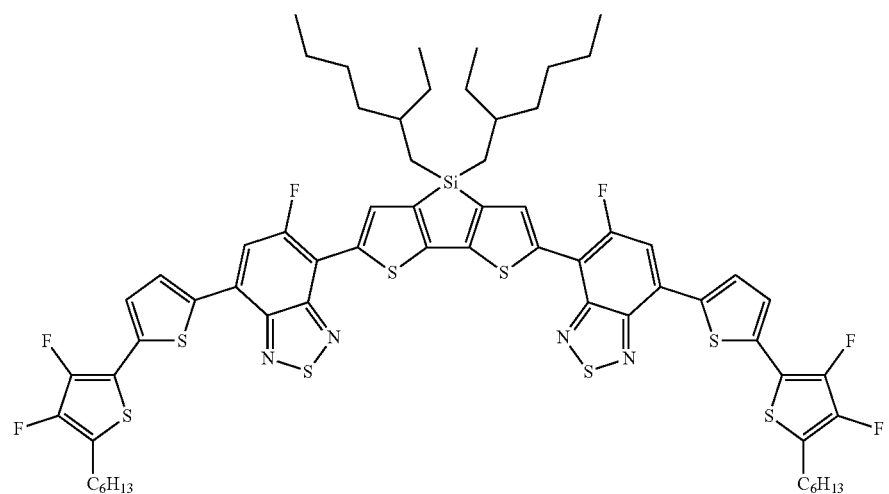
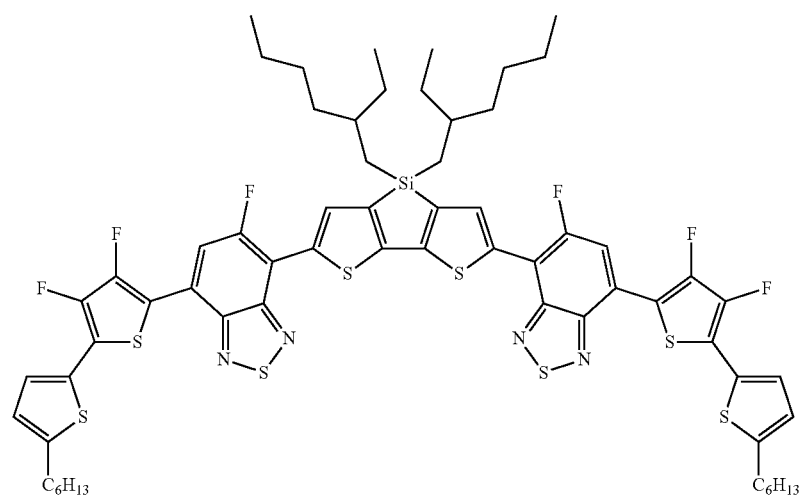

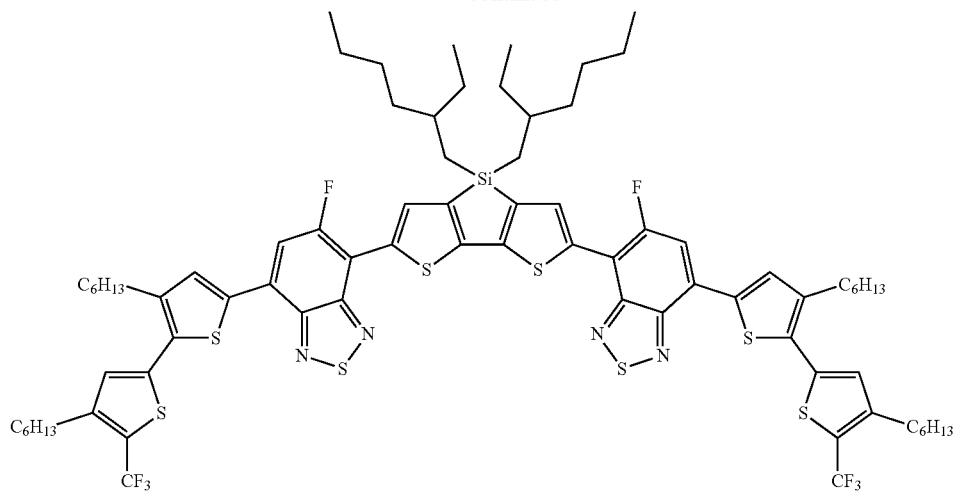
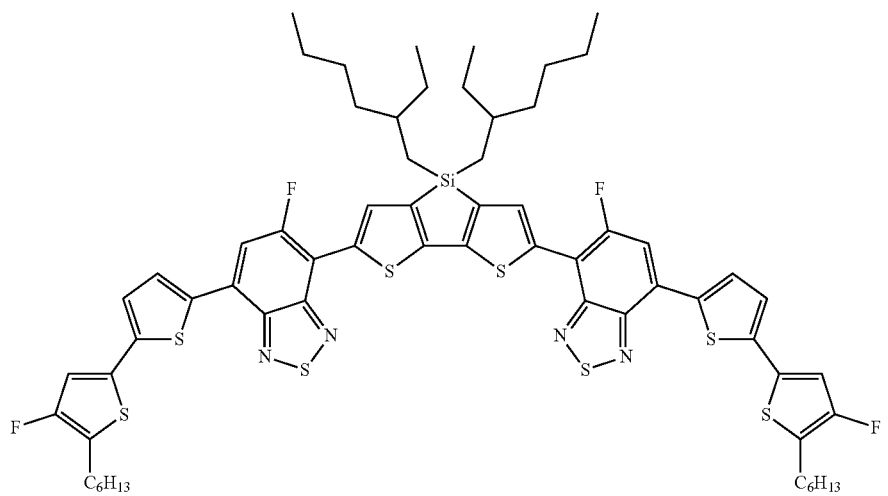
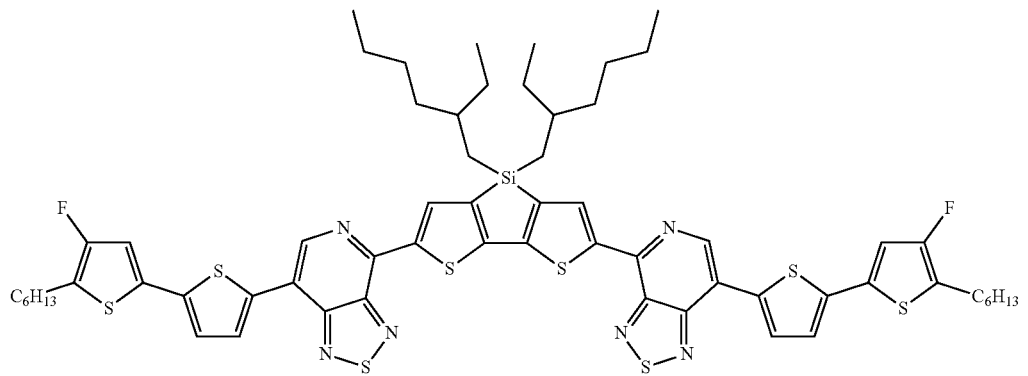

-continued
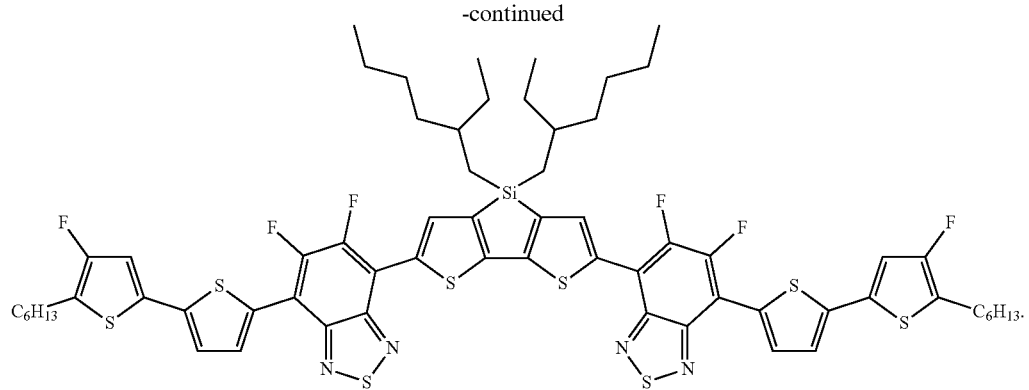
20. The small molecule compound of claim 11, wherein the small molecule compound of Formula (I) is selected from the group consisting of:
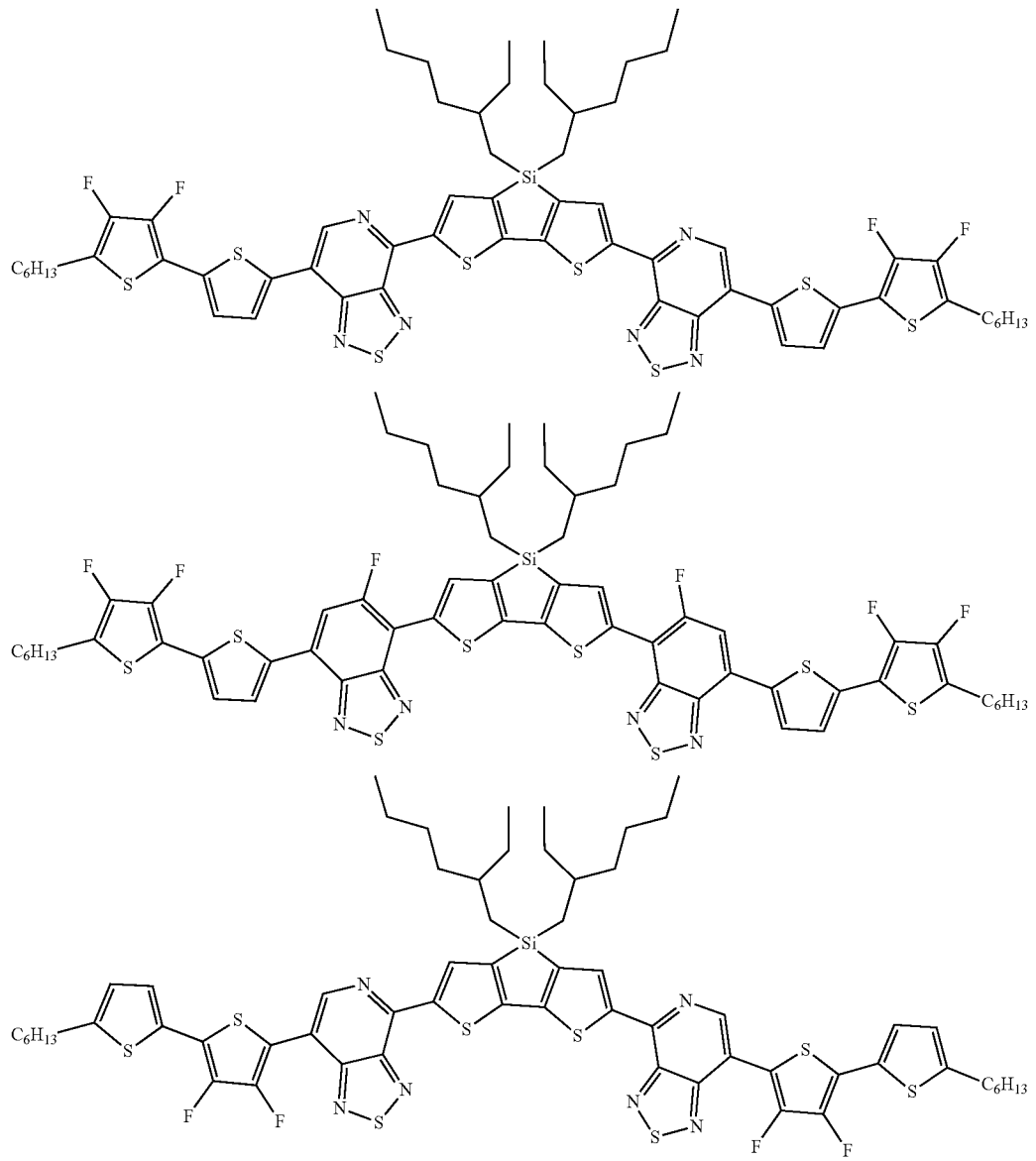

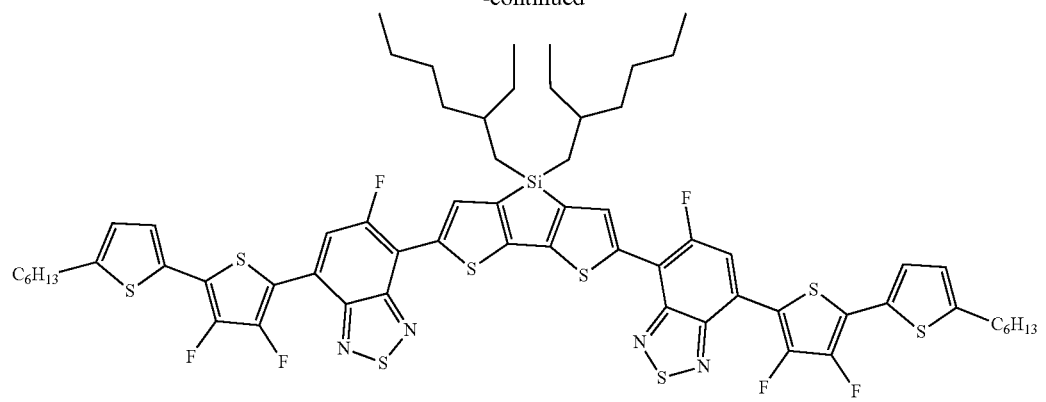
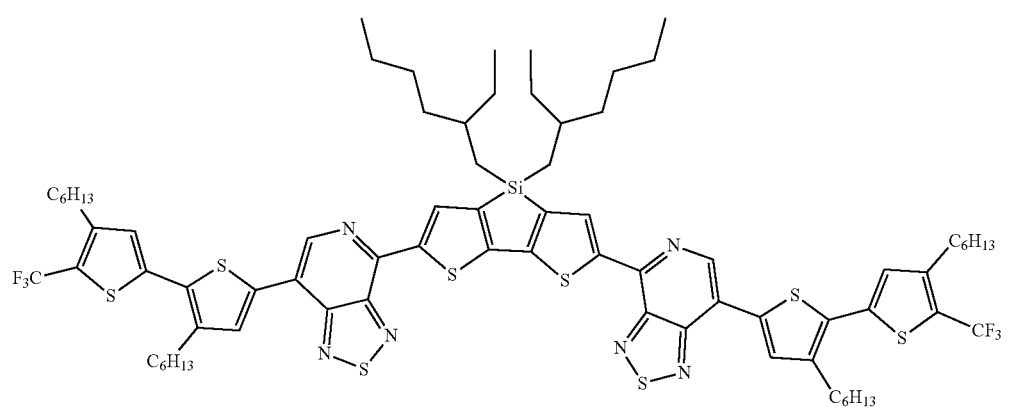
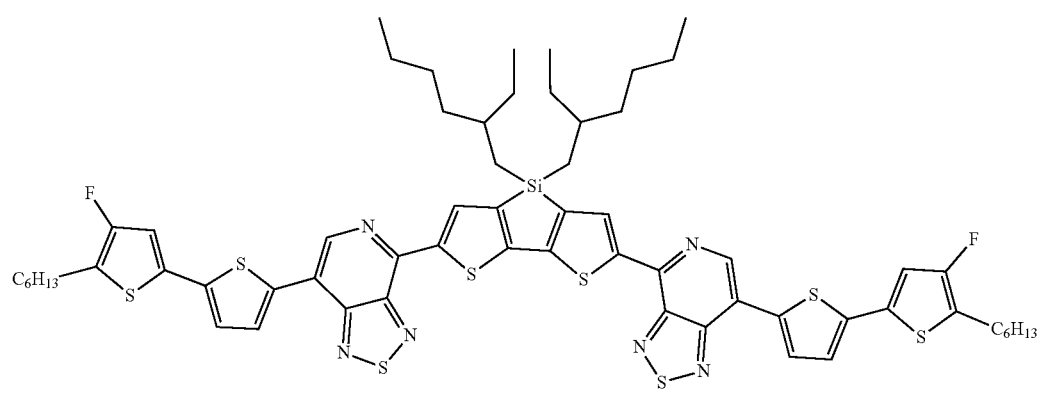
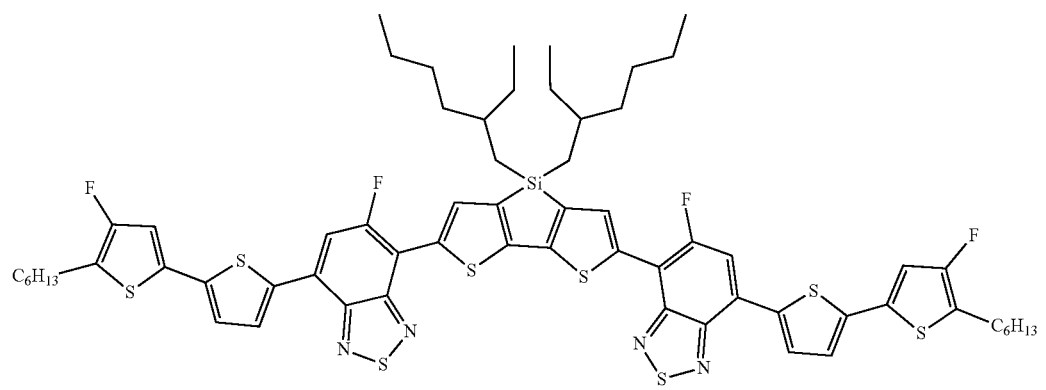

-continued
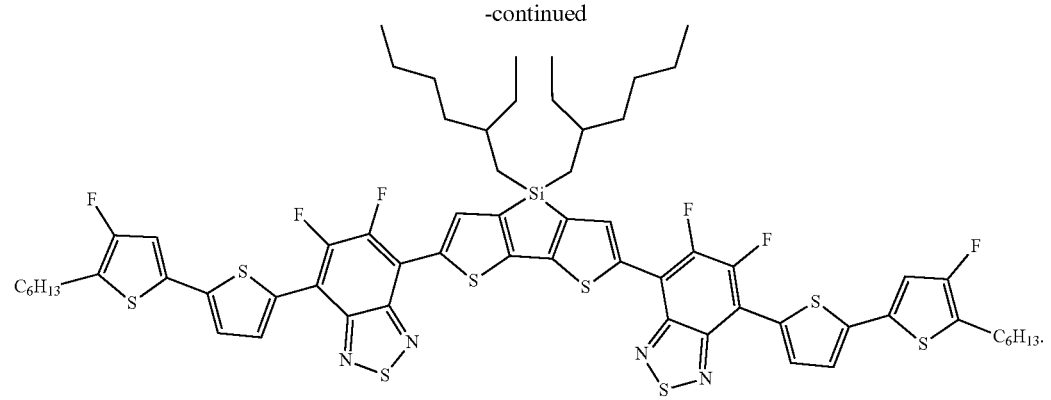

UNITED STATES PATENT AND TRADEMARK OFFICE
CERTIFICATE OF CORRECTION

| | | |
|---|---|---|
| PATENT NO. | : 10,770,665 B2 | Page 1 of 1 |
| APPLICATION NO. | : 15/561895 | |
| DATED | : September 8, 2020 | |
| INVENTOR(S) | : Thomas Kuchurean Wood et al. | |

It is certified that error appears in the above-identified patent and that said Letters Patent is hereby corrected as shown below:

On the Title Page

Item (73) Assignee:
"NEXT ENERGY TECHNOLOGY, INC., Santa Barbara, CA (US)"
Should be:
--NEXT ENERGY TECHNOLOGIES, INC., Santa Barbara, CA (US)--

Signed and Sealed this
Thirteenth Day of April, 2021

Drew Hirshfeld
*Performing the Functions and Duties of the*
*Under Secretary of Commerce for Intellectual Property and*
*Director of the United States Patent and Trademark Office*